US012800958B2

(12) United States Patent
Jeon et al.

(10) Patent No.: US 12,800,958 B2
(45) Date of Patent: Nov. 17, 2026

(54) DISPLAY DEVICE

(71) Applicant: LG ELECTRONICS INC., Seoul (KR)

(72) Inventors: Kukyoul Jeon, Seoul (KR); Kwangho Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 312 days.

(21) Appl. No.: 18/594,791

(22) Filed: Mar. 4, 2024

(65) Prior Publication Data

US 2024/0302686 A1 Sep. 12, 2024

(30) Foreign Application Priority Data

Mar. 8, 2023 (KR) ........................ 10-2023-0030313

(51) Int. Cl.
*G02F 1/1333* (2006.01)
*H10K 59/80* (2023.01)

(52) U.S. Cl.
CPC .. *G02F 1/133308* (2013.01); *G02F 1/133385* (2013.01); *H10K 59/87* (2023.02); *H10K 59/8794* (2023.02)

(58) Field of Classification Search
CPC ........ G02F 1/133308; G02F 1/133385; H10K 59/87; H10K 59/8794
See application file for complete search history.

(56) References Cited

U.S. PATENT DOCUMENTS 11,507,142 B1 11/2022 Davis
2012/0008261 A1 1/2012 Daley, III
2012/0050635 A1* 3/2012 Yoo .................. G02F 1/133308 349/58
2014/0375899 A1 12/2014 Ozeki et al.
2017/0261803 A1* 9/2017 Teramoto .......... G02F 1/133345
2022/0053899 A1* 2/2022 Valliere .................... A45C 5/14
2023/0305597 A1* 9/2023 Davis .................. A45C 11/003

FOREIGN PATENT DOCUMENTS

CN 106713797 5/2017
CN 106788137 5/2017
CN 209732881 12/2019
CN 210776698 6/2020
CN 211459108 9/2020
CN 211475281 9/2020
CN 214954783 11/2021
JP 02-039685 2/1990
JP 2017-000349 1/2017
JP 2017-190081 10/2017
(Continued)

OTHER PUBLICATIONS

Korean Intellectual Property Office Application No. 10-2023-0030313, Office Action dated Mar. 13, 2024, 7 pages.
(Continued)

*Primary Examiner* — David Y Chung
(74) *Attorney, Agent, or Firm* — LEE, HONG, DEGERMAN, KANG & WAIMEY

(57) ABSTRACT

A display device is disclosed. The display device includes: a display module including a display panel; a bottom case to which the display module is movably mounted; and a top case hinge-connected to the bottom case.

12 Claims, 49 Drawing Sheets

(56) References Cited

FOREIGN PATENT DOCUMENTS

| | | |
|---|---|---|
| KR | 10-2001-0114183 | 12/2001 |
| KR | 10-2005-0017247 | 2/2005 |
| KR | 10-1926806 | 12/2018 |
| KR | 10-2019-0034969 | 4/2019 |
| KR | 10-2021-0012835 | 2/2021 |

OTHER PUBLICATIONS

Japan Patent Office Application No. 2024-033444, Notice of Allowance dated Feb. 25, 2025, 3 pages.

European Patent Office Application Serial No. 24162118.4, Search Report dated Jul. 17, 2024, 12 pages.

* cited by examiner

12

12B

210

DISPLAY DEVICE

CROSS-REFERENCE TO RELATED APPLICATION(S)

Pursuant to 35 U.S.C. § 119 (a), this application claims the benefit of earlier filing date and right of priority to Korean Patent Application No. 10-2023-0030313, filed on Mar. 8, 2023, the contents of which are all hereby incorporated by reference herein in their entireties.

BACKGROUND

1. Technical Field

The present disclosure relates to a display device.

2. Description of the Related Art

With the development of information society, there has been a growing demand for various types of display devices. In order to meet such demand, various display devices, such as a liquid crystal display (LCD), a plasma display panel (PDP), an electro luminescent display (ELD), a vacuum fluorescent display (VFD), an organic light emitting diode (OLED), and the like, have been developed and used.

Among them, an LCD panel includes a TFT substrate and a color substrate that face each other with a liquid crystal layer interposed therebetween, so as to display an image using light provided from a backlight unit. Meanwhile, an OLED panel can display an image by depositing a self-luminescent organic layer on a substrate having a transparent electrode formed thereon.

Recently, a lot of research on a display device for outdoor uses has been carried out. In addition, various research has been conducted on a structure that can improve the storage and portability of display devices.

SUMMARY

It is an objective of the present disclosure to solve the above and other problems.

It is another objective of the present disclosure to provide a structure that can facilitate the storage and portability of a display device.

It is yet another objective of the present disclosure to provide a structure that can improve the durability and rigidity of a portable display device.

It is yet another objective of the present disclosure to provide a heat dissipation structure for a portable display device.

It is yet another objective of the present disclosure to provide a shock absorbing structure for a portable display device.

According to an aspect of the subject matter described in this application, a display device includes: A display device is disclosed. The display device includes: a display module including a display panel; a bottom case to which the display module is movably mounted; and a top case hinge-connected to the bottom case.

A display device according to the present disclosure has the following effects.

According to at least one of the embodiments of the present disclosure, it is possible to provide a structure capable of facilitating the storage and portability of a display device.

According to at least one of the embodiments of the present disclosure, it is possible to provide a structure capable of improving the durability and rigidity of a portable display device.

According to at least one of the embodiments of the present disclosure, it is possible to provide a heat dissipation structure for a portable display device.

According to at least one of the embodiments of the present disclosure, it is possible to provide a shock absorbing structure for a portable display device.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

DETAILED DESCRIPTION

Figure 1:
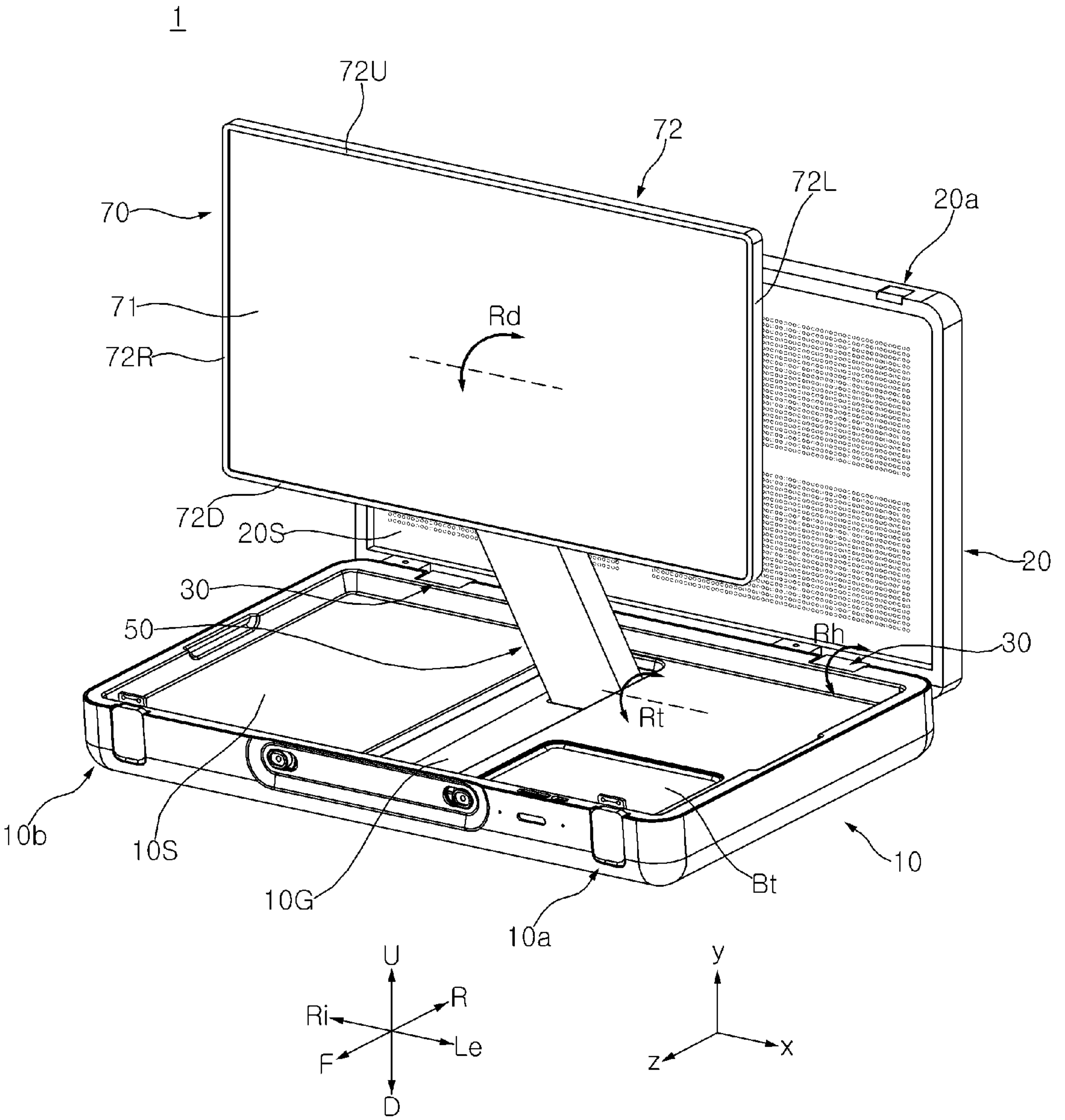
FIGS. 1 to 49 illustrate examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In the following description, a suffix such as "module" and "unit" may be used to refer to elements or components. Use of such a suffix herein is merely intended to facilitate description of the specification, and the suffix itself is not intended to give any special meaning or function.

In the present disclosure, that which is well known to one of ordinary skill in the relevant art has generally been omitted for the sake of brevity. The accompanying drawings are used to help easily understand the technical idea of the present disclosure and it should be understood that the idea of the present disclosure is not limited by the accompanying drawings. The idea of the present disclosure should be construed to extend to any alterations, equivalents, and substitutes besides the accompanying drawings.

It will be understood that although the terms "first", "second", etc. may be used herein to describe various elements, these elements should not be limited by these terms. These terms are only used to distinguish one element from another.

It will be understood that when a component is referred to as being "connected to" or "coupled to" another component, it may be directly connected to or coupled to another component, or intervening components may be present. In contrast, when a component is referred to as being "directly connected to" or "directly coupled to" another component, there are no intervening components present.

As used herein, a singular representation is intended to include a plural representation unless the context clearly indicates otherwise.

It will be understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The directions "up (U)", "down (D)", "left (Le)", "right (Ri)", "front (F)", and "rear (R)" shown in the drawings are only for the convenience of description, and the technical concept disclosed in the specification is not limited by these directions.

A display panel described herein may be an LCD panel or an OLED panel, but a display panel applicable to the present disclosure is not limited thereto.

Figure 2:
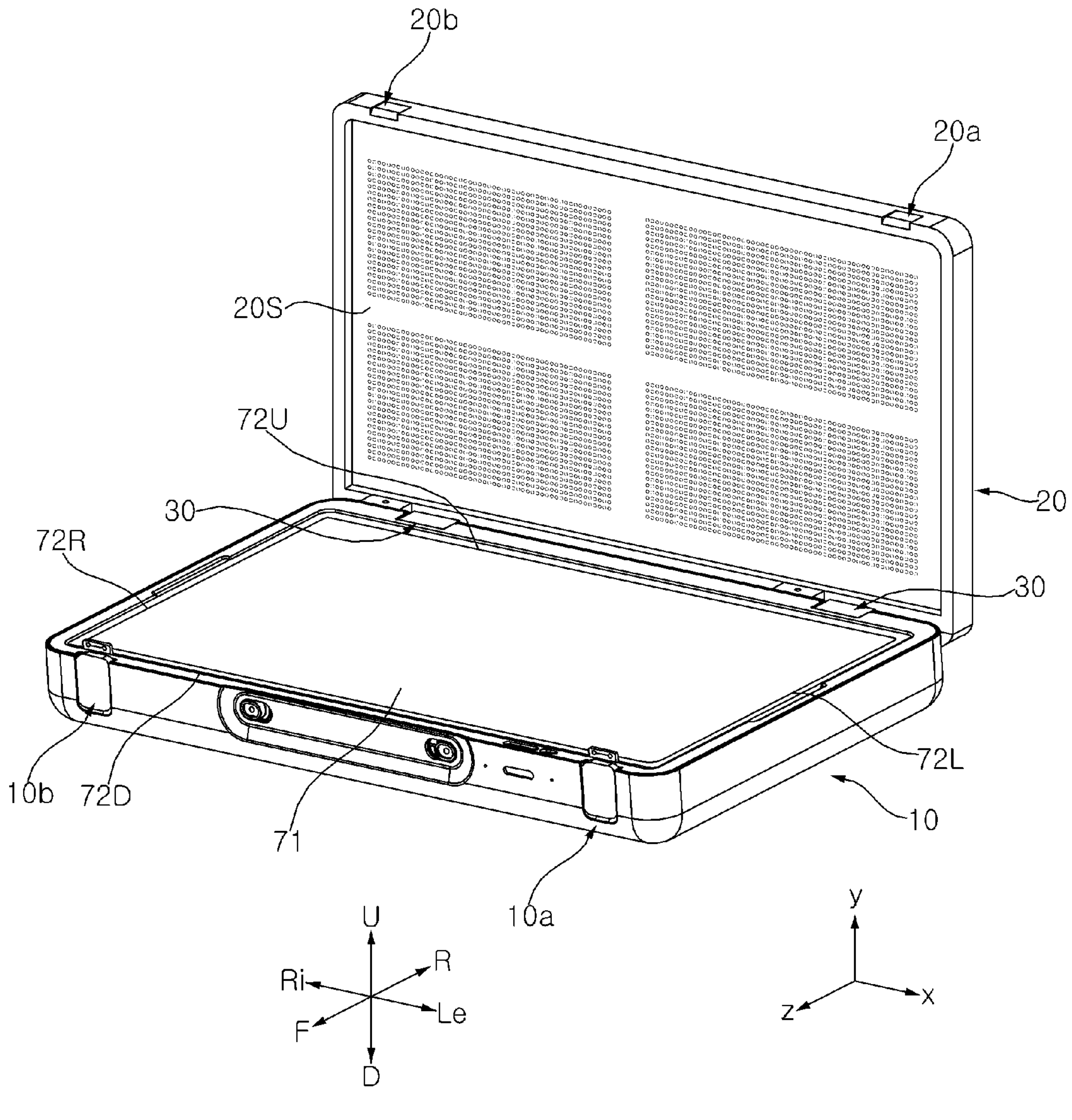

Referring to FIGS. 1 and 2, a display device 1 may include a base 10, a cover 20, a hinge 30, an arm 50, and a display 70.

The base 10 may have a generally flat box shape. A seating part 10S may be formed by being recessed downward from an upper surface of the base 10. The size of the seating part 10S may correspond to the size of the display 70. For example, the base 10 may include a plastic material. The base 10 may be referred to as a lower body 10, a lower case 10, a lower housing 10, a bottom box 10, a bottom cabinet 10, or a bottom case 10.

The cover 20 may have a generally flat box shape. The cover 20 may have an appearance similar to that of the base 10. A depressed part 20S may be formed on one surface of the cover 20, and may be opposite the seating part 10S with respect to the display 70. For example, the cover 20 may include a plastic material. The cover 20 may be referred to as an upper body 20, an upper case 20, an upper housing 20, a top box 20, a top cabinet 20, or a top case 20.

One side (or a first side) of the hinge 30 may be adjacent to or positioned on a first side of the base 10, may be coupled to the base 10, and may rotate on a central axis of the hinge 30. The other side (or a second side) of the hinge 30 may be adjacent to or positioned on a first side of the cover 20, may be coupled to the cover 20, and may rotate on the central axis of the hinge 30. The first side of the base 10 may be one long side of the base 10, and the first side of the cover 20 may be one long side of the cover 20 that is adjacent to the one long side of the base 10. For example, a plurality of hinges 30 may be spaced apart from each other along the one long sides. Two hinges 30 may be provided.

The arm 50 may extend in a direction intersecting the base 10. The arm 50 may have a generally square lumber shape. A groove 10G may be recessed downward from the seating part 10S, and may have a shape corresponding to the arm 50. One end (or a first end) of the arm 50 may be positioned on the groove 10G while being adjacent to one end of the groove 10G. The arm 50 may be coupled to the base 10 to be rotatable on a first axis that is adjacent to the one end of the arm 50 (see Rt of FIG. 1). The first axis may be parallel to a left-and-right direction. The other end (or a second end) of the arm 50 may be coupled to a central portion of a rear surface of the display 70. The display 70 may be coupled to the arm 50 to be rotatable on a second axis that is adjacent to the other end of the arm 50 (see Rd of FIG. 1). The second axis may be parallel to the first axis. The arm 50 may be referred to as a pole 50, a bar 50, or a lever 50.

The display 70 may include a display panel 71 and a side cover 72. The display panel 71 may define a front surface or side of the display 70, and may display an image. The side cover 72 may extend along the perimeter of the display panel 71, and may cover a side surface (i.e., the sides) of the display panel 71. A first part 72U may define an upper side of the side cover 72, and a second part 72D may define a lower side of the side cover 72. A third part 72L may define a left side of the side cover 72, and a fourth part 72R may define a right side of the side cover 72. The display 70 may be referred to as a display unit 70 or a display module 70.

For example, a user may pivot the arm 50 about the first axis. As the arm 50 pivots, the second end of the arm 50 may be raised in position. The user may rotate the display 70 about the second axis such that the display panel 71 faces forward. The user may adjust an angle of the arm 50 with respect to the base 10 and an angle of the display 70 with respect to the arm 50.

As another example, a user may pivot the arm 50 about the first axis. When the arm 50 reverse pivots, the second end of the arm 50 may be lowered in position. In addition, the arm 50 may be seated on the groove 10G. The user may rotate the display 70 about the second axis such that the display panel 71 faces upward.

Figure 3:
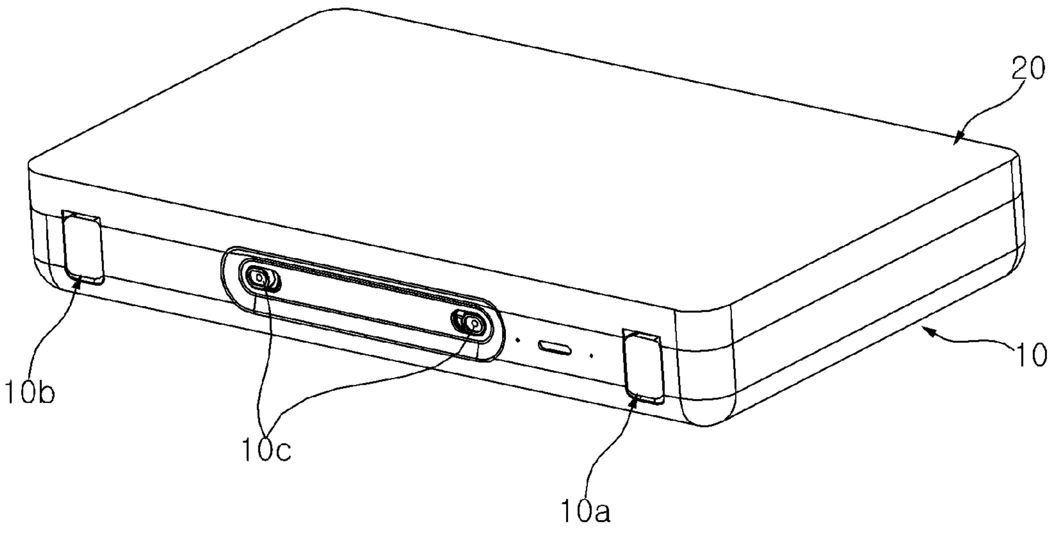

Referring to FIGS. 2 and 3, a user may pivot the cover 20 about the central axis of the hinge 30 such that the cover 20 is laid or placed on top of the base 10. The display panel 71 may be sandwiched between the base 10 and the cover 20.

A lock 10*a*, 10*b* of the base 10 may be provided on a second side of the base 10, which is opposite the first side of the base 10 that is adjacent to the hinge 30. The lock 10*a*, 10*b* may be referred to as a lock assembly 10*a*, 10*b* or a locking unit 10*a*, 10*b*. A recessed portion 20*a*, 20*b* of the cover 20 may be provided on a second side of the cover 20, which is opposite the first side of the cover 20 that is adjacent to the hinge 30. After laying the cover 20 on top of the base 10, the user may snap the lock 10*a*, 10*b* into the recessed portion 20*a*, 20*b* to make it locked in place. This allows the user to carry the display 70 with the display 70 being stored in the base 10 and the cover 20. In addition, a handle (not shown) designed to be held by a hand of the user may be mounted to a button 10*c* formed on one side of the base 10.

Figure 4:
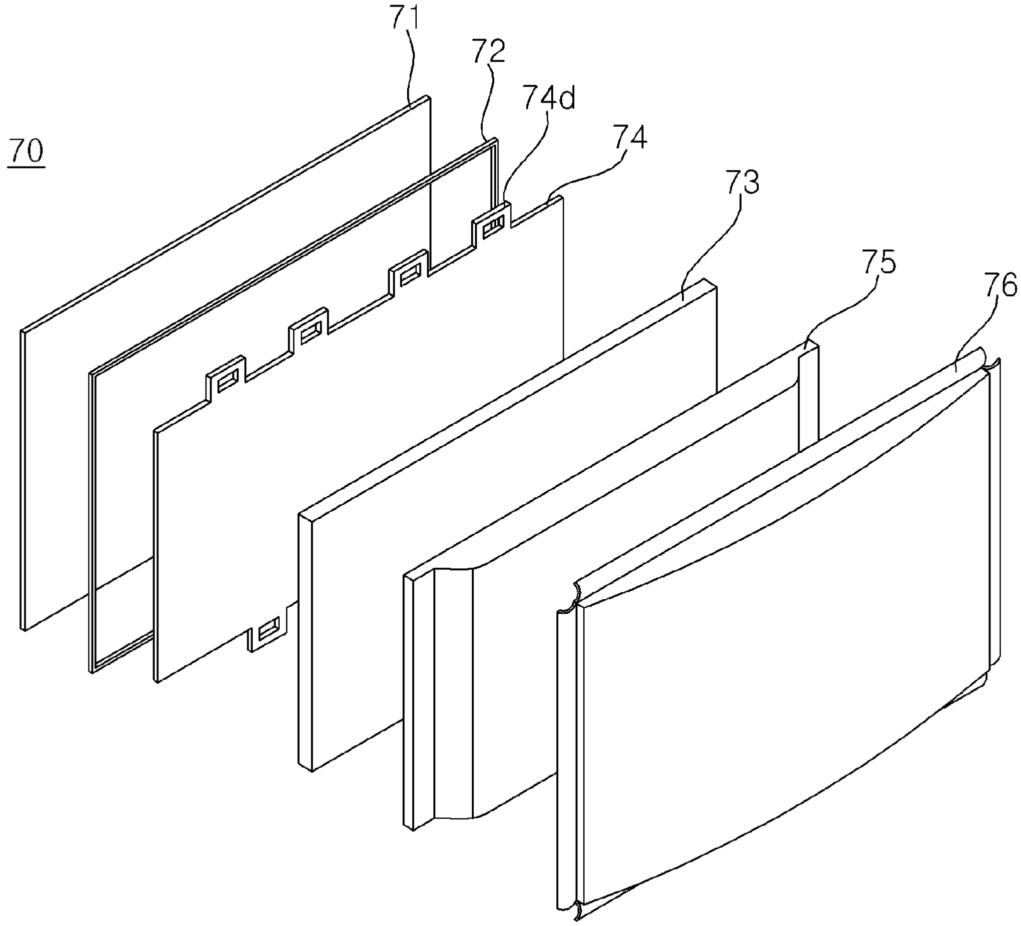

Referring to FIG. 4, the display 70 may include a display panel 71, a side cover 72, a backlight unit (73, 74), a frame 75, and a back cover 76.

The display panel 71 may define a front surface or side of the display 70, and may display an image. The display panel 71 may display an image by outputting red, green, or blue (RGB) for each pixel by a plurality of pixels in accordance with timing. The display panel 71 may be divided into an active area in which an image is displayed and a de-active area in which no image is displayed. The display panel 71 may include a front substrate and a rear substrate that are disposed opposite each other with a liquid crystal layer interposed therebetween. The display panel 71 may be referred to as an LCD panel.

The front substrate may include a plurality of pixels, each of which consists of red, green, and blue subpixels. The front substrate may output light corresponding to a color of red, green, or blue in response to a control signal.

The rear substrate may include switching elements. The rear substrate may switch a pixel electrode. For example, the pixel electrode may change the molecular arrangement of a liquid crystal layer in response to a control signal input from the outside. The liquid crystal layer may include liquid crystal molecules. The arrangement of liquid crystal molecules may be changed according to a voltage difference generated between the pixel electrode and a common electrode. The liquid crystal layer may transmit light provided from the backlight unit (73, 74) to the front substrate or block the light.

The side cover 72 may surround the perimeter of the display panel 71, and may cover a side surface of the display panel 71. The side cover 72 may be coupled to the display panel 71 or may support the display panel 71. The side cover 72 may be referred to as a guide panel 72, a side frame 72, or a middle cabinet 72.

The backlight unit (73, 74) may be disposed at the rear of the display panel 71. The backlight unit (73, 74) may include light sources. The backlight unit (73, 74) may be coupled to the frame 75 from the front of the frame 75. The backlight unit (73, 74) may be driven by a full driving scheme or a partial driving scheme such as local dimming, impulsive, etc. The backlight unit (73, 74) may include an optical sheet 74 and an optical layer 73.

The optical sheet 74 may allow light of the light source to be evenly transmitted to the display panel 71. The optical sheet 74 may consist of a plurality of layers. For example, the optical sheet 74 may include a prism sheet, a diffusion sheet, or the like. Meanwhile, a coupling portion 74*d* of the optical sheet 74 may be coupled to the frame 75 and/or the back cover 76.

The frame 75 may be disposed at the rear of the backlight unit (73, 74), and may support the components of the display 70. An edge of the frame 75 may be fixed to the side cover 72. For example, components such as the backlight unit (73, 74) and a printed circuit board (PCB) on which a plurality of electronic components are disposed may be coupled to the frame 75. For example, the frame 75 may include a metal material. The frame 75 may be referred to as a main frame 75, a module cover 75, or a cover bottom 75.

The back cover 76 may cover the rear of the frame 75. The back cover 76 may be coupled to the frame 75. For example, the back cover 76 may include a metal or plastic material.

Figure 5:
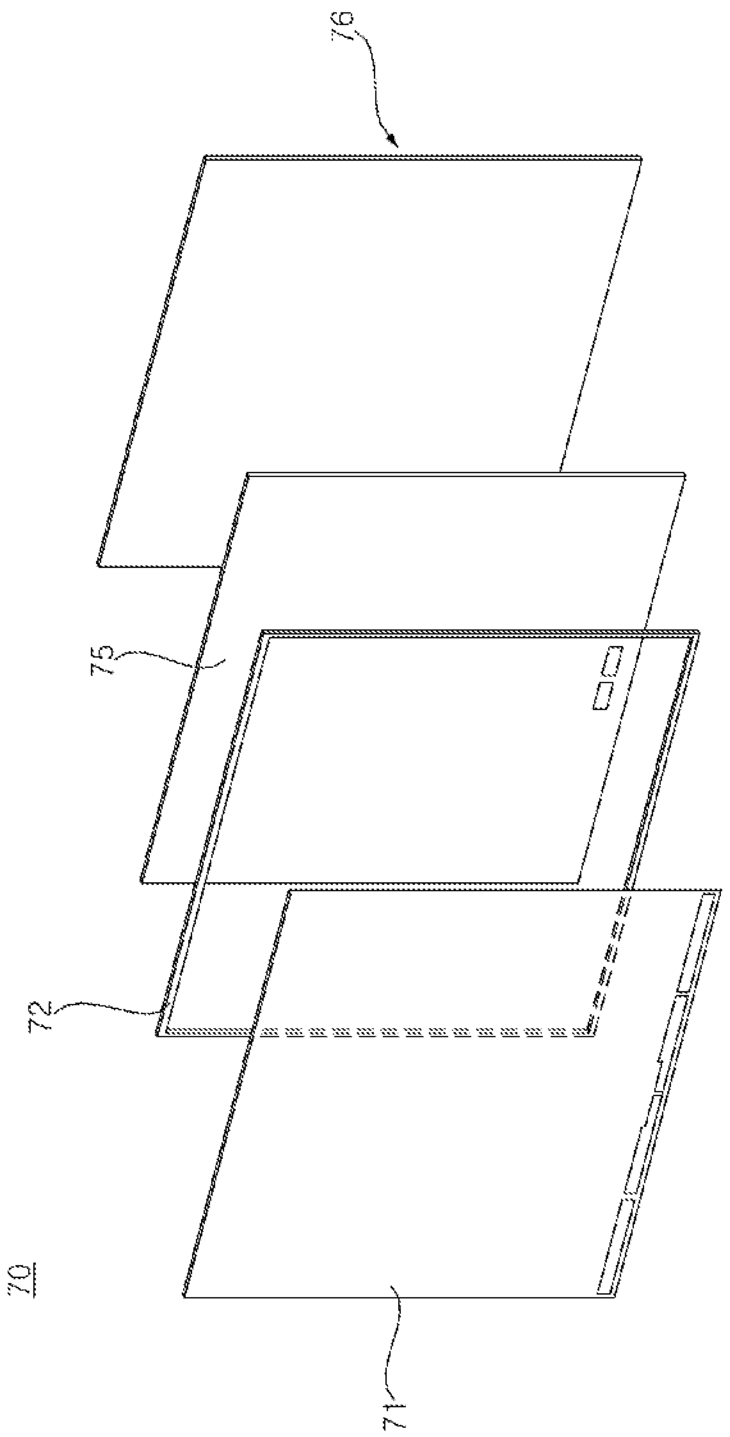

Referring to FIG. 5, the display 70 may include a display panel 71, a side cover 72, a frame 75, and a back cover 76.

The display panel 71 may define a front surface or side of the display 70, and may display an image. The display panel 71 may divide an image into a plurality of pixels to output the image while controlling color, brightness, and chroma of each pixel. The display panel 71 may be divided into an active area in which an image is displayed and a de-active area in which no image is displayed. The display panel 71 may generate light corresponding to a color of red, green, or blue in response to a control signal. The display panel 71 may be referred to as an OLED panel.

The side cover 72 may surround the perimeter of the display panel 71, and may cover a side surface of the display panel 71. The side cover 72 may be coupled to the display panel 71 or may support the display panel 71. The side cover 72 may be referred to as a guide panel 72, a side frame 72, or a middle cabinet 72.

The frame 75 may be disposed at the rear of the display panel 71, and the display panel 71 may be coupled to the frame 75. An edge of the frame 75 may be fixed to the side cover 72. Electronic components may be mounted on the frame 75. For example, the frame 75 may include a metal material. The frame 75 may be referred to as a main frame 75, a module cover 75, a cover bottom 75, or a panel frame 75.

The back cover 76 may cover the rear of the frame 75. The back cover 76 may be coupled to the frame 75. For example, the back cover 76 may include a metal or plastic material.

Figure 6:
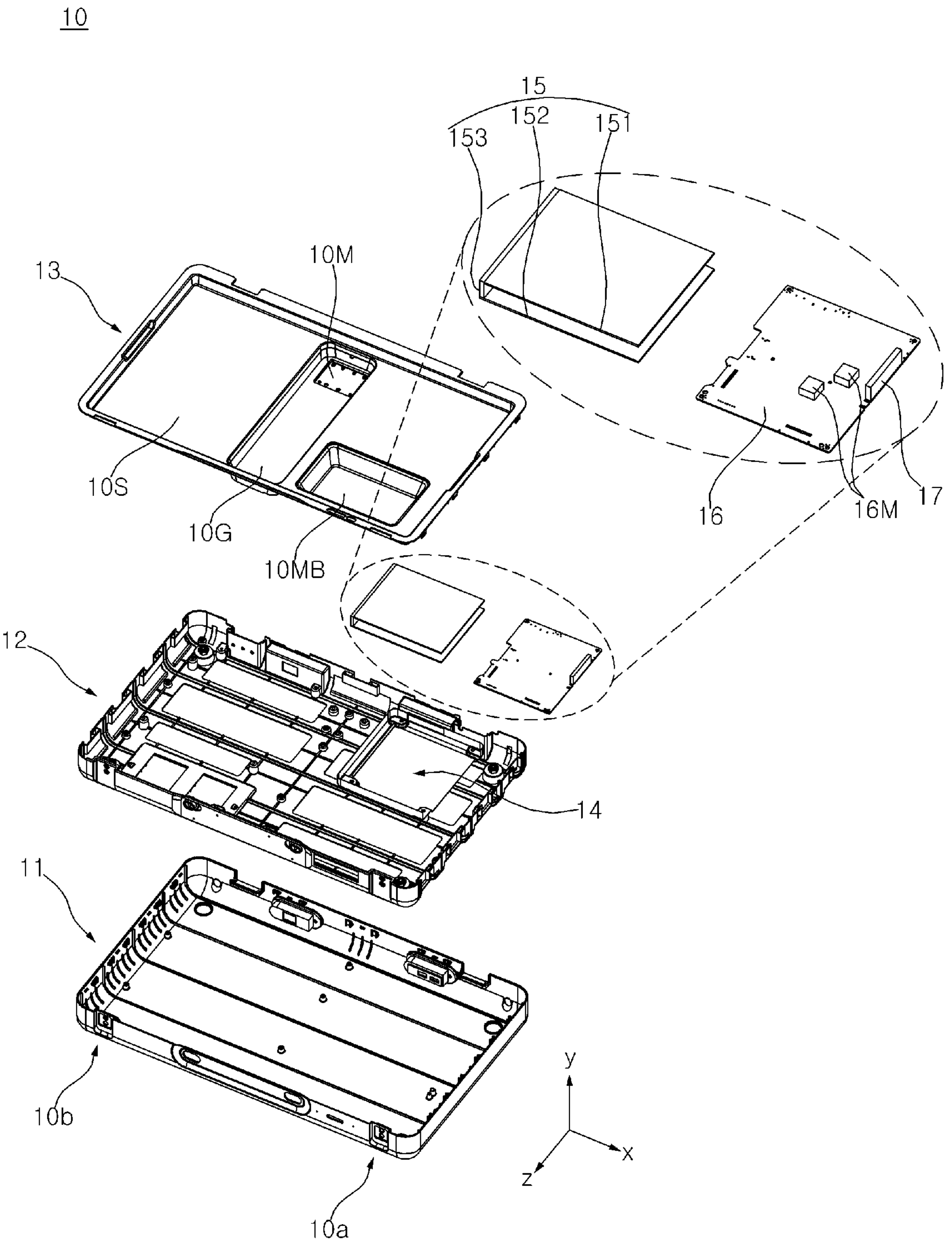

Referring to FIG. 6, the base 10 may include a bottom 11, a frame 12, a top 13, a jacket 15, and a substrate 16.

The bottom 11 may define a lower surface of the base 10, and may have a generally square tray shape. The bottom 11 may be referred to as an outer shell 11, an outer case 11, a bottom part 11, a housing 11, or a tray 11. The lock 10*a*, 10*b* may be provided on a side surface of the bottom 11.

The frame 12 may define a body structure of the base 10. The frame 12 may be disposed on the bottom 11, and may be coupled to the bottom 11.

The top 13 may define an upper surface of the base 10, and may have a generally plate shape. The top 13 may be opposite the bottom 11 with respect to the frame 12, and may cover the frame 12. The top 13 may be detachably coupled to the frame 12 and/or the bottom 11. The top 13 may be referred to as a top part 13, a cap 13, a top case 13, or a top plate 13.

The seating part 10S and the groove 10G may be formed on an upper surface of the top 13. A depressed portion 10M may be adjacent to one end of the groove 10G, and may be recessed downward from an upper surface of the groove 10G. One end of the arm 50 (see FIG. 1) may be pivotably coupled to the depressed portion 10M.

For example, a mounting portion 10MB may be formed by being recessed downward from the upper surface of the top 13, and a battery Bt (see FIG. 1) may be detachably mounted to the mounting portion 10MB. The battery Bt may provide power to the display 70 (see FIG. 1), and may be rechargeable. As another example, the battery Bt may be embedded between the frame 12 and the top 13.

The jacket 15 and the substrate 16 may be disposed between the frame 12 and the top 13, and may be coupled to the frame 12. At least one element 16M may be mounted on the substrate 16. The element 16M may be an electronic component that generates heat when operated. The element 16M may be referred to as a heating element 16M. For example, the element 16M may be an IC chip or a System On Chip (SOC).

Figure 7:
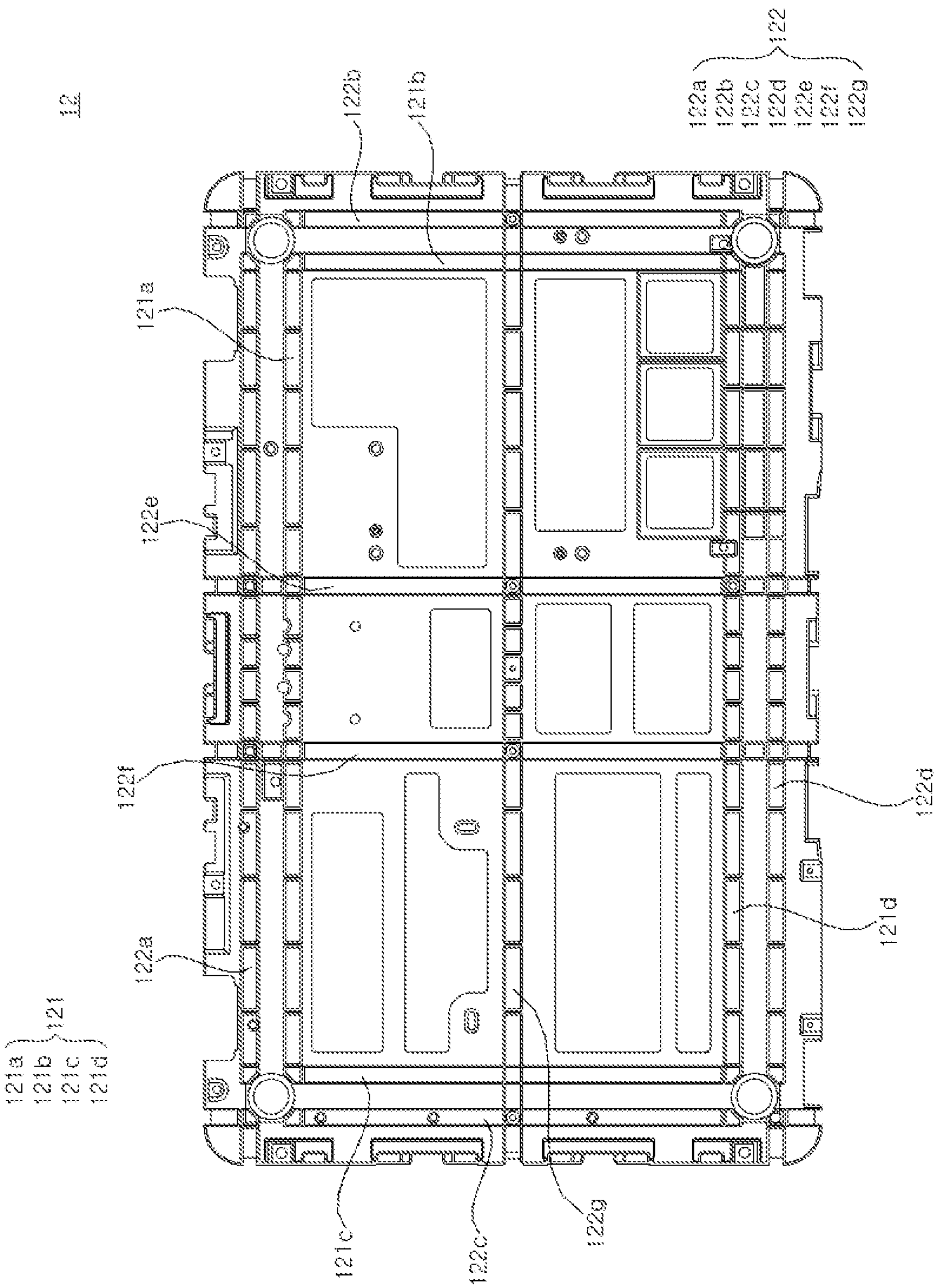

Referring to FIG. 7, the frame 12 may be made of a high strength and ultra-light material. For example, the frame 12 may be formed by magnesium die casting. The frame 12 may include a first beam part 121 and a second beam part 122. The frame 12 may be referred to as a bottom frame 12, a box frame 12, a bottom box frame 12, or a bottom case frame 12.

The first beam part 121 may define an inner beam 121. The inner beam 121 may include a first part 121*a*, a second part 121*b*, a third part 121*c*, and a fourth part 121*d*. The first part 121*a* and the fourth part 121*d* may face each other. The second part 121*b* and the third part 121*c* may face each other. The first part 121*a* may connect one end (or a first end) of the second part 121*b* and one end (or a first end) of the third part 121*c*, and the fourth part 121*d* may connect the other end (or a second end) of the second part 121*b* and the other end (or a second end) of the third part 121*c*. For example, the first part 121*a*, the second part 121*b*, the third part 121*c*, and/or the fourth part 121*d* may have the same cross-sectional shape.

The second beam part 122 may define an outer beam (122*a*, 122*b*, 122*c*, 122*d*) and a cross beam (122*e*, 122*f*, 122*g*). The outer beam (122*a*, 122*b*, 122*c*, 122*d*) may include a first part 122*a*, a second part 122*b*, a third part 122*c*, and a fourth part 122*d*. The first part 122*a* and the fourth part 122*d* may face each other. The second part 122*b* and the third part 122*c* may face each other. The first part 122*a* may connect one end (or a first end) of the second part 122*b* and one end (or a first end) of the third part 122*c*, and the fourth part 122*d* may connect the other end (or a second end) of the second part 122*b* and the other end (or a second end) of the third part 122*c*. For example, the first part 122*a*, the second part 122*b*, the third part 122*c*, and/or the fourth part 122*d* may have the same cross-sectional shape.

The cross beam (122*e*, 122*f*, 122*g*) may include vertical parts 122*e* and 122*f* and a horizontal part 122*g*. The horizontal part 122*g* may be parallel to the first part 121*a* and/or the fourth part 121*d* of the inner beam 121 between the first part 121*a* and the fourth part 121*d*. The horizontal part 122*g* may intersect the second part 121*b* and the third part 121*c* of the inner beam 121, and may intersect the second part 122*b* and the third part 122*c* of the outer beam (122*a*, 122*b*, 122*c*, 122*d*).

The vertical parts 122*e* and 122*f* may include a first vertical part 122*e* and a second vertical part 122*f*. The first vertical part 122*e* may be positioned between the second part 121*b* and the third part 121*c* of the inner beam 121, and may intersect the first part 121*a* and/or the fourth part 121*d* of the inner beam 121. The first vertical part 122*e* may intersect the first part 122*a* and/or the fourth part 122*d* of the outer beam (122*a*, 122*b*, 122*c*, 122*d*). The second vertical part 122*f* may be positioned between the second part 121*b* and the third part 121*c* of the inner beam 121, and may intersect the first part 121*a* and/or the fourth part 121*d* of the inner beam 121. The second vertical part 122*f* may intersect the first part 122*a* and/or the fourth part 122*d* of the outer beam (122*a*, 122*b*, 122*c*, 122*d*).

Figure 8:
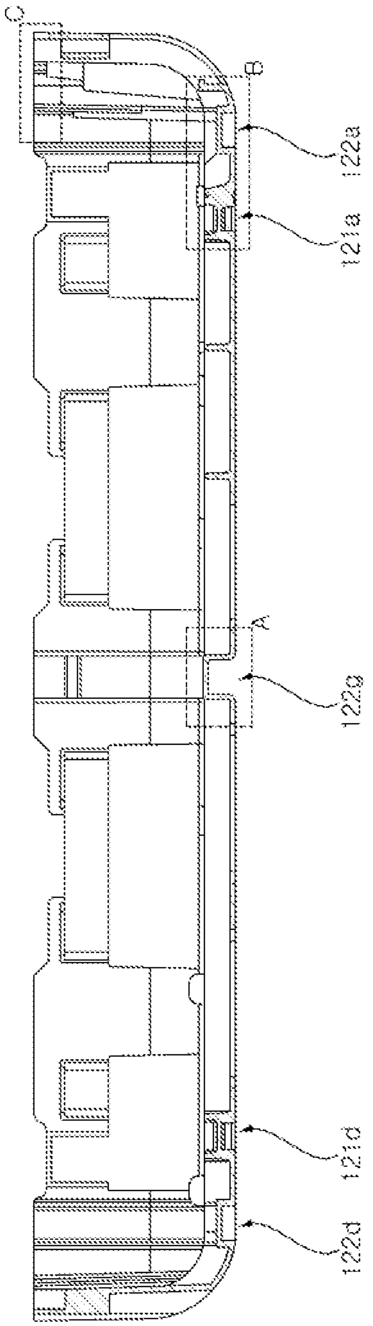
Figure 9:
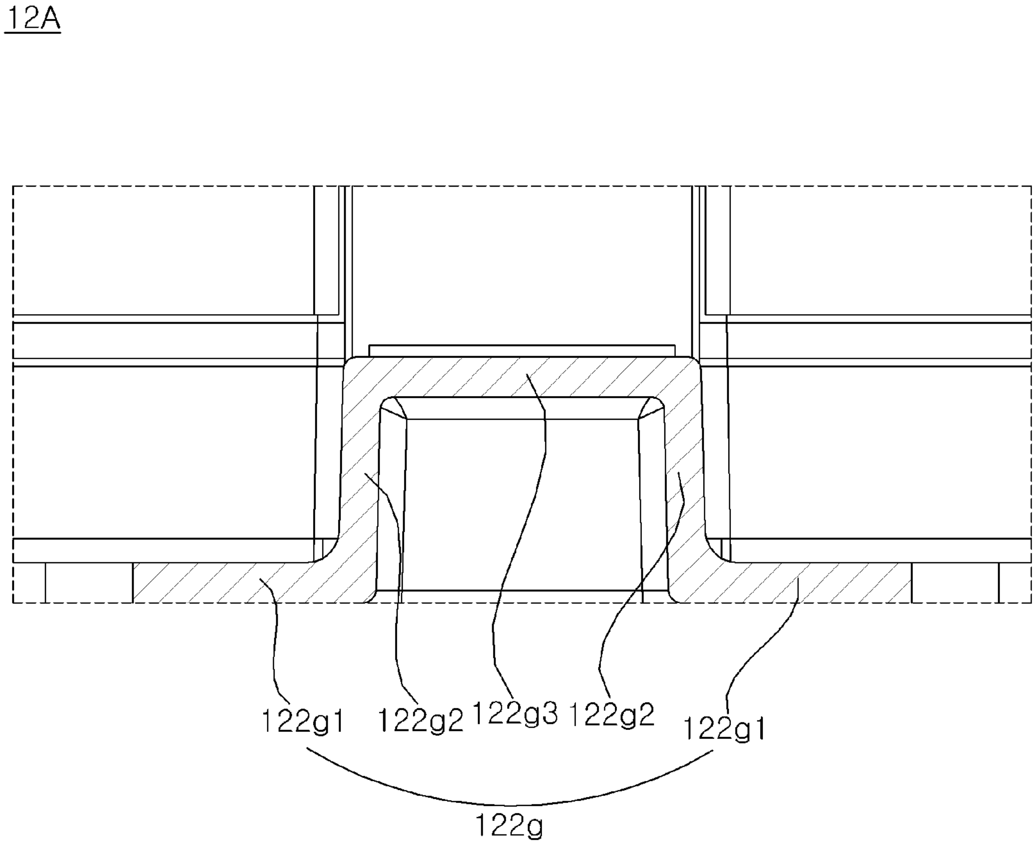

Referring to FIGS. 8 and 9, the horizontal part 122*g* of the cross beam (122*e*, 122*f*, 122*g*) may include a bottom part 122*g*1, a side part 122*g*2, and a top part 122*g*3. The bottom part 122*g*1 may define a bottom surface of the horizontal part 122*g* of the cross beam (122*e*, 122*f*, 122*g*).

The side part 122*g*2 may be bent and extend from the bottom part 122*g*1. The top part 122*g*3 may be bent and extend from the side part 122*g*2. For example, the bottom part 122*g*1, the top part 122*g*3, and the side part 122*g*2 may form a generally U-shape.

Accordingly, the rigidity of the frame 12 can be increased.

Figure 10:
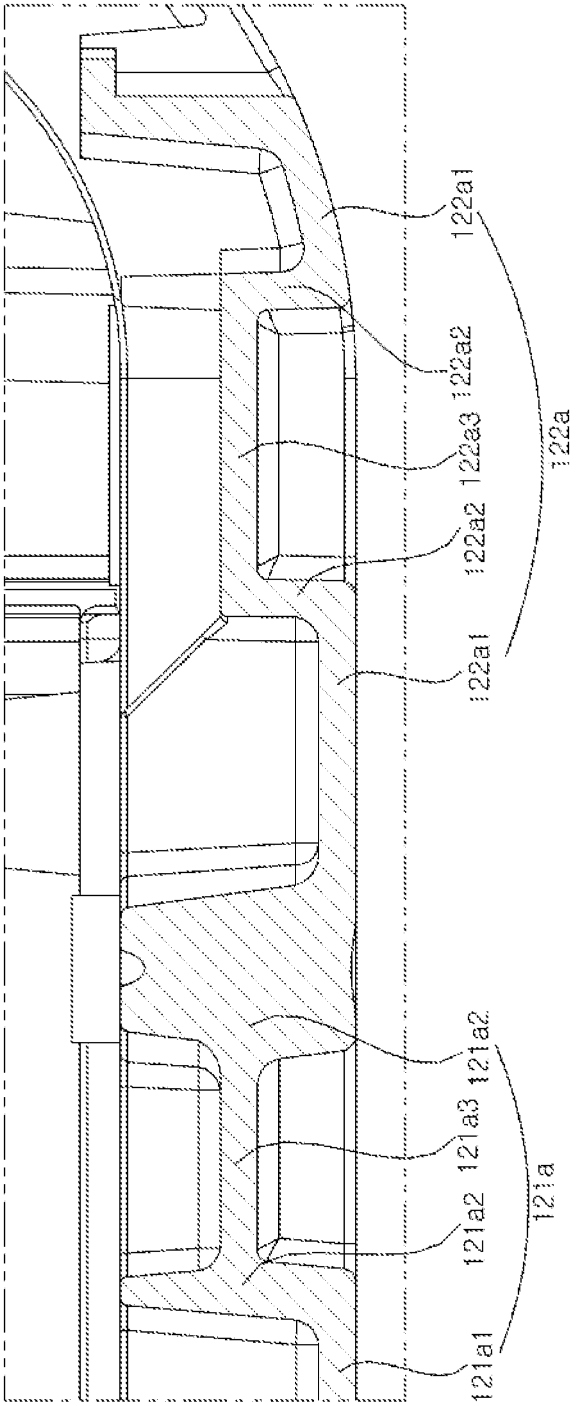
Figure 11:
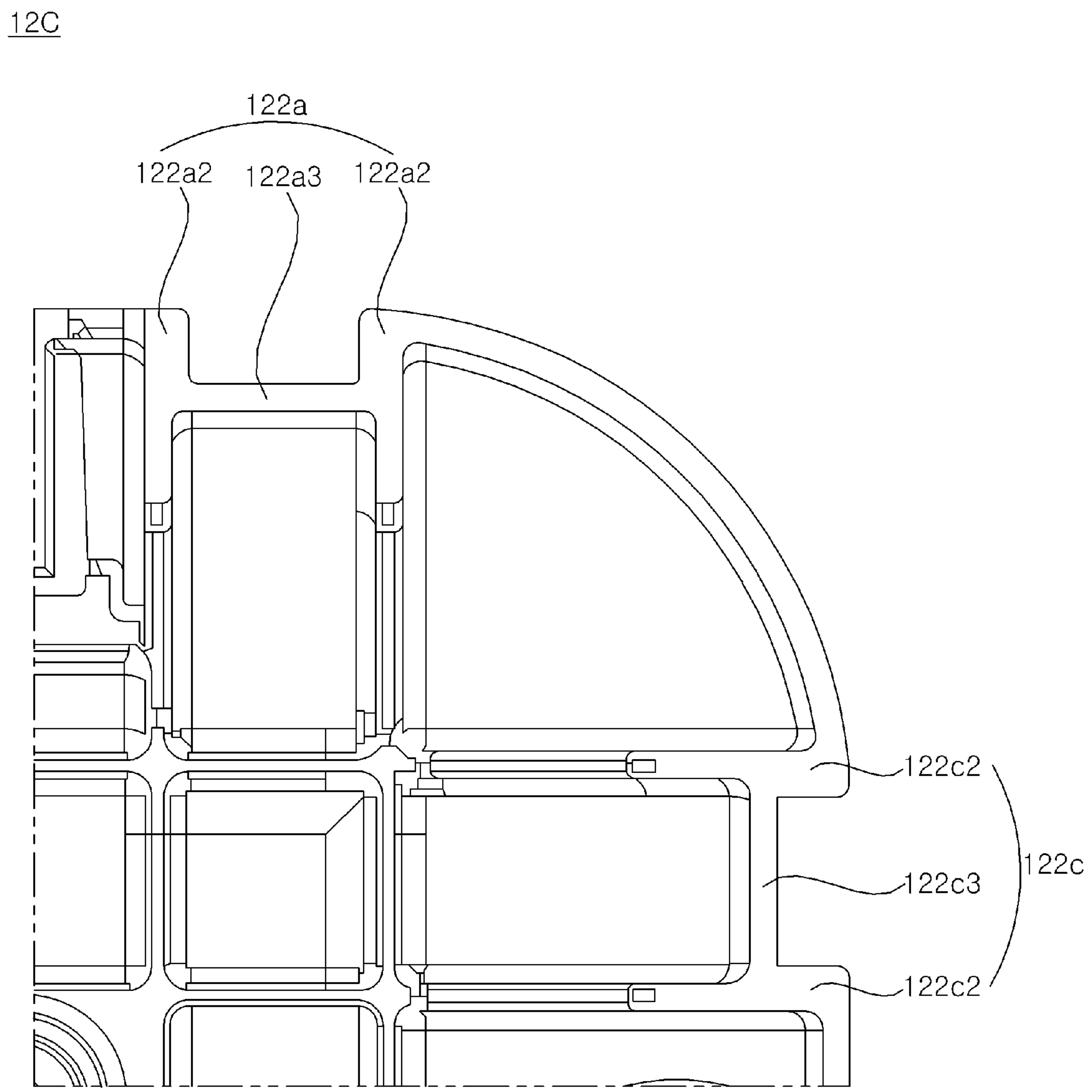

Referring to FIGS. 10 and 11 together with FIGS. 7 and 8, the first part 121*a* of the inner beam 121 may include a bottom part 121*a*1, a side part 121*a*2, and a top part 121*a*3. The bottom part 121*a*1 may define a bottom surface of the first part 121*a* of the inner beam 121.

The side part 121*a*2 may be bent and extend from the bottom part 121*a*1. The top part 121*a*3 may be bent and extend from the side part 121*a*2. For example, the top part 121*a*3 and the side part 121*a*2 may form a generally H-shape.

The first part 122*a* of the outer beam (122*a*, 122*b*, 122*c*, 122*d*) of the second beam part 122 may include a bottom part 122*a*1, a side part 122*a*2, and a top part 122*a*3. The bottom part 122*a*1 may define a bottom surface of the first part 122*a* of the outer beam (122*a*, 122*b*, 122*c*, 122*d*).

The side part 122*a*2 may be bent and extend from the bottom part 122*a*1. The top part 122*a*3 may be bent and extend from the side part 122*a*2. For example, the bottom part 122*a*1, the top part 122*a*3, and the side part 122*a*2 may form a generally U-shape.

Accordingly, the rigidity of the frame 12 can be increased.

Referring to FIG. 11 and FIG. 7, the first part 122*a* of the outer beam (122*a*, 122*b*, 122*c*, 122*d*) may intersect the third part 122*c* of the outer beam (122*a*, 122*b*, 122*c*, 122*d*). For example, the first part 122*a* may have a generally H-shaped cross section, and the third part 122*c* may have a generally H-shaped cross section. Accordingly, the corner rigidity of the frame 12 can be increased.

The first part 122*a* of the outer beam (122*a*, 122*b*, 122*c*, 122*d*) may intersect the second part 122*b* of the outer beam (122*a*, 122*b*, 122*c*, 122*d*). For example, the first part 122*a* may have a generally H-shaped cross section, and the second part 122*b* may have a generally H-shaped cross section. Accordingly, the corner rigidity of the frame 12 can be increased.

The fourth part 122*d* of the outer beam (122*a*, 122*b*, 122*c*, 122*d*) may intersect the third part 122*c* of the outer beam (122*a*, 122*b*, 122*c*, 122*d*). For example, the fourth part 122*d* may have a generally H-shaped cross section, and the third part 122*c* may have a generally H-shaped cross section. Accordingly, the corner rigidity of the frame 12 can be increased.

The fourth part 122*d* of the outer beam (122*a*, 122*b*, 122*c*, 122*d*) may intersect the second part 122*b* of the outer beam (122*a*, 122*b*, 122*c*, 122*d*). For example, the fourth part 122*d* may have a generally H-shaped cross section, and the second part 122*b* may have a generally H-shaped cross section. Accordingly, the corner rigidity of the frame 12 can be increased.

Figure 12:
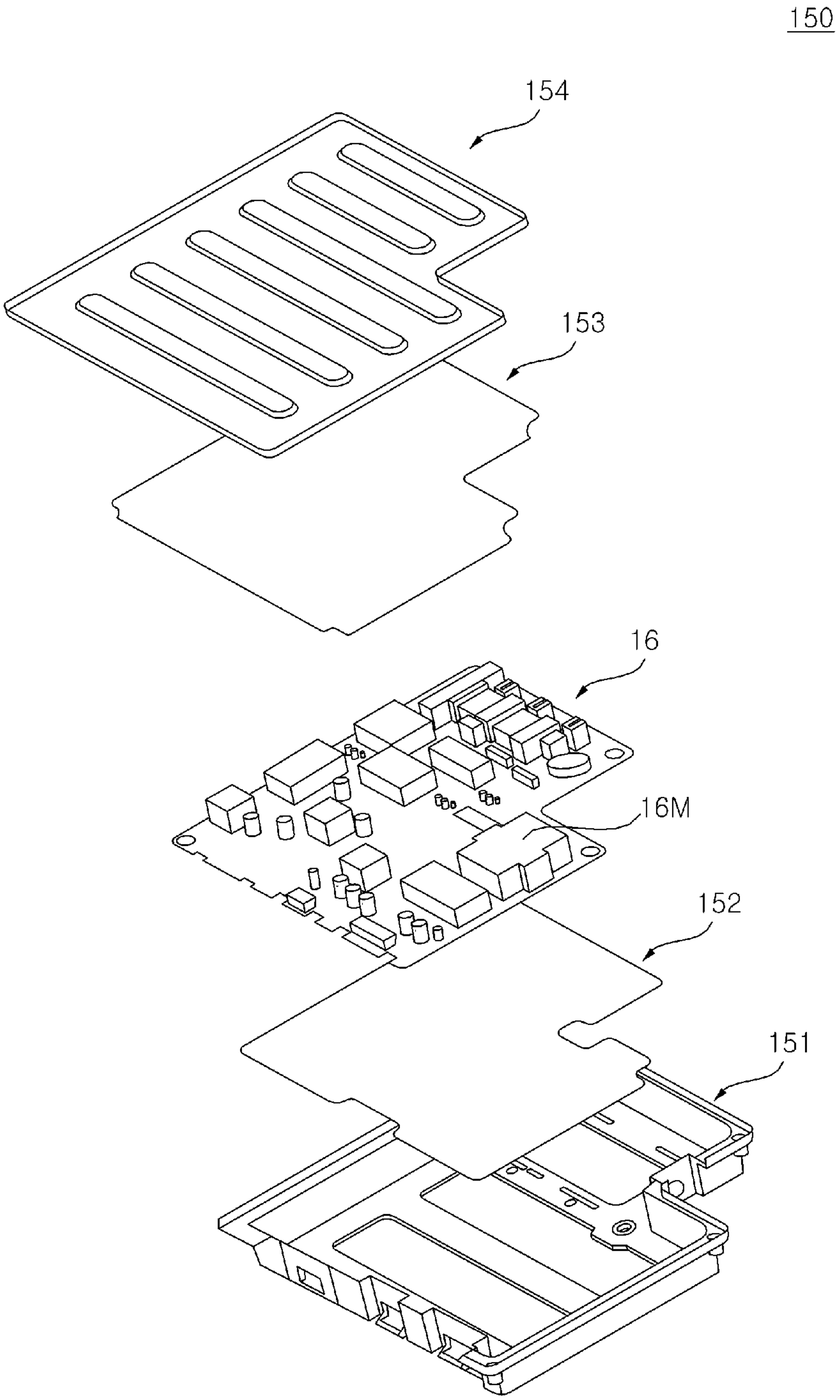

Referring to FIG. 12, a housing 150 may include a lower case 151 and an upper cover 154. The lower case 151 may have the shape of a tub with an accommodation space therein. For example, the lower case 151 may be an injection molded product of a flame-retardant material. The lower case 151 may be made of a material with enhanced chemical resistance. The lower case 151 may have an opening for weight reduction. A lower plate 152 may be disposed at the bottom of the lower case 151. The lower plate 152 may include a metal. The lower plate 152 may cover the opening of the lower case 151.

At least one electrical element 16M may be mounted on a substrate 16. For example, the substrate 16 may be a power supply unit (PSU) or a motherboard. The substrate 16 may be disposed on the lower plate 152.

An upper plate 153 may be disposed on the substrate 16. The upper plate 153 may include a metal. The upper plate 153 may face the lower plate 152.

The upper cover 154 may cover the upper plate 153, and may close the lower case 151. The upper cover 154 may include a metal. For example, the upper cover 154 may be aluminum. The upper cover 154 may be coupled to the lower case 151.

Accordingly, the chemical resistance of the substrate 16 on which electrical elements 16M are mounted can be increased.

Figure 13:
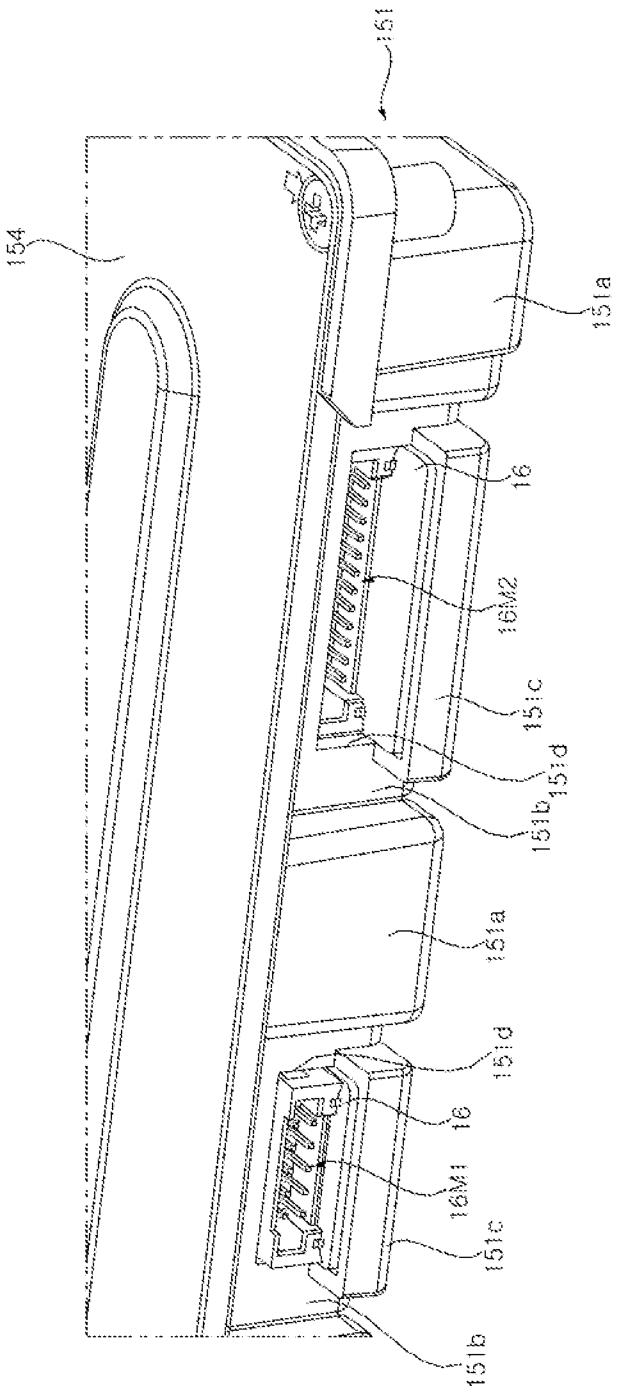
Figure 14:
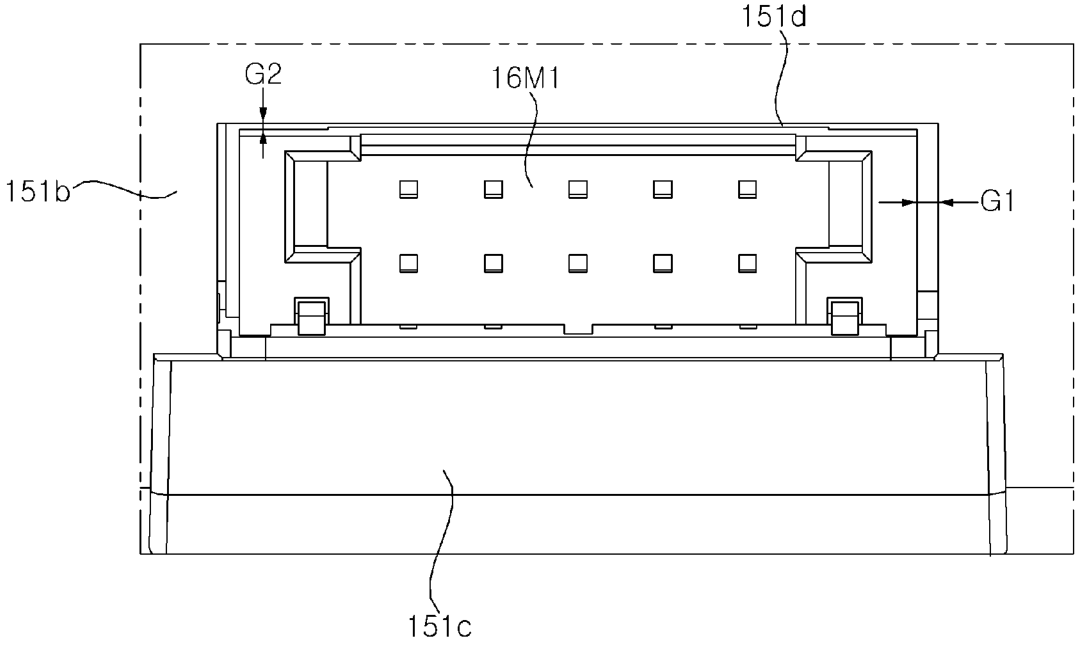

Referring to FIGS. 13 and 14, the housing 150 may include a docking opening 151*d*. The docking opening 151*d* may be formed in a side surface of the housing 150. A recessed side wall 151*b* may be formed around the docking opening 151*d*. The recessed side wall 151*b* may be recessed while forming a step inwardly from an outer side wall 151*a* of the housing 150.

A connector 16M1, 16M2 mounted on the substrate 16 may be exposed to the outside through the docking opening 151*d*. An under cover 151*c* may be provided under the docking opening 151*d*. The under cover 151*c* may support the connector 16M1, 16M2 exposed to the docking opening 151*d* and/or the substrate 16 under the connector 16M1, 16M2. The under cover 151*c* may protrude from the recessed side wall 151*b*. An outer surface of the under cover 151*c* may correspond to an outer surface of the outer side wall 151*a*.

Gaps G1 and G2 may be formed between the docking opening 151*d* and the connector 16M1, 16M2. The gaps G1 and G2 may include a first gap G1 and a second gap G2. The first gap G1 may be formed between the connector 16M1, 16M2 and a left or right inner surface of the docking opening 151*d*. The second gap G2 may be formed between the connector 16M1, 16M2 and an upper inner surface of the docking opening 151*d*.

Thus, it is possible to not only increase the chemical resistance but also prevent an external impact from being applied to major components.

Figure 15:
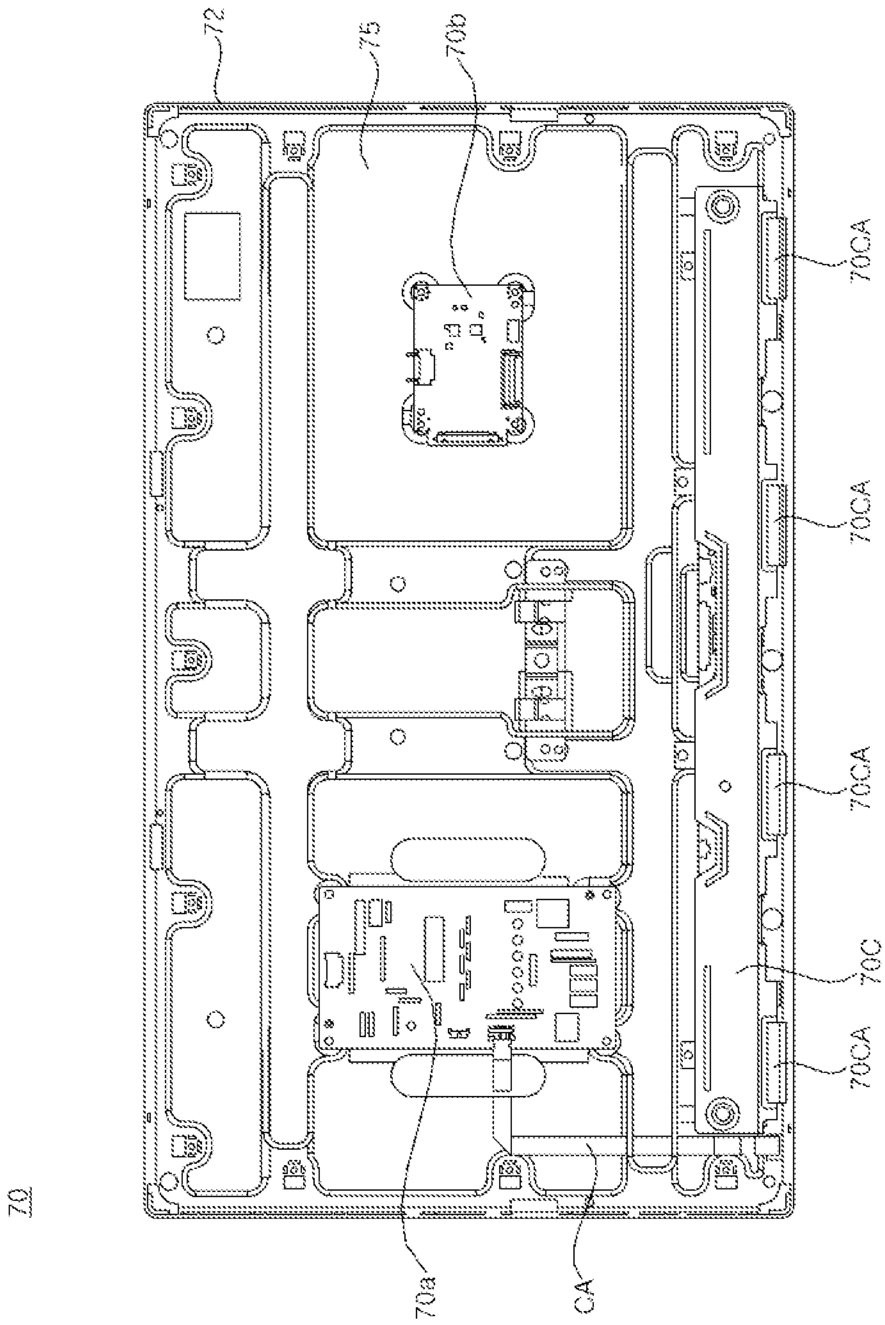
Figure 16:
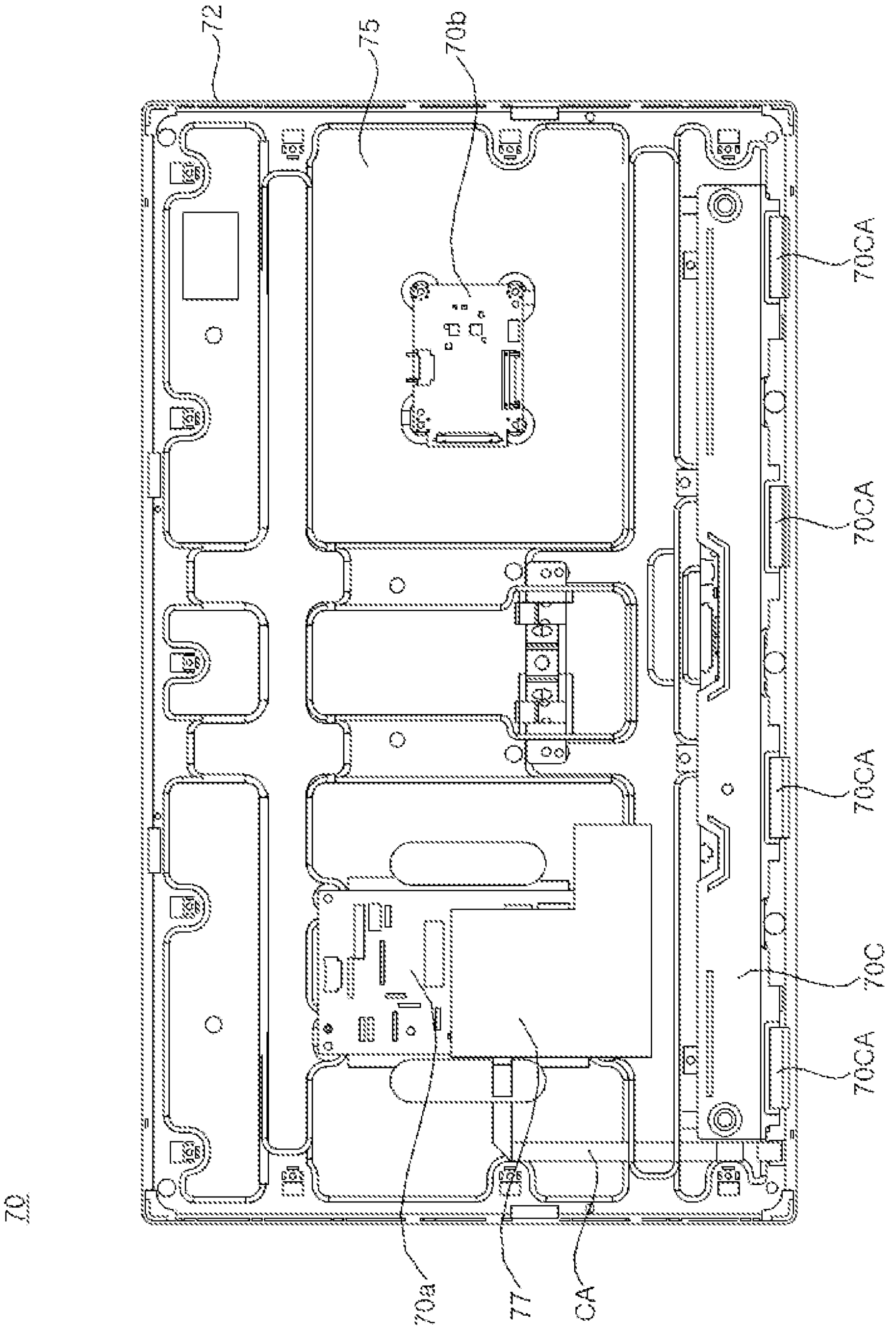

Referring to FIGS. 15 and 16, a control board (70*a*, 70*b*, 70*c*) may be mounted or fixed to a rear surface of the frame 75 of the display 70. For example, the control board (70*a*, 70*b*, 70*c*) may be a power board 70*a*, a sub board 70*b*, or a source PCB 70*c*. Electrical elements may be mounted on the control board (70*a*, 70*b*, 70*c*), and heat may be generated as the electrical elements are operated.

A flexible cable CA may provide an electrical connection between the power board 70*a* and the display panel 71. The power board 70*a* may control power and/or signals provided to the light source of the display 70. The power board 70*a* may be referred to as a light source drive board 70*a*. The sub board 70*b* may process image information provided to the display panel 71 (see FIG. 1). The source PCB 70*c* may be mounted or fixed to the rear surface of the frame 75 while being adjacent to a lower side of the frame 75. A COF 70CA may provide an electrical connection between the source PCB 70*c* and the display panel 71.

A shield member 77 may cover the control board (70*a*, 70*b*, 70*c*). The shield member 77 may be referred to as a first shield member 77, a display shield member 77, a heat dissipation sheet 77, or a heat distribution sheet 77. For example, the shield member 77 may be a graphite sheet. The shield member 77 may cover the power board 70*a*. The shield member 77 may overlap at least a portion of the power board 70*a*.

Figure 17:
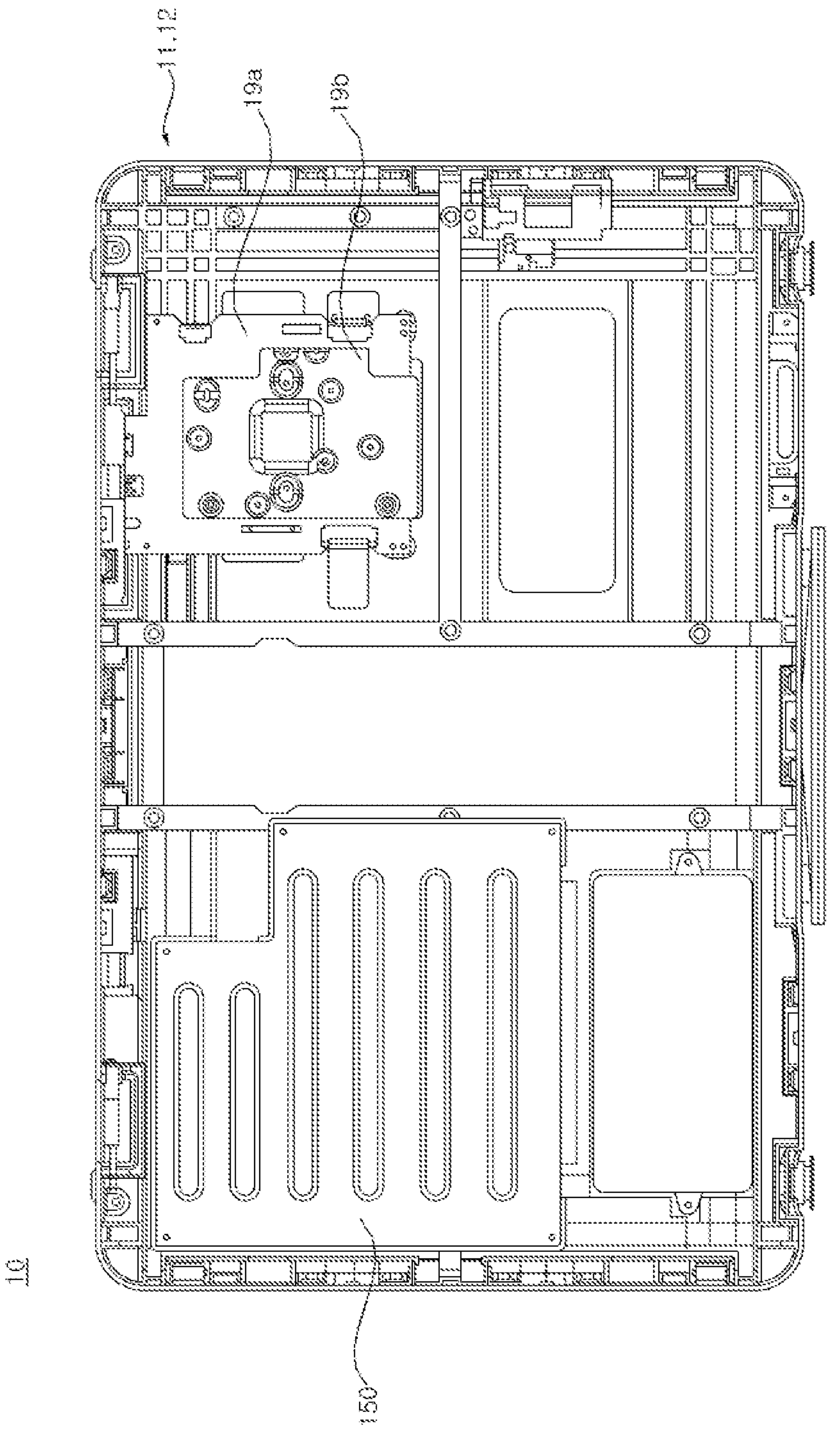
Figure 18:
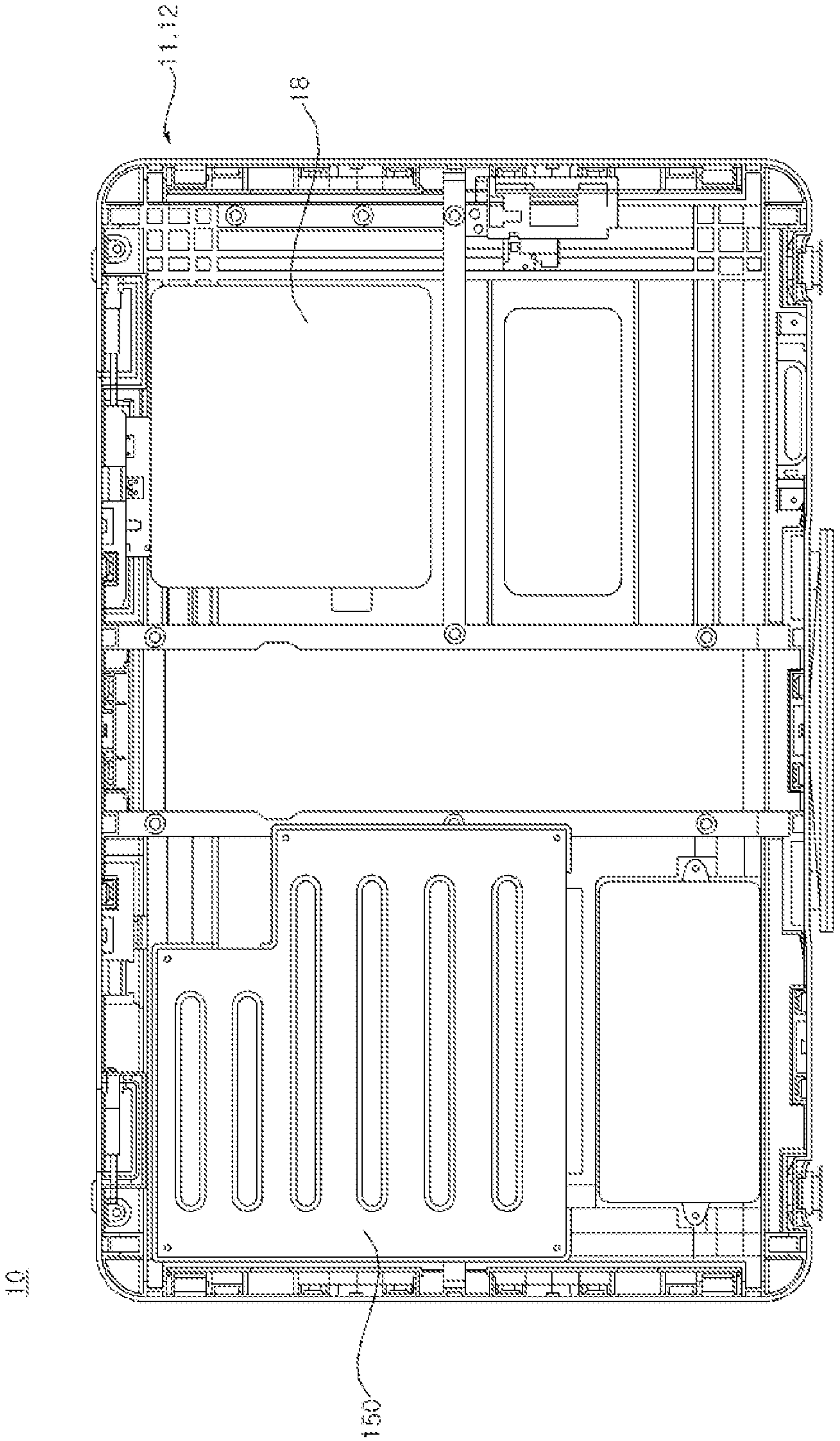

Referring to FIGS. 17 and 18, the housing 150 in which the power supply unit 16 (see FIG. 6) is embedded may be mounted on or coupled to the frame 12 of the base 10. A main board 19*a* may be adjacent to the housing 150 embedded with the power supply unit 16, and may be mounted on or coupled to the frame 12 of the base 10. The power supply unit 16 may supply power required for the display device 1 (see FIG. 1). The main board 19*a* may process image information displayed via the display panel 71 and/or voice information provided through a speaker assembly. The power supply unit 16 and/or the main board 19*a* may generate heat when driven.

A shield plate 19*b* may cover a portion of the main board 19*a*, and may be mounted on or fixed to the frame 12. The shield plate 19*b* may prevent physical and electrical damage to the main board 19*a*.

A shield member 18 may cover the main board 19*a*. The shield member 18 may be referred to as a second shield member 18, a base shield member 18, a heat dissipation sheet 18, or a heat distribution sheet 18. The shield member 18 may overlap all or at least part of the main board 19*a*. For example, the shield member 18 may be a graphite sheet.

Figure 19:
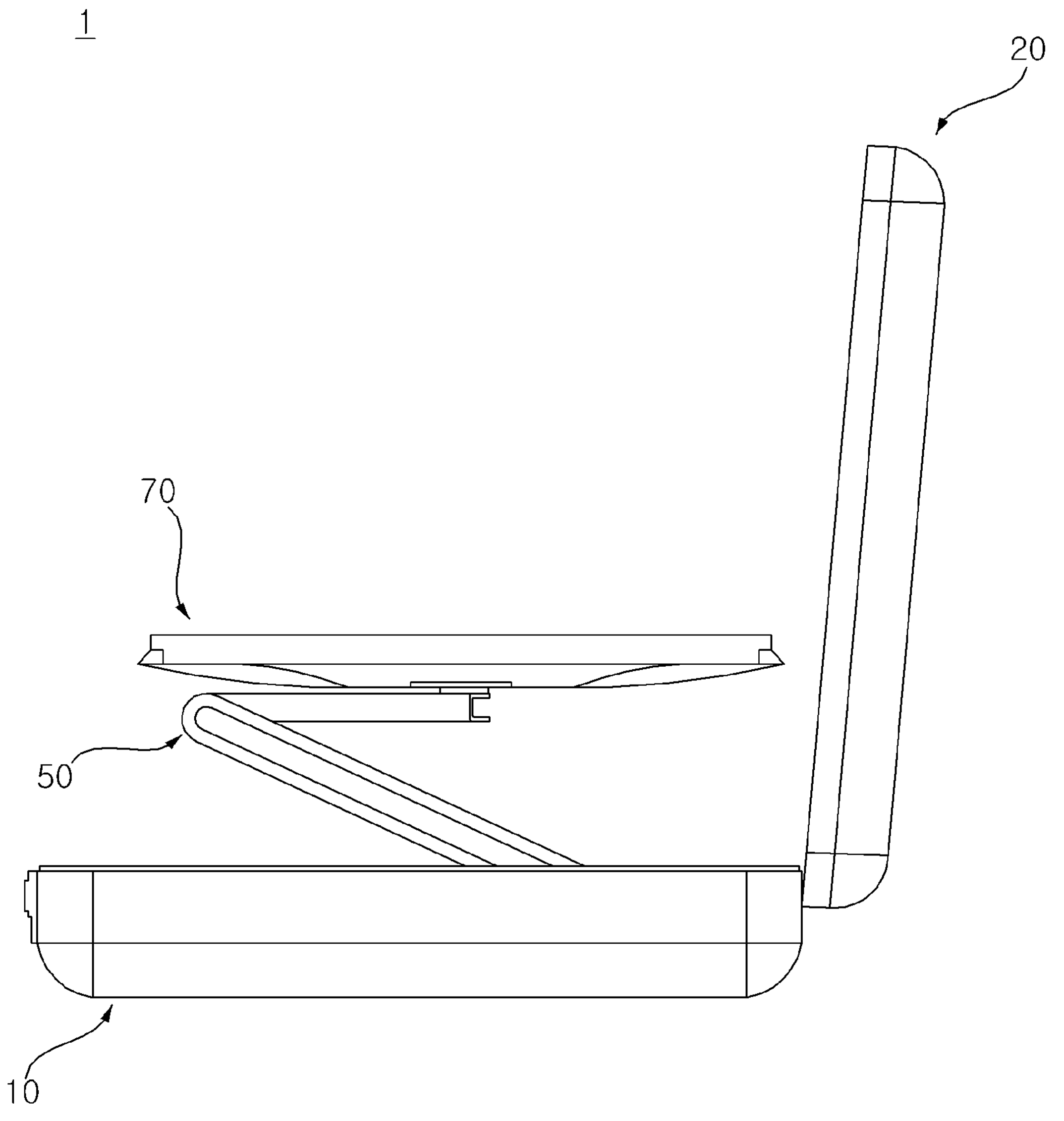
Figure 20:
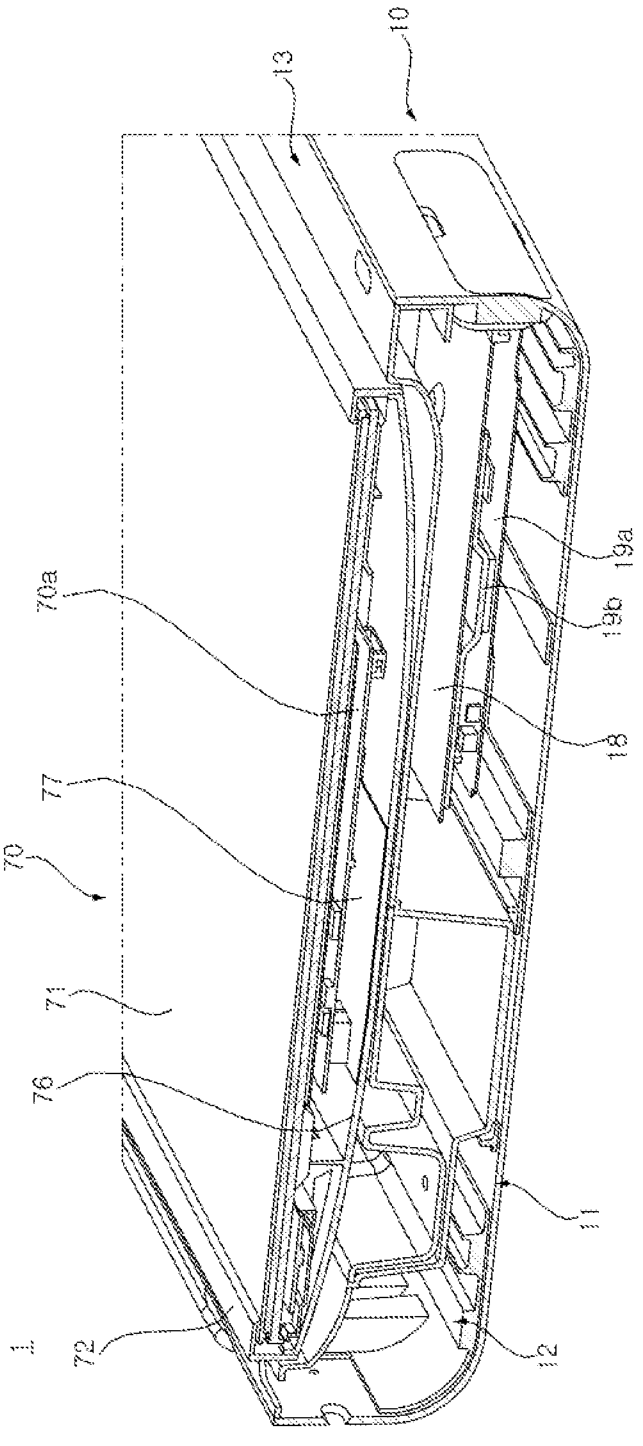

Referring to FIGS. 19 and 20, as the cover 20 is opened and closed from the base 10 with respect to the hinge 30 (see FIG. 1), the display 70 may be stored in the base 10. The display 70 may be moved to an outside of the base 10 or be placed on the base 10 by the arm 50. When the display 70 is stored on the base 10, the display 70 and the base 10 may be arranged in parallel to face each other.

The side cover 72 may cover the side surface of the display panel 71, and the back cover 76 may be disposed at the rear of the display panel 71 so as to be coupled to the side cover 72. A control board 70*a* may be positioned between the display panel 71 and the back cover 76. For example, the control board 70*a* may be a light source drive board 70*a*, and high heat may be generated when the control board 70*a* is driven. Heat generated from the control board 70*a* may be discharged to the outside through the back cover 76.

The main board 19*a* that is mounted on the frame 12 of the base 10 may be positioned between the frame 12 and the top 13. A lot of heat may be generated when the main board 19*a* is driven, and the heat may be discharged to the outside through the top 13.

The first shield member 77 may be positioned between the control board 90*a* and the back cover 76. The first shield member 77 may be fixed or bonded to the back cover 76. For example, the first shield member 77 may be a graphite sheet. The second shield member 18 may be positioned between the main board 19*a* and the top 13.

Referring further to FIG. 15 and FIG. 17, FIG. 15 shows the rear surface of the display 70 that faces the base 10, and FIG. 17 shows the front surface of the base 10 that faces the display 70.

The housing 150 in which the power supply unit 16 (see FIG. 6) is embedded may generate high heat. The light source drive board 70*a* may generate high heat. When the display 70 is stored on the base 10, the housing 150 embedded with the power supply unit 16 may not overlap the light source drive board 70*a*. Accordingly, heat generated from the housing 150 and heat generated from the light source drive board 70*a* can be evenly distributed in the display device 1.

When the display 70 is stored on the base 10, the light source drive board 70*a* may overlap at least a portion of the main board 19*a*. Heat generated from the light source drive board 70*a* and heat generated from the main board 19*a* may be accumulated while being emitted toward each other.

Heat generated from the light source drive board 70*a* may be distributed horizontally by the first shield member 77 to be dissipated. Heat generated from the main board 19*a* may be distributed horizontally by the second shield member 18 to be dissipated. For example, the first shield member 77 may partially or at least partially overlap the second shield member 18. As another example, the first shield member 77 may be aligned so as not to overlap the second shield member 18. As another example, the first shield member 77 may be adjacent to the second shield member 18 while forming a boundary. Accordingly, the heat generated from the main board 19*a* and the heat generated from the light source drive board 70*a* can be distributed without accumulation.

Thus, even when the display 70 is stored on the base 10, heat generated by the operation of the display 70 can be evenly distributed and dissipated.

Figure 21:
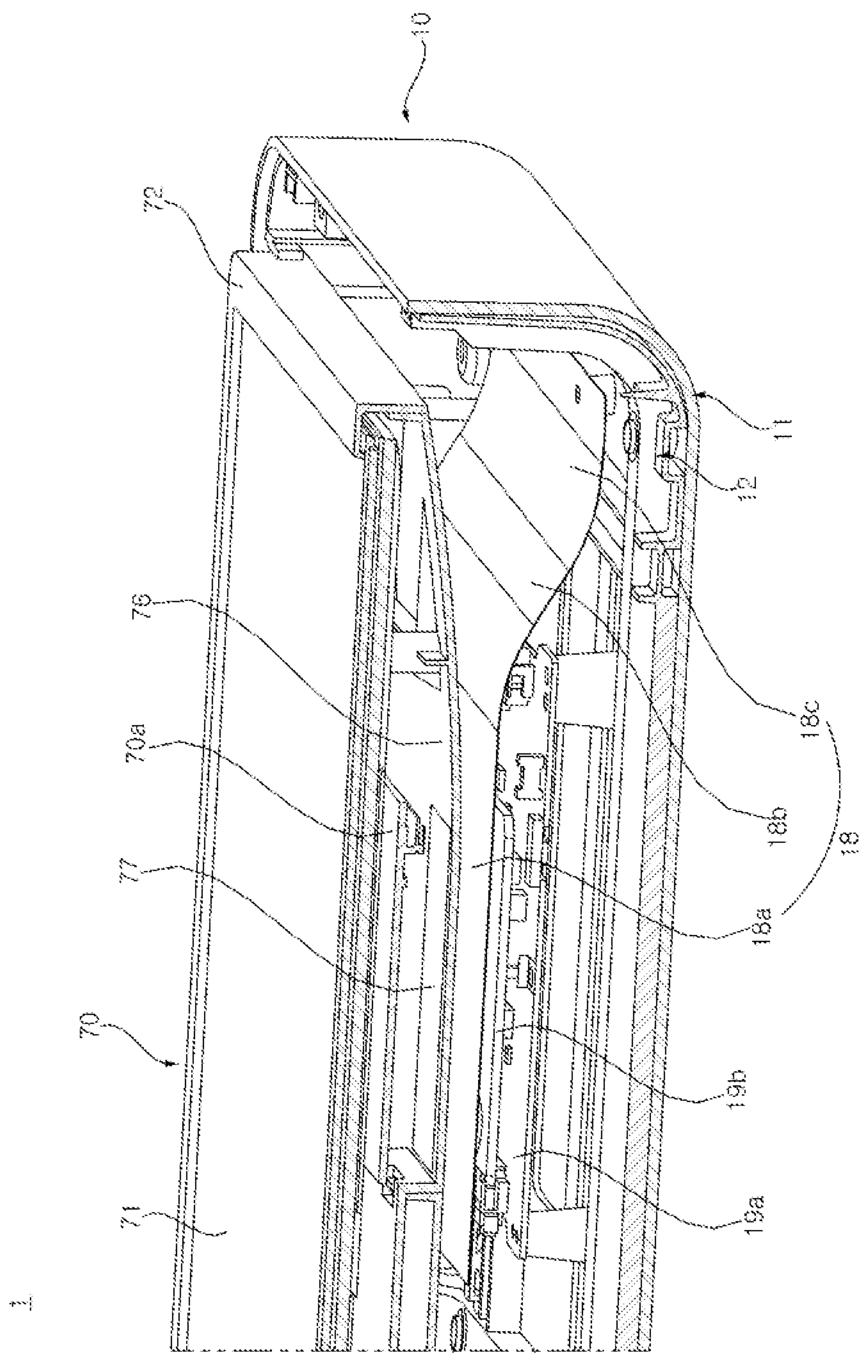

Referring to FIG. 21, the second shield member 18 may include a first sheet part 18*a*, a second sheet part 18*b*, and a third sheet part 18*c*.

The first sheet part 18*a* may be positioned between the main board 19*a* and the light source drive board 70*a*, and may cover the main board 19*a*. The second sheet part 18*b* may extend from the first sheet part 18*a*. The second sheet part 18*b* may form a slope descending from the first sheet part 18*a*.

The second sheet part 18*b* may extend in a curved manner from the first sheet part 18*a* toward the bottom of the frame 12 of the base 10. The third sheet part 18*c* may be positioned above the bottom of the frame 12 of the base 10, and may cover the bottom of the frame 12.

The first sheet part 18*a* may have a negative slope toward the second sheet part 18*b*. The slope of the first sheet part 18*a* may be less than the slope of the second sheet part 18*b*.

Thus, moisture or water, which may be formed on the second shield member 18 that is configured to cover the main board 19*a* in response to on/off of the main board 19*a*, can be discharged while passing through the first sheet part 18*a*, the second sheet part 18*b*, and the third sheet part 18*c*.

Figure 22:
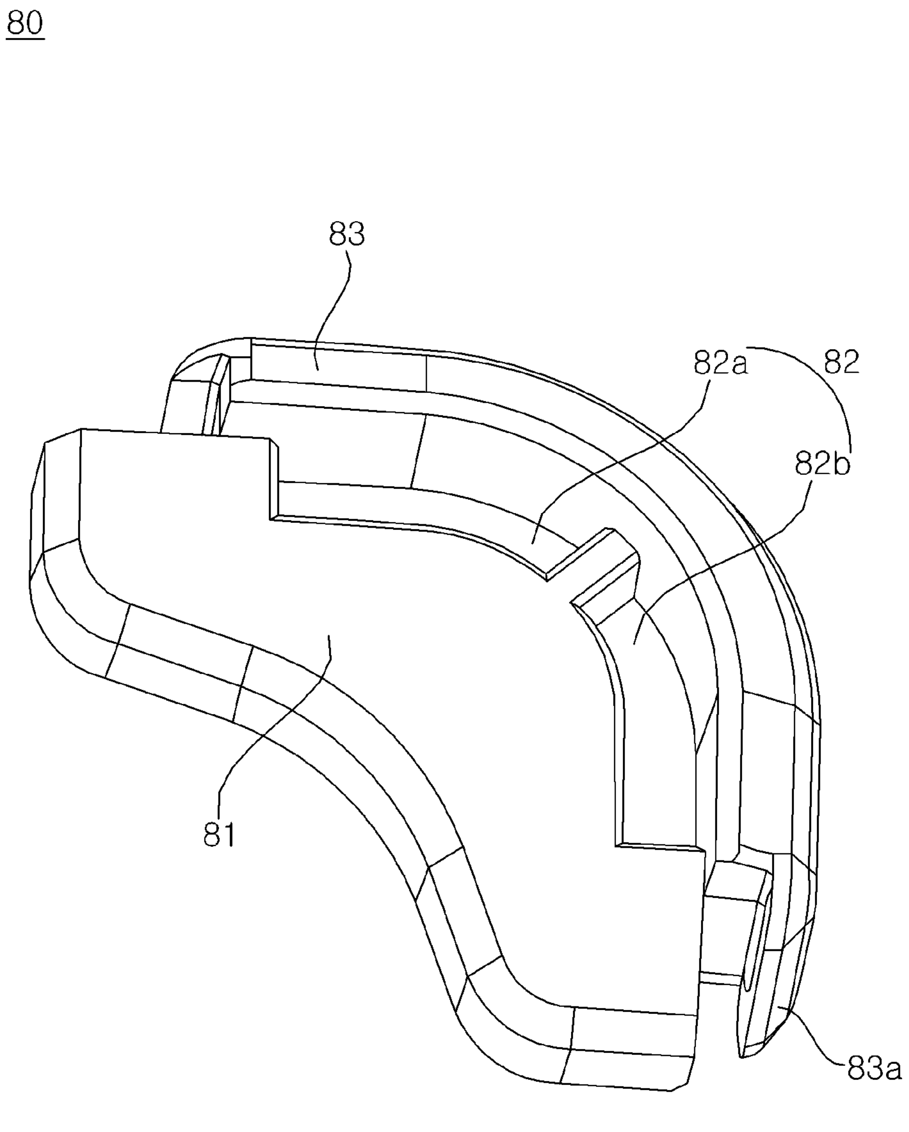
Figure 23:
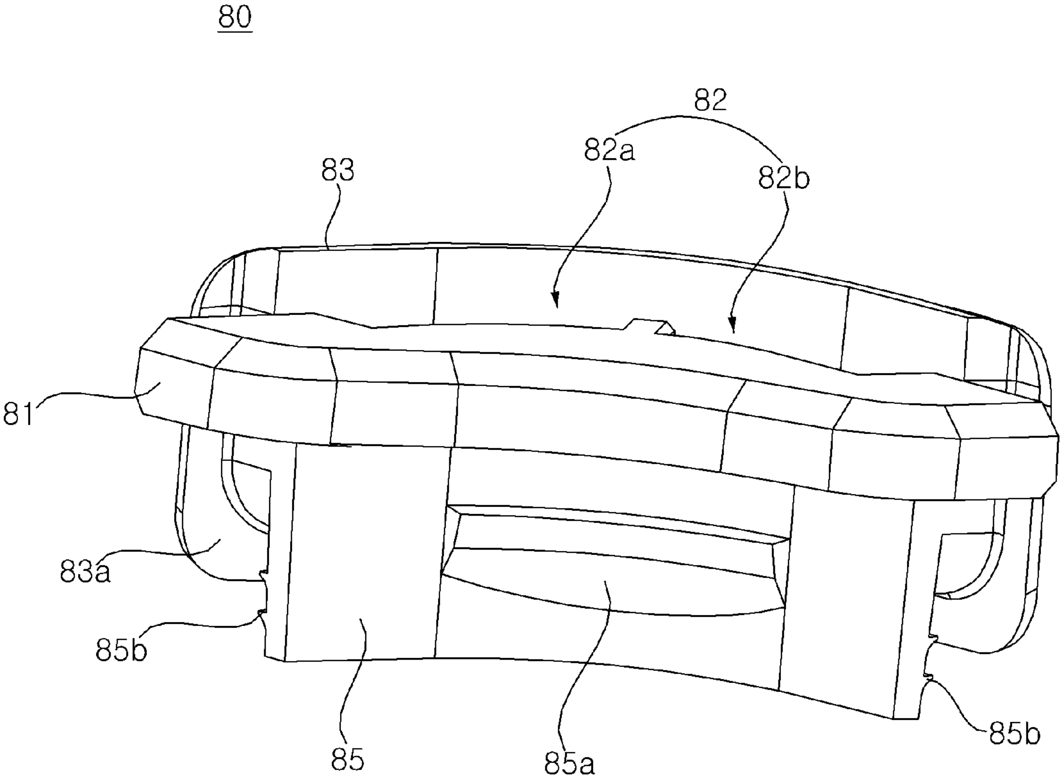
Figure 24:
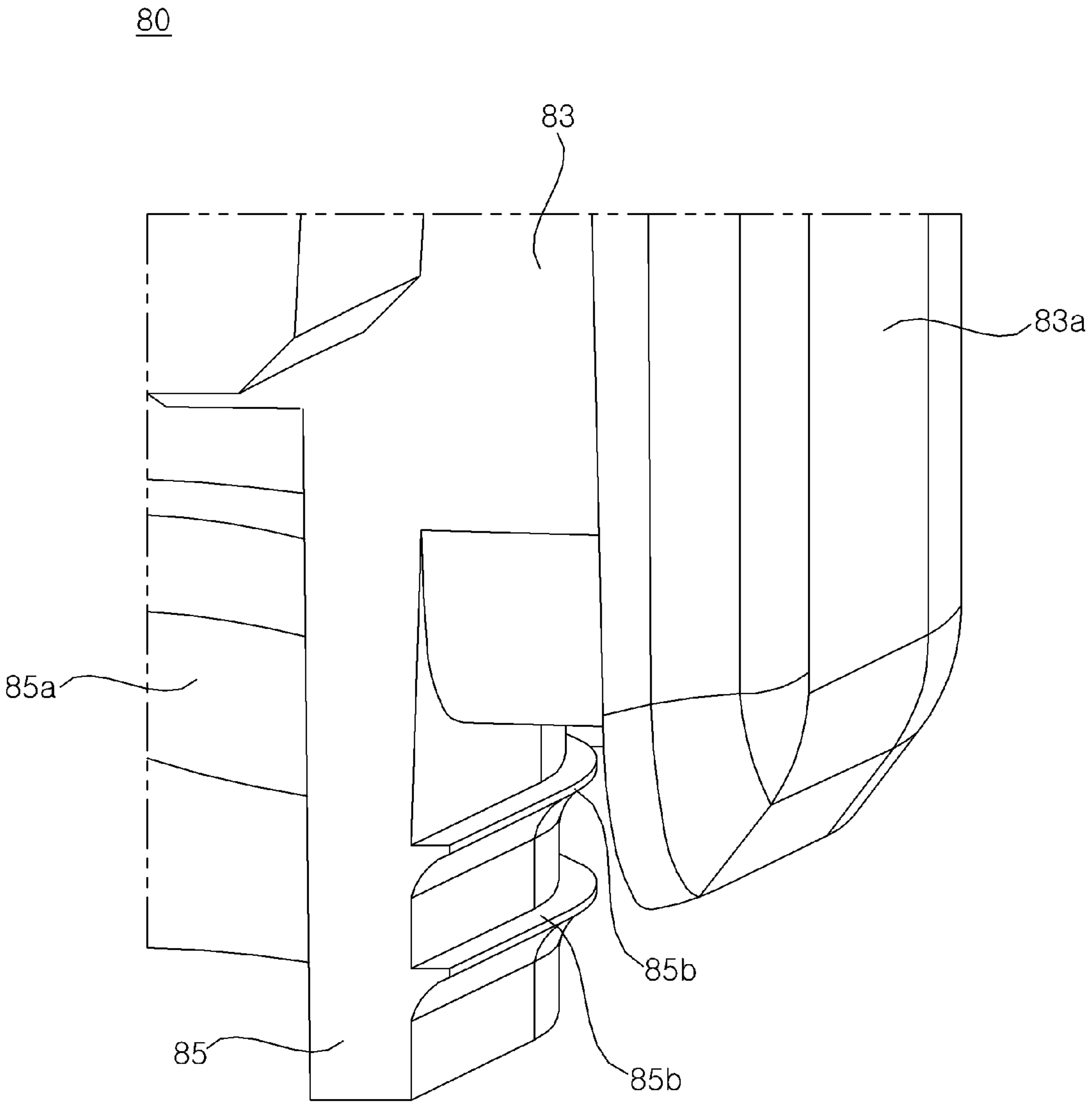

Referring to FIGS. 22 to 24, a bumper 80 may include a body 81 and a wall 83. The body 81 may be a first piece 81 that extends widely and has a constant thickness. The wall 83 may be a second piece 83 that extends in a direction intersecting an extension direction of the body 81. The wall 83 may be integrally formed with the body 81.

A trench 82 may be formed on an upper surface of the body 81, and may be adjacent to the wall 83. A plurality of trenches 82 may be provided. The plurality of trenches 82 may include a first trench 82*a* and a second trench 82*b*. The first trench 82*a* may extend along an inner surface of the wall 83 and may be adjacent to the second trench 82*b*. The second trench 82*b* may extend along the inner surface of the wall 83 and may be adjacent to the first trench 82*a*.

An apron 83*a* may be formed on an outside of the wall 83. The apron 83*a* may be formed larger than the wall 83 at the outside of the wall 83. Left and right ends and/or a lower end of the apron 83*a* may extend beyond the wall 83.

An insert 85 may extend downward of the body 81, and may face the wall 83 and/or the apron 83*a*. The insert 85 may be parallel to the apron 83*a*. The insert 85 may be disposed opposite the apron 83*a* with respect to the wall 83. A fixing rib 85*a* may protrude from an inner surface of the insert 85. A sealing rib 85*b* may protrude from an outer surface of the insert 85. A plurality of sealing ribs 85*b* may be provided, and the plurality of sealing ribs 85*b* may be arranged side by side at a distance from each other.

Figure 25:
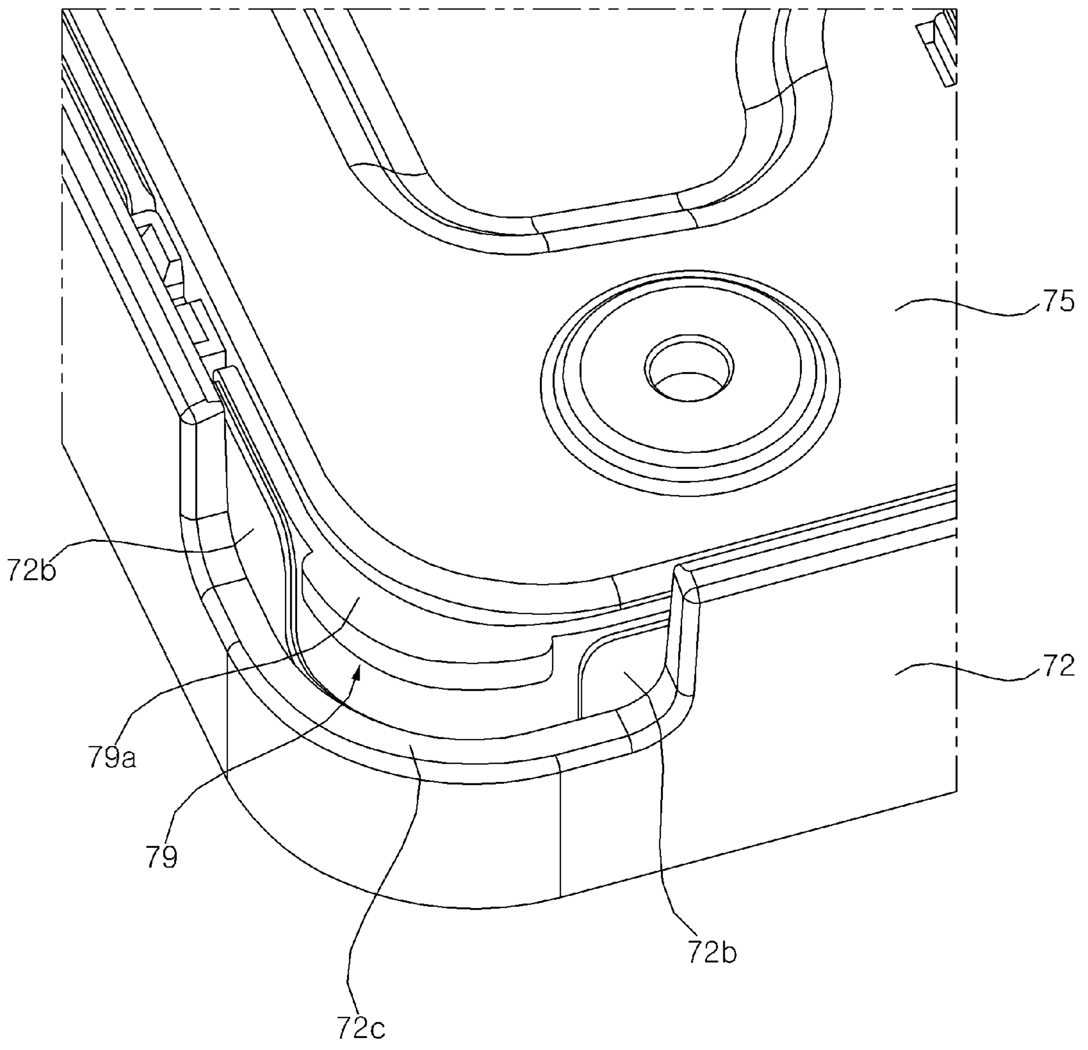
Figure 26:
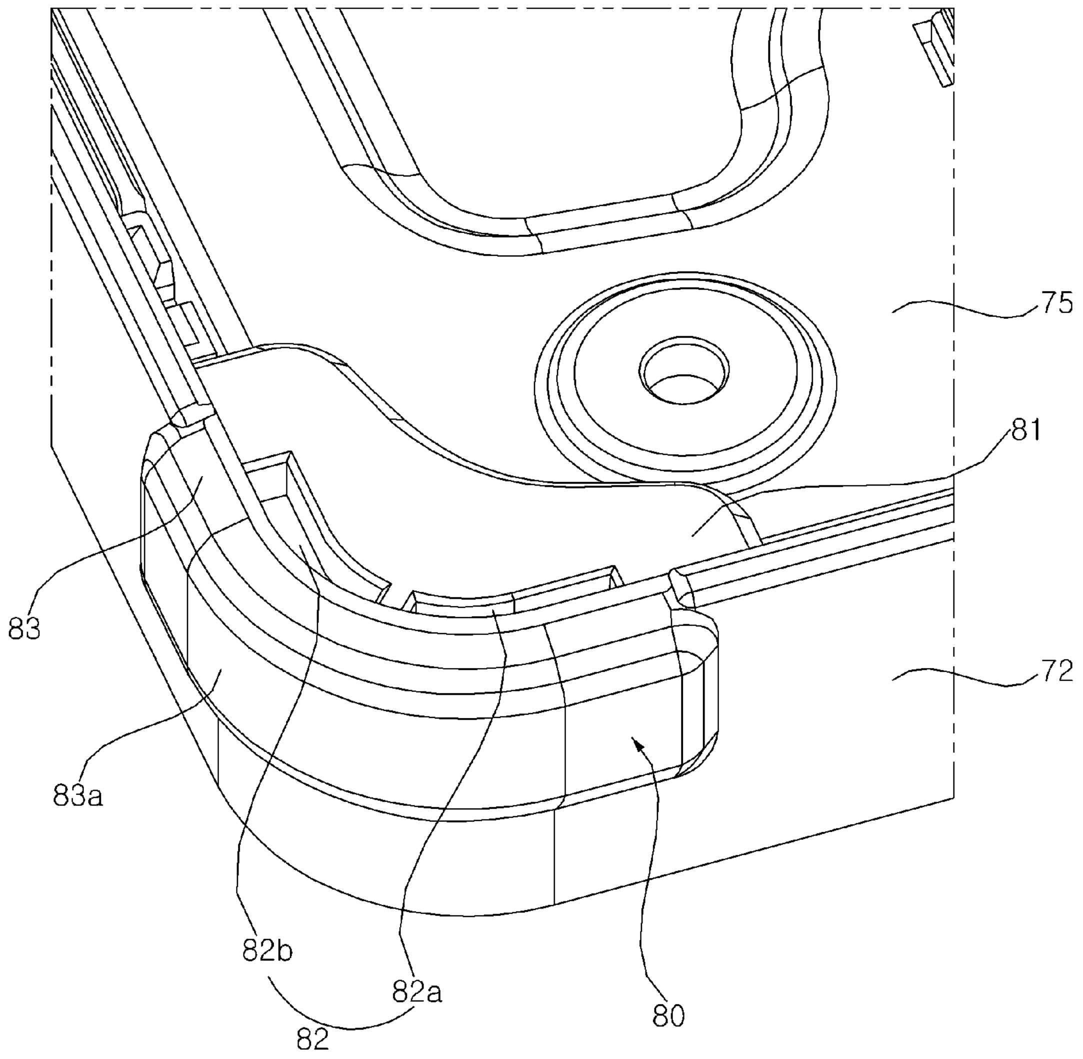
Figure 27:
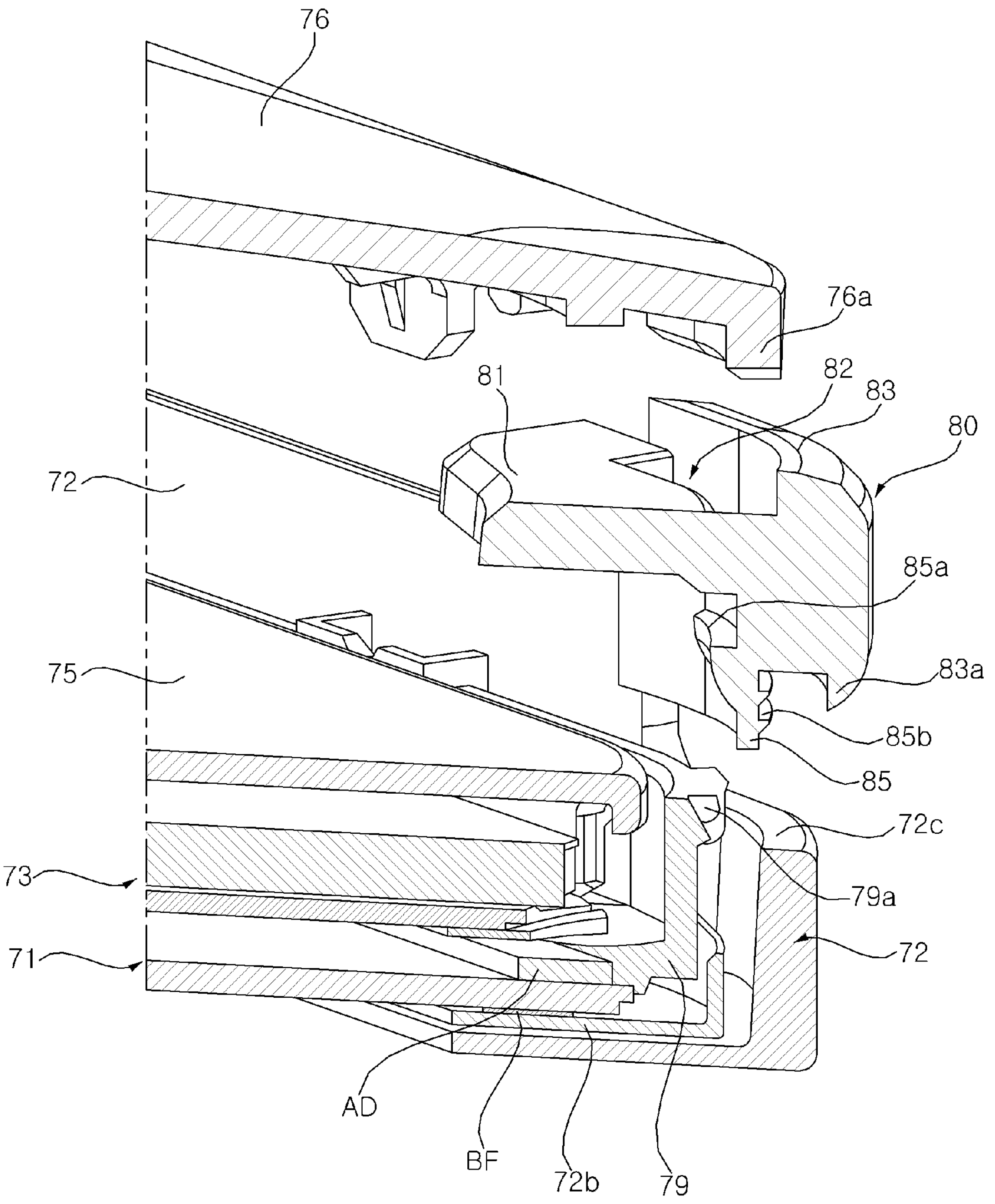

Referring to FIGS. 25 to 27, the bumper 80 may be coupled to the side cover 72 of the display 70 (see FIG. 1). The body 81 of the bumper 80 may be in contact with a rear surface of the frame 75 or may be supported by the rear surface of the frame 75. The wall 83 of the bumper 80 may be positioned on a cut-out part 72*c* of the side cover 72. The cut-out part 72*c* of the side cover 72 may be inserted between the insert 85 of the bumper 80 and the apron 83*a* of the wall 83. The depth of the cut-out part 72*c* may correspond to the height of the wall 83.

The back cover 76 may be coupled to the frame 75 and/or the side cover 72 while covering the rear surface of the frame 75. A coupling protrusion 76*a* may protrude from a front surface of the back cover 76 at a corner of the back cover 76. The coupling protrusion 76*a* may be inserted into the trench 82 of the bumper 80.

A guide panel 79 may be inserted between the frame 75 and the side cover 72, and may support the rear surface adjacent to an edge of the display panel 71. The guide panel 79 may have an engaging portion 79*a*. The engaging portion 79*a* may be formed in a protruding manner from an outer surface of the guide panel 79 at a corner of the guide panel 79. The bumper 80 may be inserted into the cut-out part 72*c* of the side cover 72, so that the fixing rib 85*a* of the bumper 80 may be fixed while being engaged with the engaging portion 79*a* of the guide panel 79.

Figure 28:
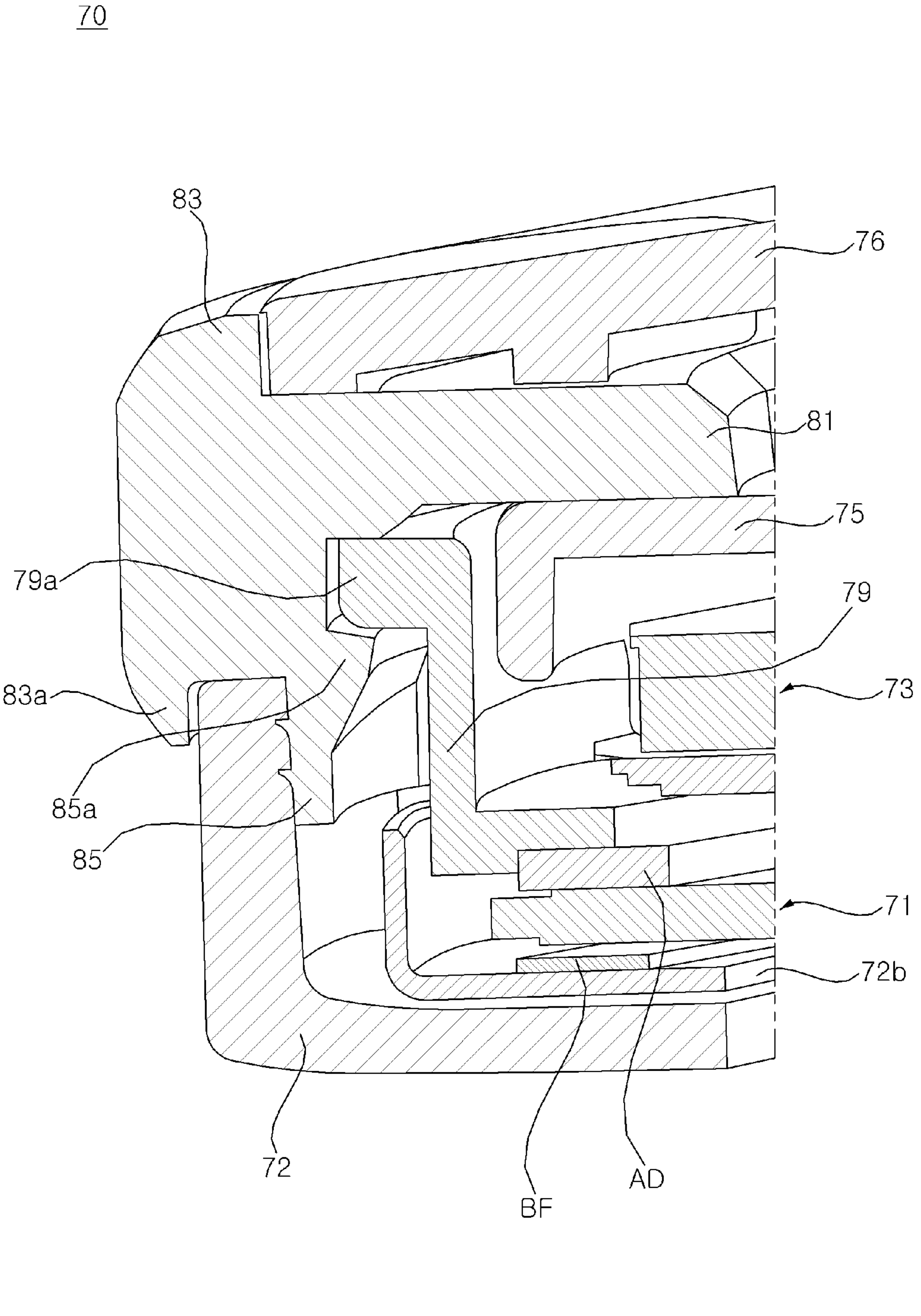
Figure 29:
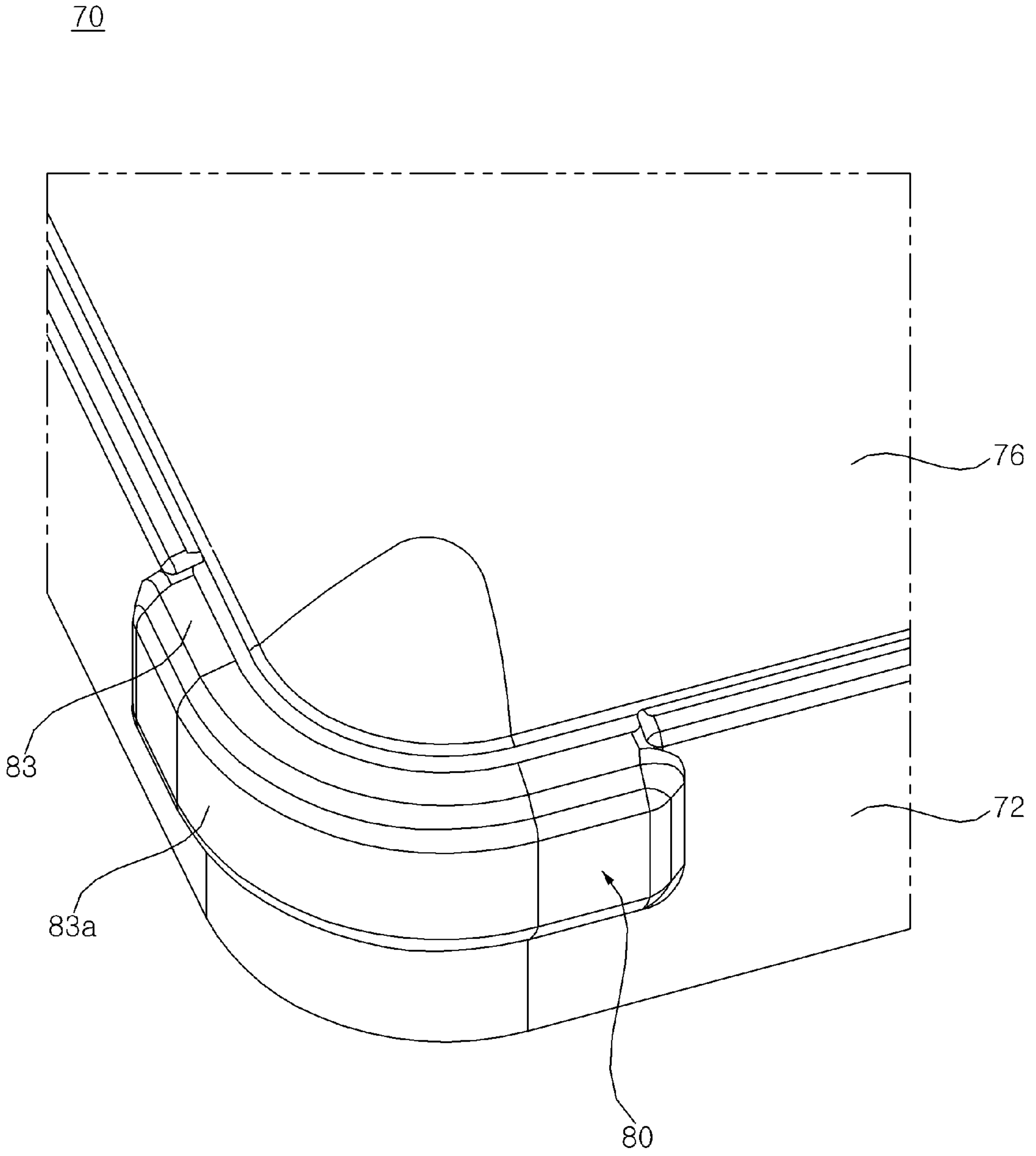

Referring to FIGS. 28 and 29, the optical layer 73 may be positioned between the frame 75 and the display panel 71. The guide panel 79 may be coupled to the frame 75, and may support the rear surface adjacent to an edge of the display panel 71. The display panel 71 may be fixed to the guide panel 79 by an adhesive member AD. An inner top 72*b* may cover the front side of the edge of the display panel 71, and may be coupled to the guide panel 79 between the guide panel 79 and the side cover 72. A buffer layer BF may be fixed inside the inner top 72*b*, and may face the front surface of the display panel 71. The buffer layer BF may form a gap with the front surface of the display panel 71.

The side cover 72 may cover the front surface adjacent to the edge of the display panel 71, and may cover the side surface of the guide panel 79 and/or the inner top 72*b*. The body 81 of the bumper 80 may be positioned between the frame 75 and the back cover 76, and the wall 83 of the bumper 80 may connect the side cover 72 and the back cover 76. The apron 83*a* of the bumper 80 may protrude further than an outer surface of the side cover 72.

Thus, the display 70 can be protected by absorbing impact that may be applied to the corner of the display 70 when the display 70 is stored in the base 10 (see FIG. 19).

Figure 30:
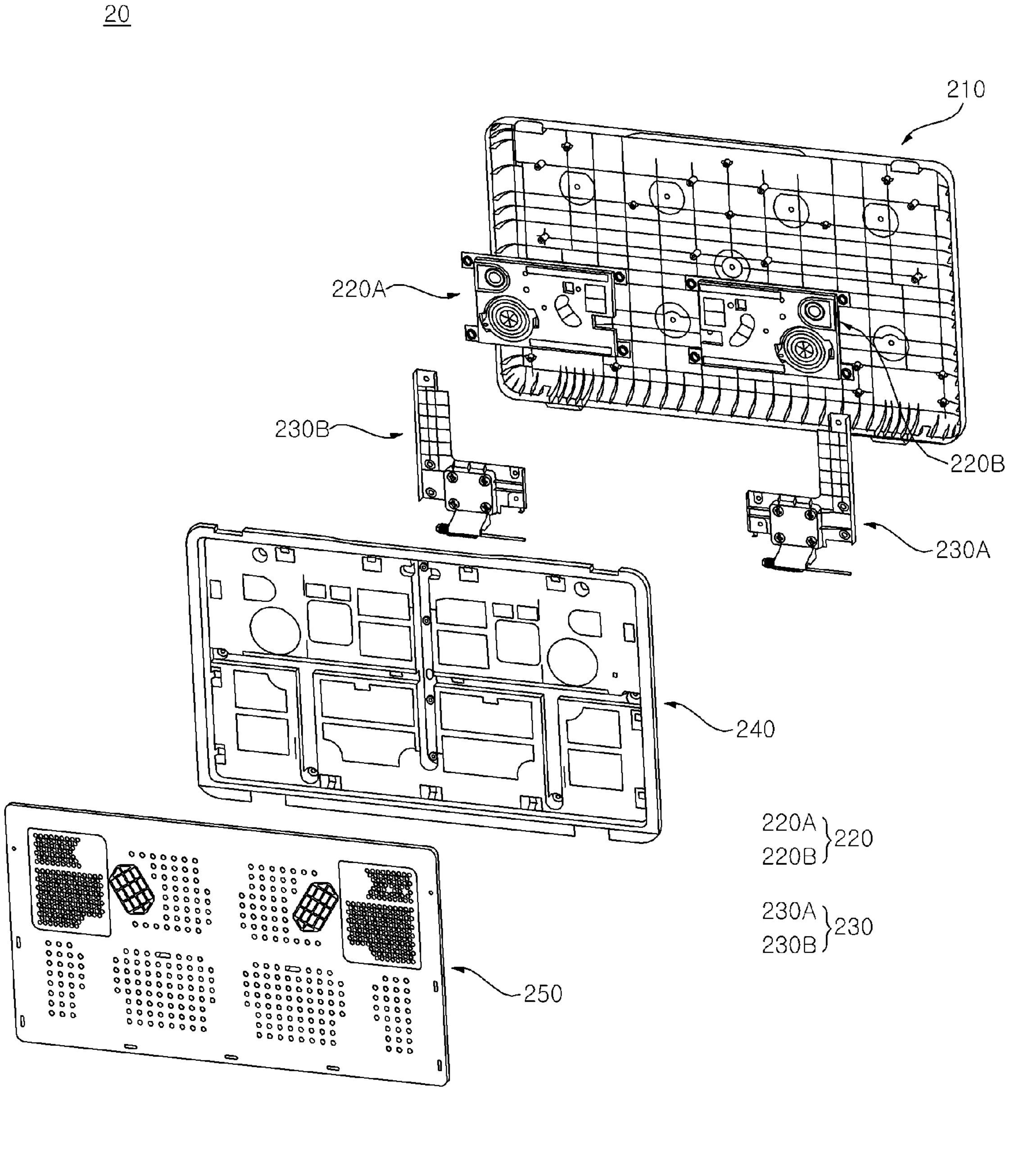

Referring to FIG. 30, the cover 20 may include an outer cover 210, a middle frame 240, and an inner cover 250. The outer cover 210 may have the shape of a tub with an accommodation space therein. The middle frame 240 may be coupled to an inside of the outer cover 210, and the inner cover 250 may be coupled to the middle frame 240. The middle frame 240 may be disposed between the outer cover 210 and the inner cover 250.

A speaker assembly 220 may be positioned between the middle frame 240 and the outer cover 210, and may be coupled or fixed to the outer cover 210. A hinge assembly 230 may be fixed to the outer cover 210. The hinge assembly 230 may be positioned between the middle frame 240 and the outer cover 210.

Figure 31:
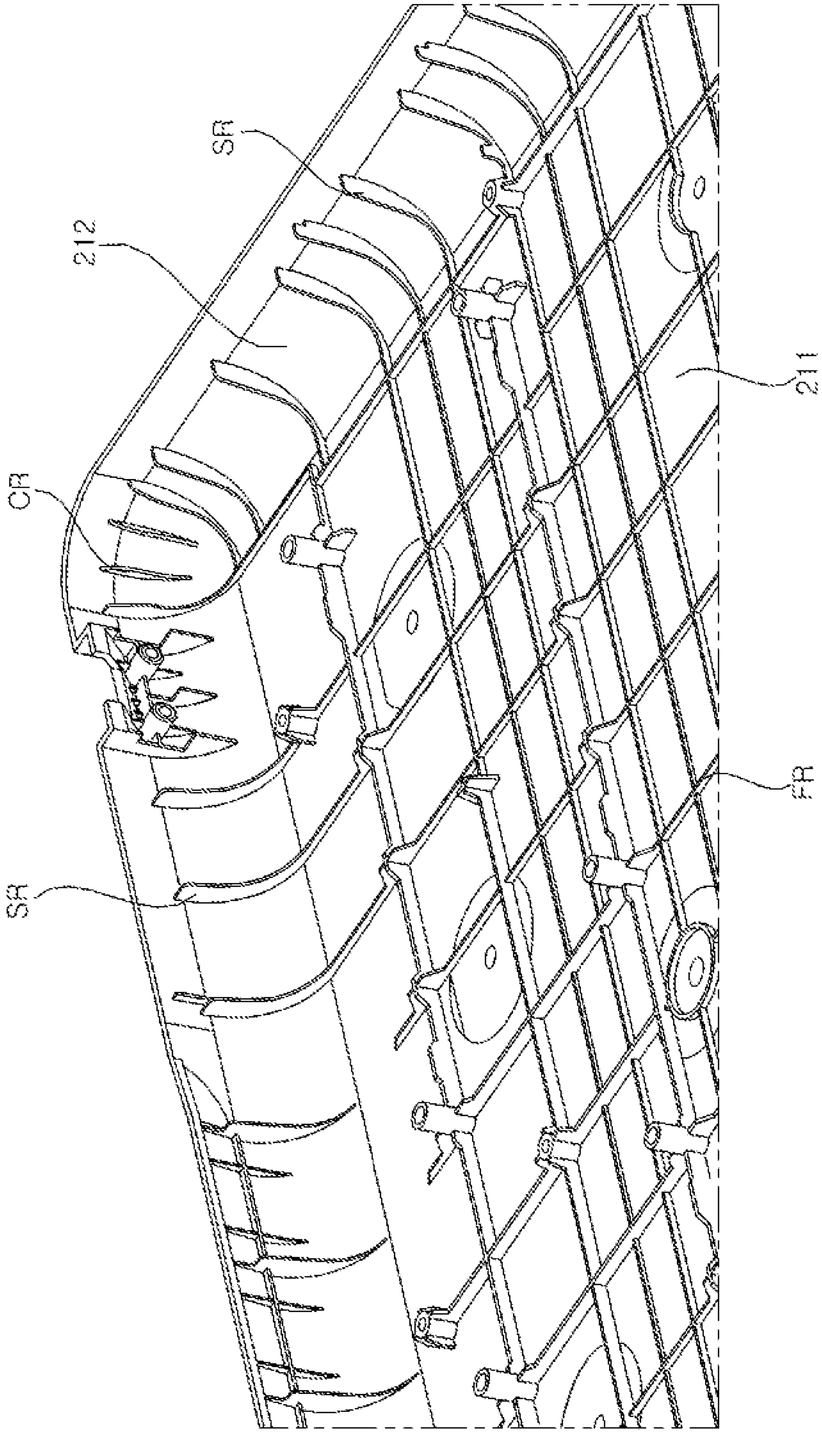

Referring to FIG. 31, the outer cover 210 may include a center part 211, a side part 212, and ribs FR, SR, and CR. The center part 211 may define a flat plate of the outer cover 210. The side part 212 may extend from the center part 211, and may define a wall or dam at an outer edge (or periphery) of the center part 211.

The ribs FR, SR, and CR may include a center rib FR, a side rib SR, and a corner rib CR. Center ribs FR may be formed on an inner side of the center part 211. The center ribs FR may intersect each other to form a matrix. Side ribs SR may be formed on an inner side of the side part 212. The side rib SR may be connected to the center rib FR. Corner ribs CR may be formed on an inner side of a corner defined by the side part 212.

Accordingly, the rigidity of the outer cover 210 can be increased. As a result, the outer cover 210 can be protected from damage caused by impact applied to the sides and/or the corners.

Figure 32:
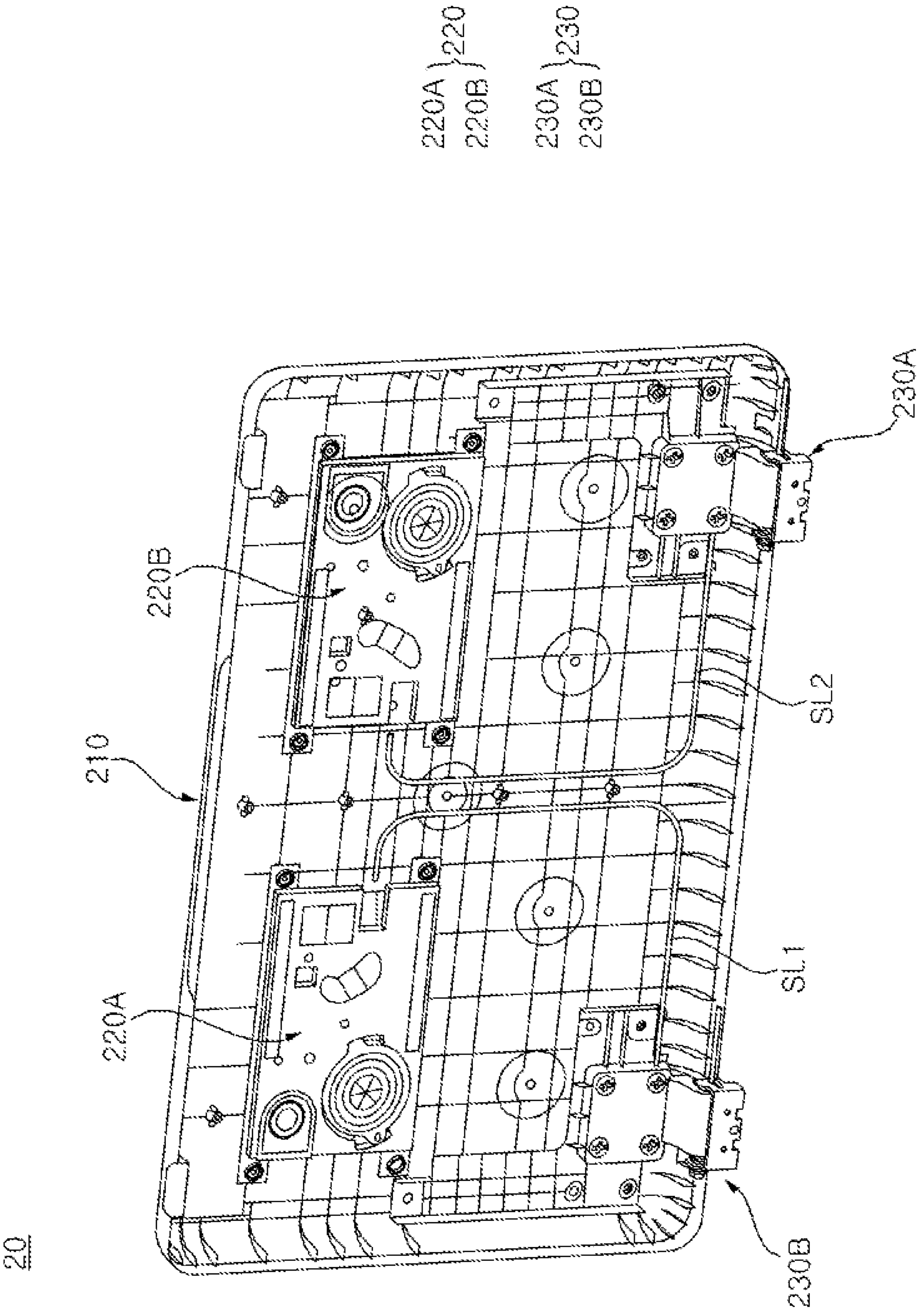

Referring to FIG. 32, the speaker assembly 220 may be fixed to the inside of the outer cover 210. A plurality of speaker assemblies 220 may be provided. The plurality of speaker assemblies 220 may include a first speaker assembly 220A and a second speaker assembly 220B. The first speaker assembly 220A may be a left-facing speaker, and the second speaker assembly 220B may be a right-facing speaker. The first speaker assembly 220A and the second speaker assembly 220B may provide stereo sound.

A speaker cable (SL1, SL2) may be provided in plurality. A first speaker cable SL1 may be connected to the first speaker assembly 220A. A second speaker cable SL2 may be connected to the second speaker assembly 220B. The speaker cable SL1, SL2 may provide power and audio signals to the speaker assembly 220. The speaker cable SL1, SL2 may be routed inside the outer case 210. The speaker cable SL1, SL2 may pass through the hinge assembly 230.

Figure 33:
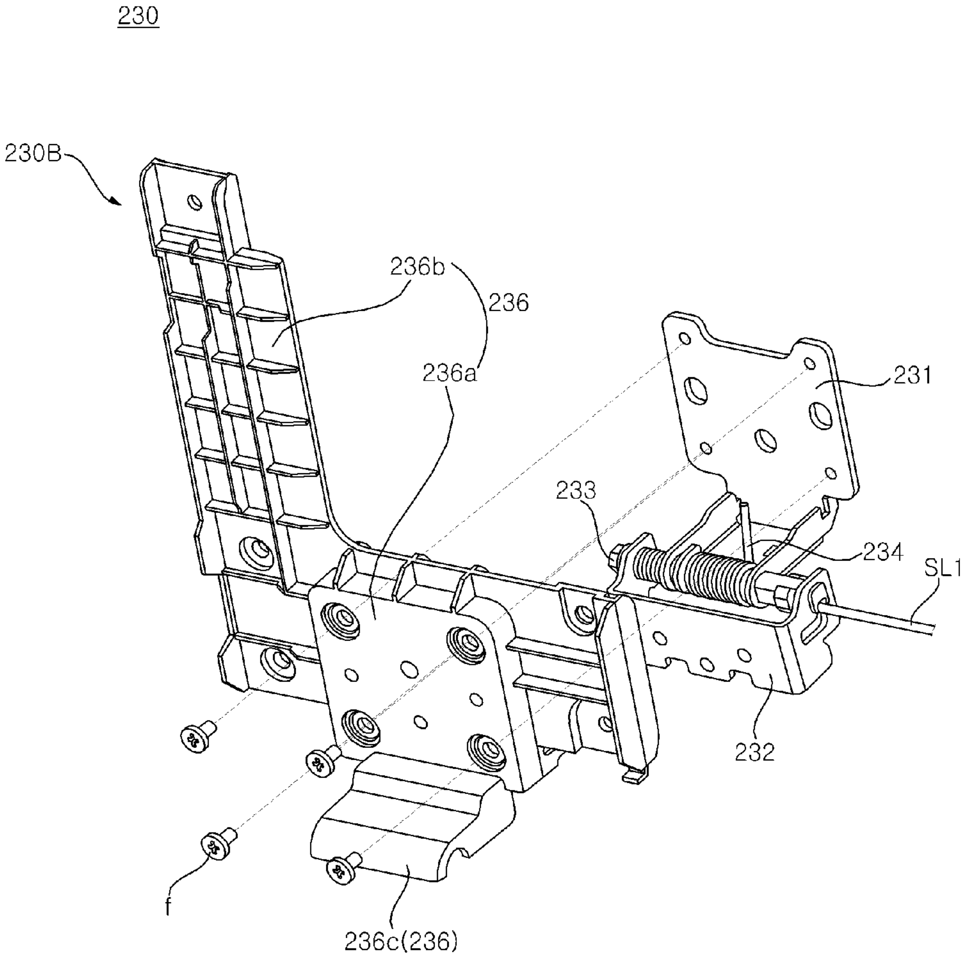
Figure 34:
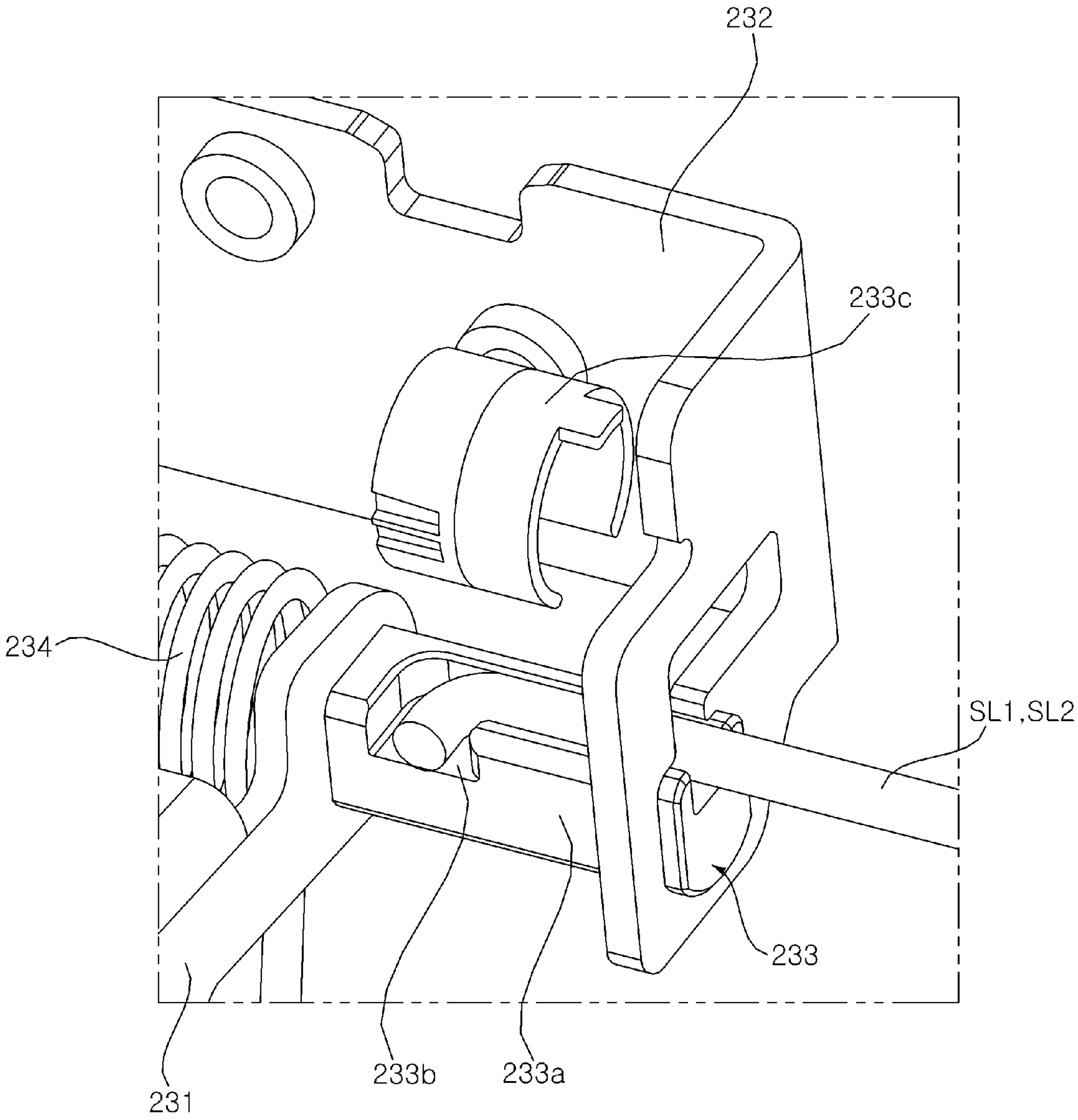

Referring to FIGS. 33 and 34, the hinge assembly 230 may include an upper bracket 231, a lower bracket 232, a hinge shaft 233, and a reinforcing member 236. The upper bracket 231 may have a curved plate shape. The upper bracket 231 and the lower bracket 232 may be connected by the hinge shaft 233. An elastic member 234 may be coupled to the hinge shaft 233. For example, the elastic member 234 may be a coil spring 234, and the hinge shaft 233 may be inserted into the coil spring 234. One end (or a first end) of the coil spring 234 may be supported by the lower bracket 232, and the other end (or a second end) of the coil spring 234 may be supported by the upper bracket 231.

The reinforcing member 236 may be referred to as a reinforcing bracket 236. The reinforcing member 236 may include a fixing part 236*a* and an extension part 236*b*. The fixing part 236*a* may be coupled or fixed to the upper bracket 231 by a fastening member f. The extension part 236*b* may extend from the fixing part 236*a*. The extension part 236*b* may have a generally L-shape. The extension part 236*b* may be fixed to the outer cover 210 (see FIG. 32). The reinforcing member 236 may further include a cover part 236*c*. The cover part 236*c* may extend from the fixing part 236*a*. The cover part 236*c* may cover the hinge shaft 233.

The hinge shaft 233 may include a shaft body 233*a*, a receiving groove 233*b*, and a cap 233*c*. The shaft body 233*a* may hingedly connect the upper bracket 231 to the lower bracket 232. The receiving groove 233*b* may be recessed inward from an outer surface of the shaft body 233*a* in an elongated manner. One end (or a first end) of the receiving groove 233*b* may be formed on a distal end of the shaft body 233*a*, and the other end (or a second end) of the receiving groove 233*b* may be formed on a side surface of the shaft body 233*a*. The receiving groove 233*b* may have a generally L-shape.

The speaker cable SL1, L2 may be routed in the receiving groove 233*b*. The speaker cable SL1, SL2 may be inserted into the one end of the receiving groove 233*b* so as to be routed to the other end of the receiving groove 233*b*. The cap 233*c* may be coupled to the shaft body 233*a* while covering the receiving groove 233*b*. The cap 233*c* may secure the speaker cable SL1, SL2 placed in the receiving groove 233*b*.

Figure 35:
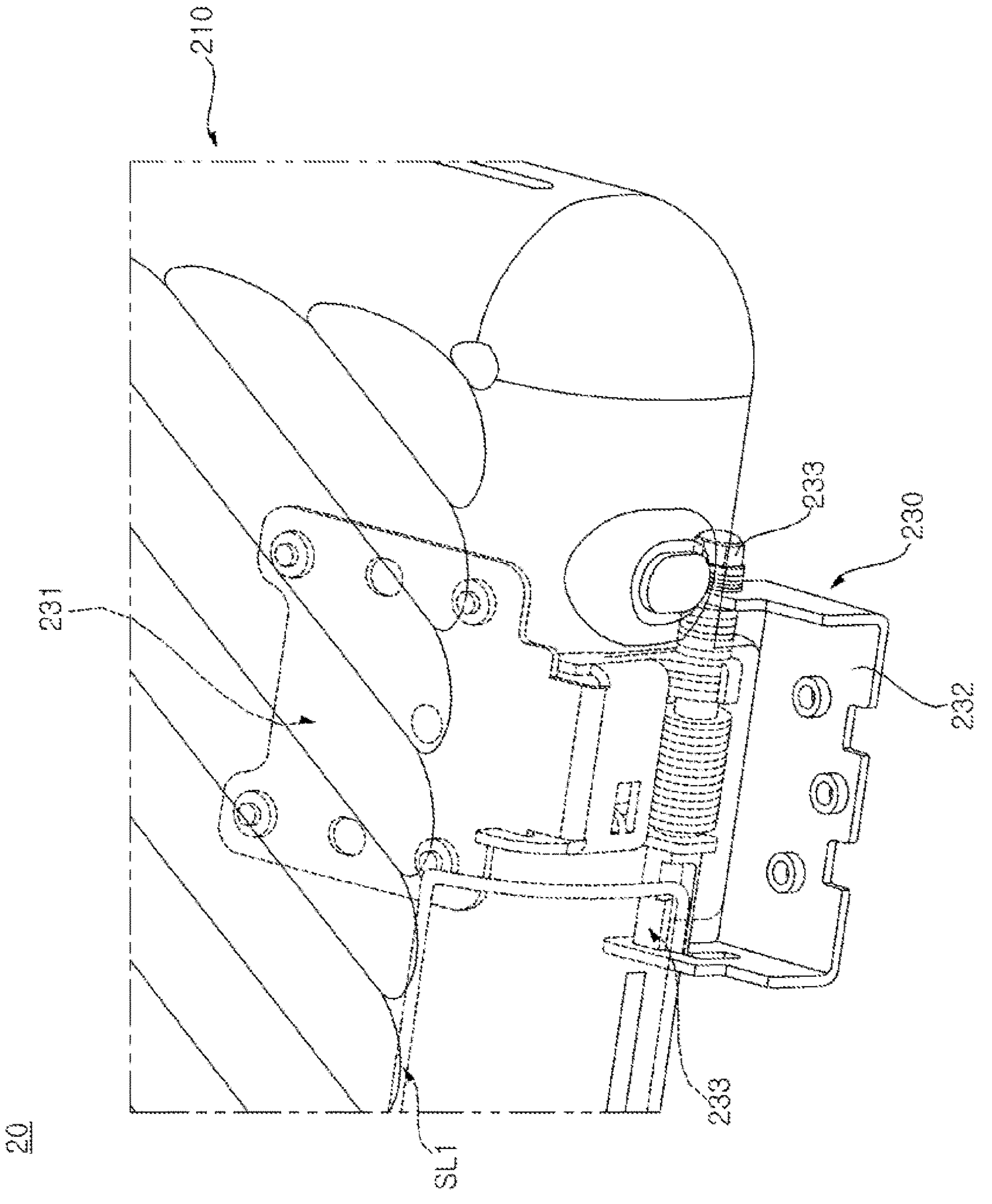
Figure 36:
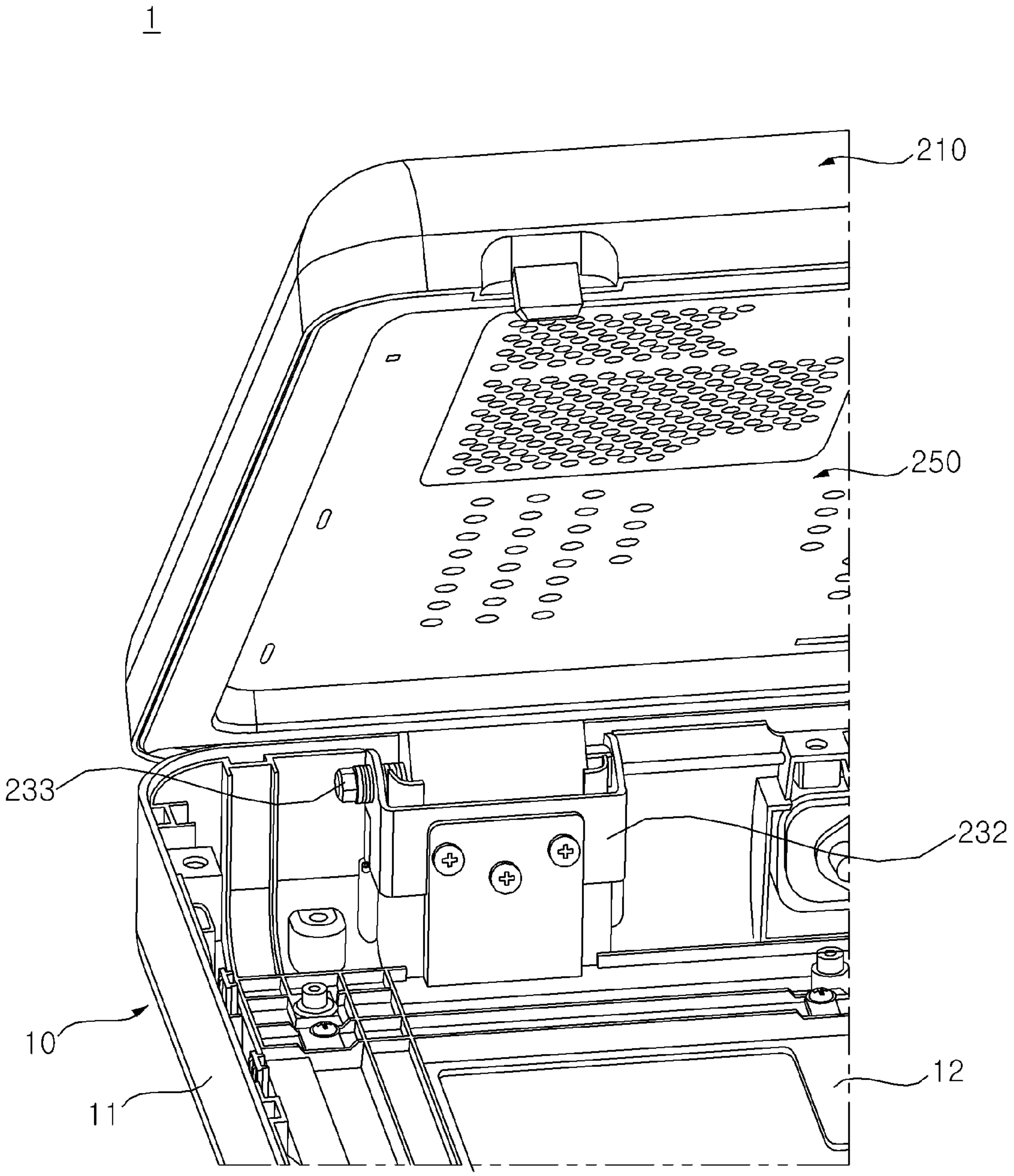

Referring to FIGS. 35 and 36, the upper bracket 231 may be fixed to an inner surface of the outer cover 210. The lower bracket 232 may be fixed to the frame 12 of the base 10.

The speaker cable SL1, SL2 (see FIG. 32) may be routed to be placed in the hinge shaft 233 of the hinge assembly 230 inside the outer cover 210. The speaker cable SL1, SL2 may be routed to the base 10 through the hinge shaft 233.

Figure 37:
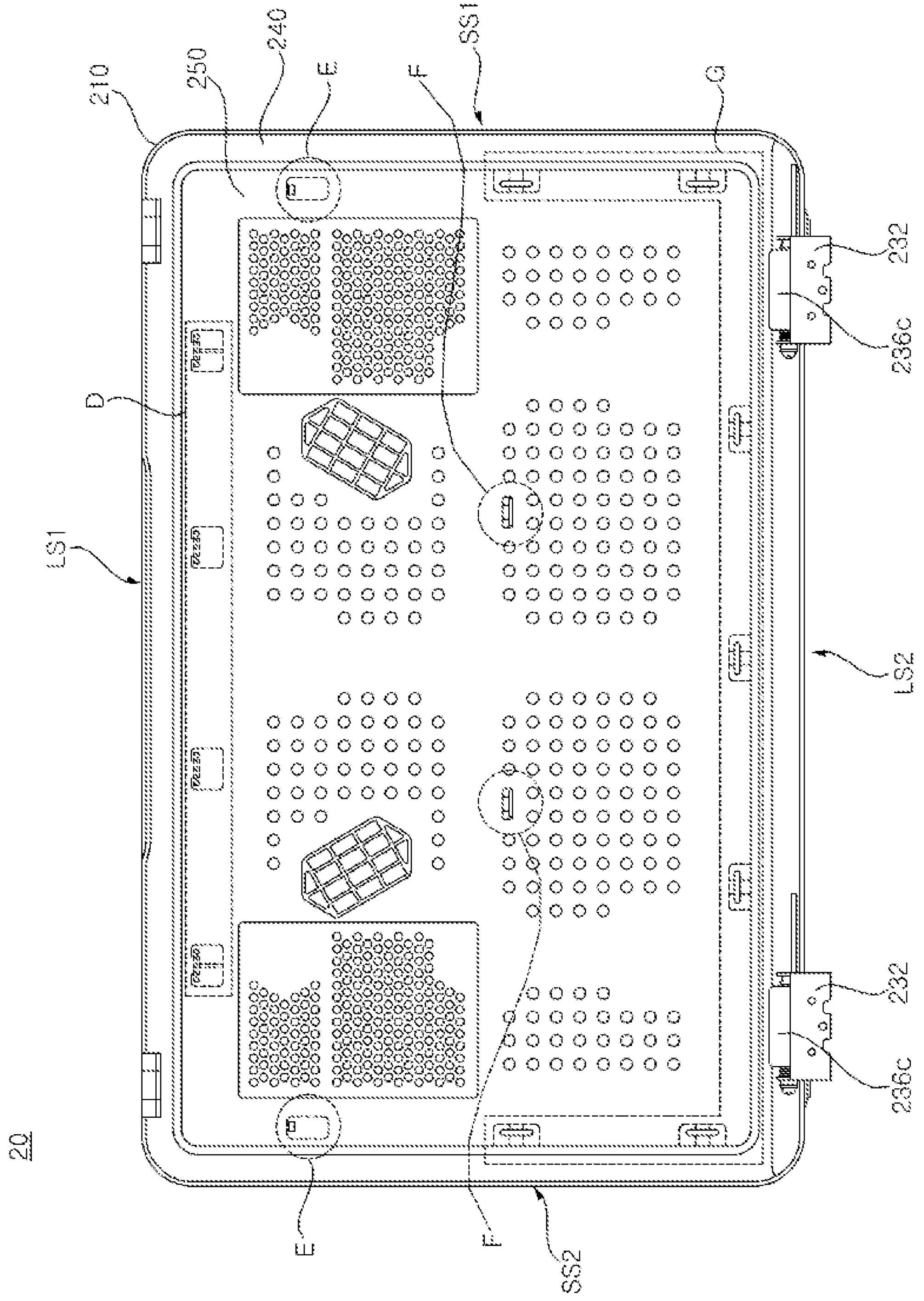

Referring to FIG. 37, the inner cover 250 may be coupled to the middle frame 240. The inner cover 250 may be detachably coupled or fixed to the middle frame 240. The inner cover 250 may be coupled to the middle frame 240 by a coupling set (D, E, F, G). A plurality of coupling sets D, E, F, and G may be provided.

A first coupling set D may be disposed along a first long side LS1 of the cover 20 while being adjacent to the first long side LS1. A second coupling set E may be disposed adjacent to a first short side SS1 and/or a second short side SS2 of the cover 20. For example, the second coupling set E may be positioned closer to the first long side LS1 than a second long side LS2 of the cover 20.

A third coupling set F may be disposed in a central region between the first long side LS1 and the second long side LS2 and/or between the first short side SS1 and the second short side SS2. A fourth coupling set G may be adjacent to the second long side LS2, and may be disposed along the second long side LS2. The fourth coupling set G may be disposed along the first short side SS1 and/or the second short side SS2.

Figure 38:
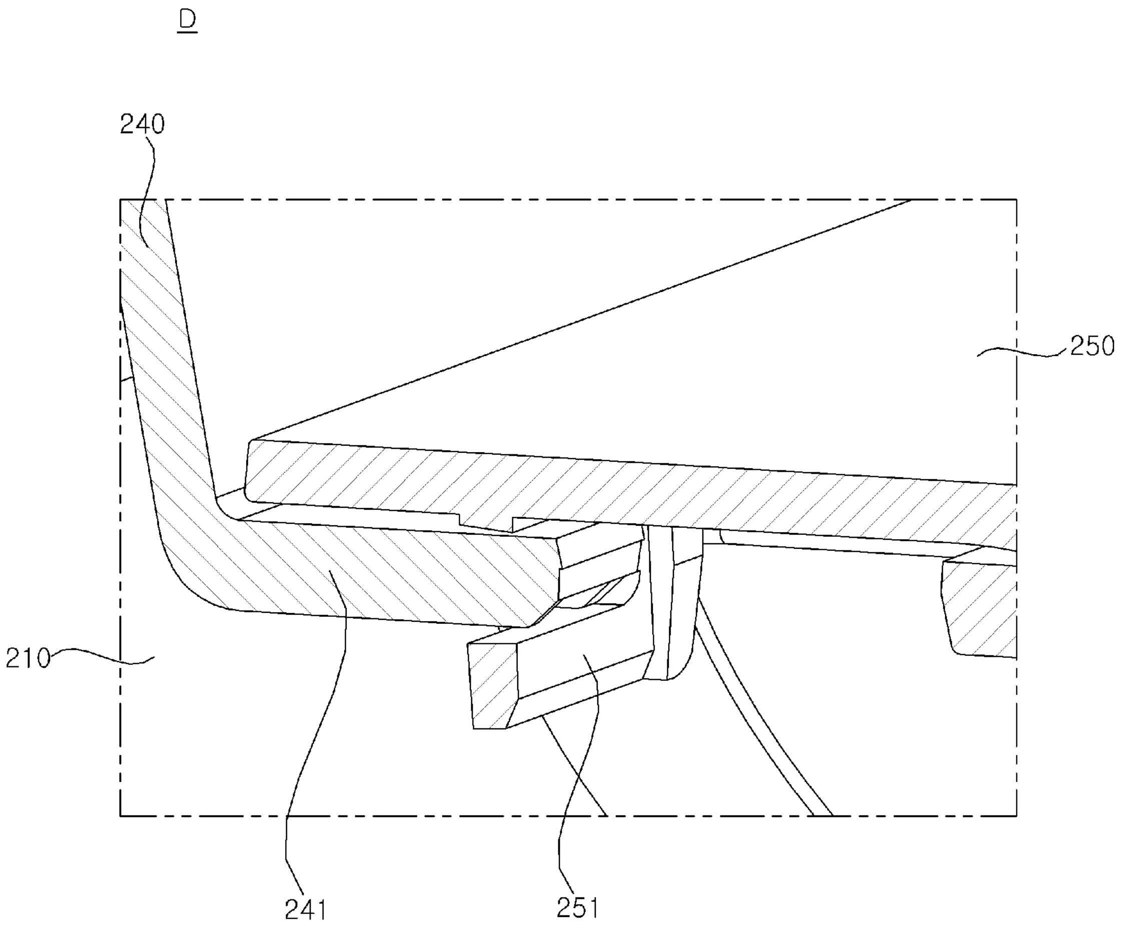

Referring to FIG. 38, the first coupling set D may include an insert tip 241 and a hold hole 251. The middle frame 240 may include the insert tip 241. The insert tip 241 may protrude and extend from the middle frame 240. The hold hole 251 may be formed on a lower surface of the inner cover 250. The hold hole 251 may have an elongated hole. The insert tip 241 may be inserted into the hold hole 251. The insert tip 241 may prevent the inner cover 250 from moving away from or being separated from the middle frame 240 when pulling the hold hole 251.

Figure 39:
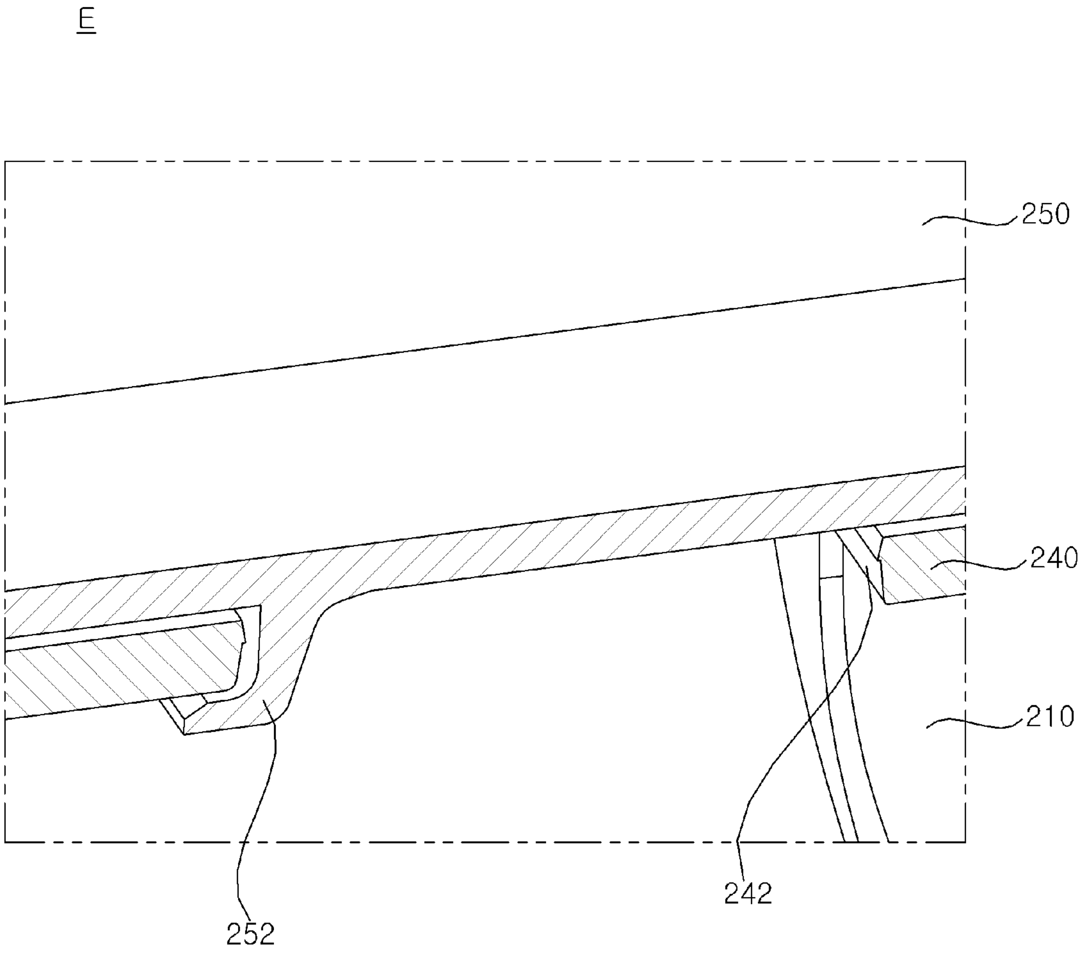

Referring to FIG. 39, the second coupling set E may include an insert hole 242 and a holder 252. The insert hole 242 may be formed in the middle frame 240. The holder 252 may protrude from an inner surface of the inner cover 250 and may then be bent. For example, the holder 252 may have a hook shape. The holder 252 may be inserted into the insert hole 242, and may hold one side of the insert hole 242. The holder 252 may prevent the inner cover 250 from moving away form or being separated from the middle frame 240 when pulling the insert hole 242.

Figure 40:
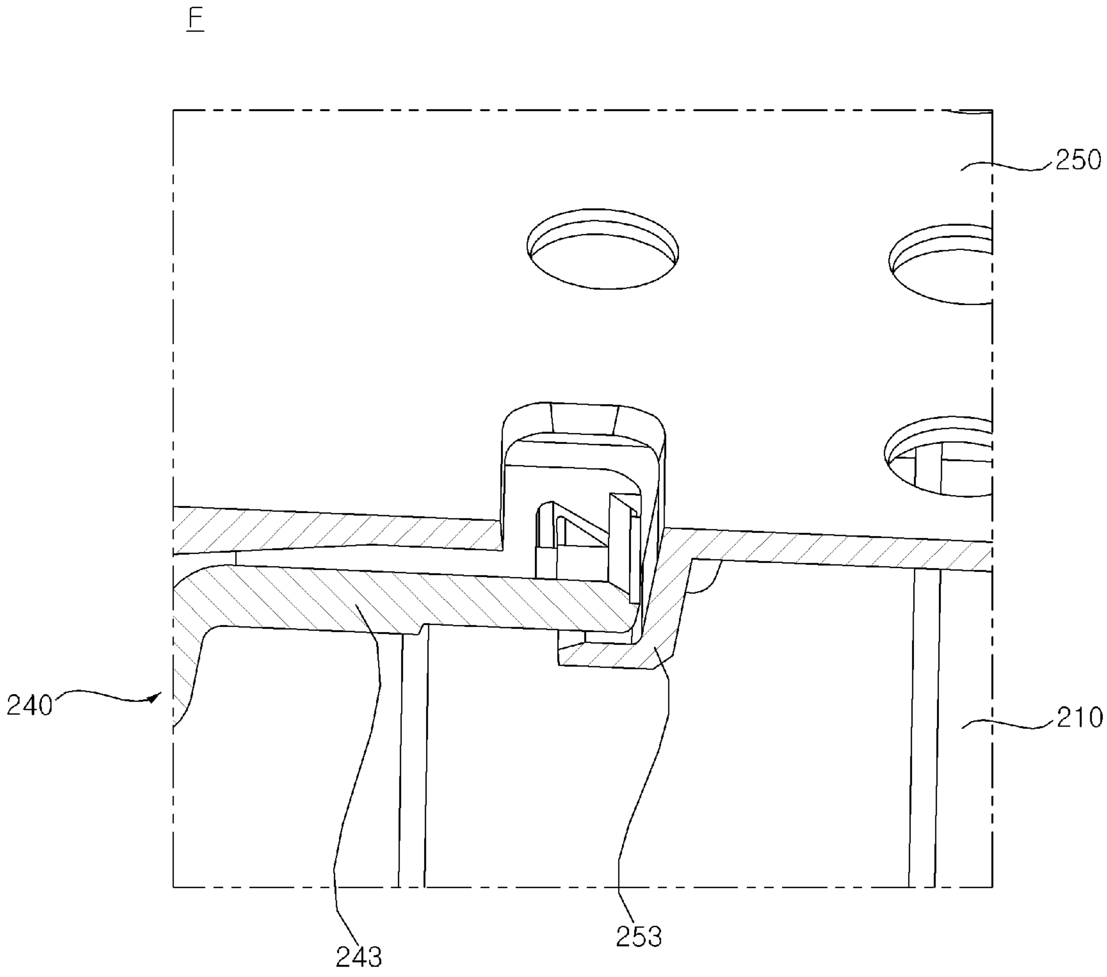

Referring to FIG. 40, the third coupling set F may include a holding tip 243 and a holding lever 253. The middle frame 240 may include the holding tip 243. The holding tip 243 may extend long from the middle frame 240. The inner cover 250 may include the holding lever 253. The holding lever 253 may protrude from an inner surface of the inner cover 250 and may then be bent. The holding tip 243 may be placed on the holding lever 253. The holding tip 243 may prevent the inner cover 250 from moving away from or being separated from the middle frame 240 when pulling the holding lever 253.

Figure 41:
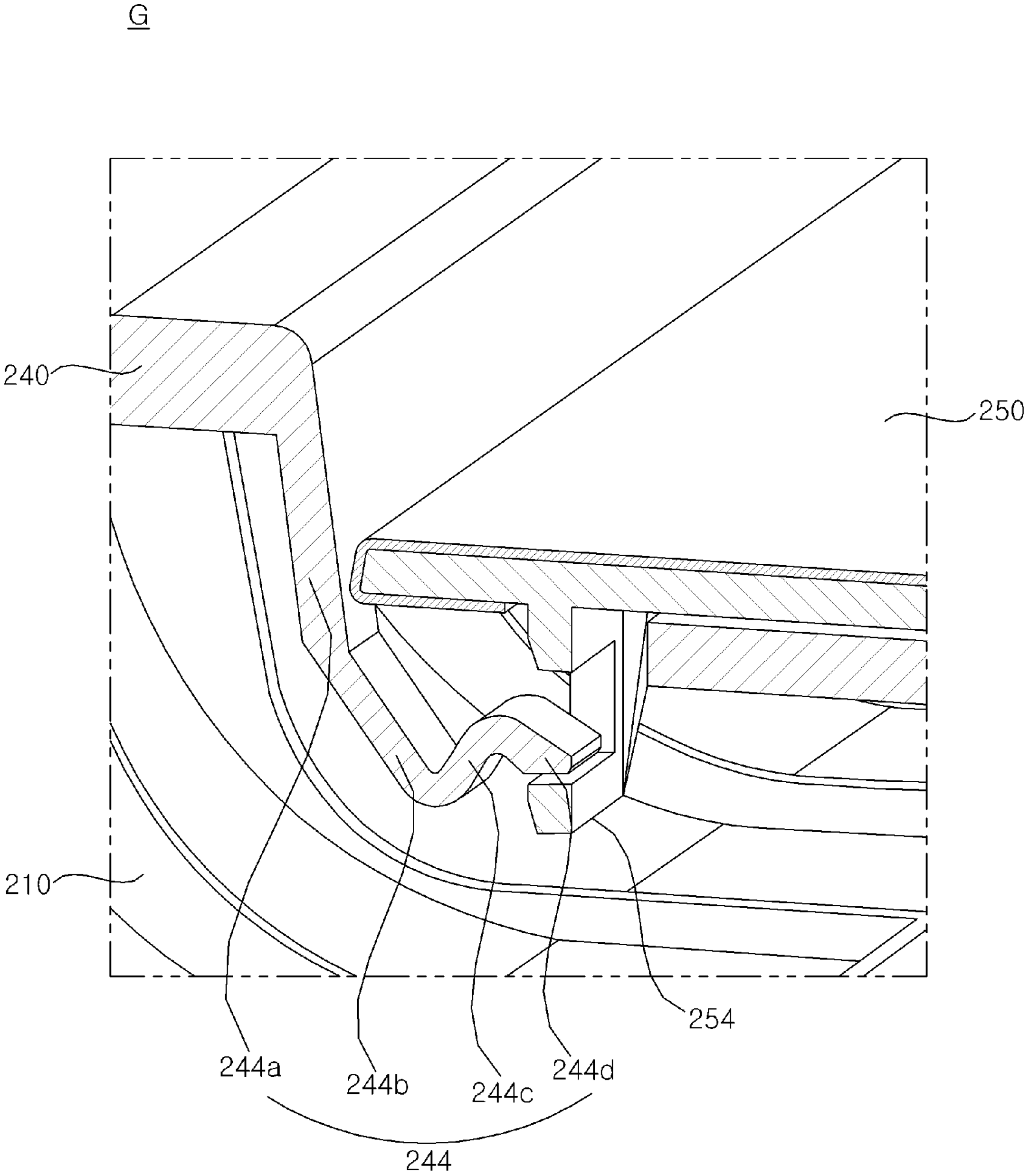

Referring to FIG. 41, the fourth coupling set G may include a moving lever 244 and a lever hole 254. The inner cover 250 may include the lever hole 254, and the moving lever 244 may extend from the middle frame 240. The lever hole 254 may protrude from an inner surface of the inner cover 250. The moving lever 244 may be inserted into the lever hole 254 of the inner cover 240. The moving lever 244 may include a first part 244*a*, a second part 244*b*, a third part 244*c*, and a fourth part 244*d*. The first part 244*a* may protrude and extend from the middle frame 240. The second part 244*b* may be bent and extend from the first part 244*a* to form a first angle. For example, the first angle may be an obtuse angle. The third part 244*c* may be bent and extend from the second part 244*b* to form a second angle. For example, the second angle may be an acute angle. The fourth part 244*d* may be bent and extend from the third part 244*c* to form a third angle. For example, the third angle may be greater than the second angle and less than the first angle. The fourth part 244*d* may be engaged into the lever hole 254. A user may insert a tool between the inner cover 250 and the middle frame 240 to push the first part 244*a* and/or the second part 244*b*, thereby removing the moving lever 244 from the lever hole 254.

Figure 42:
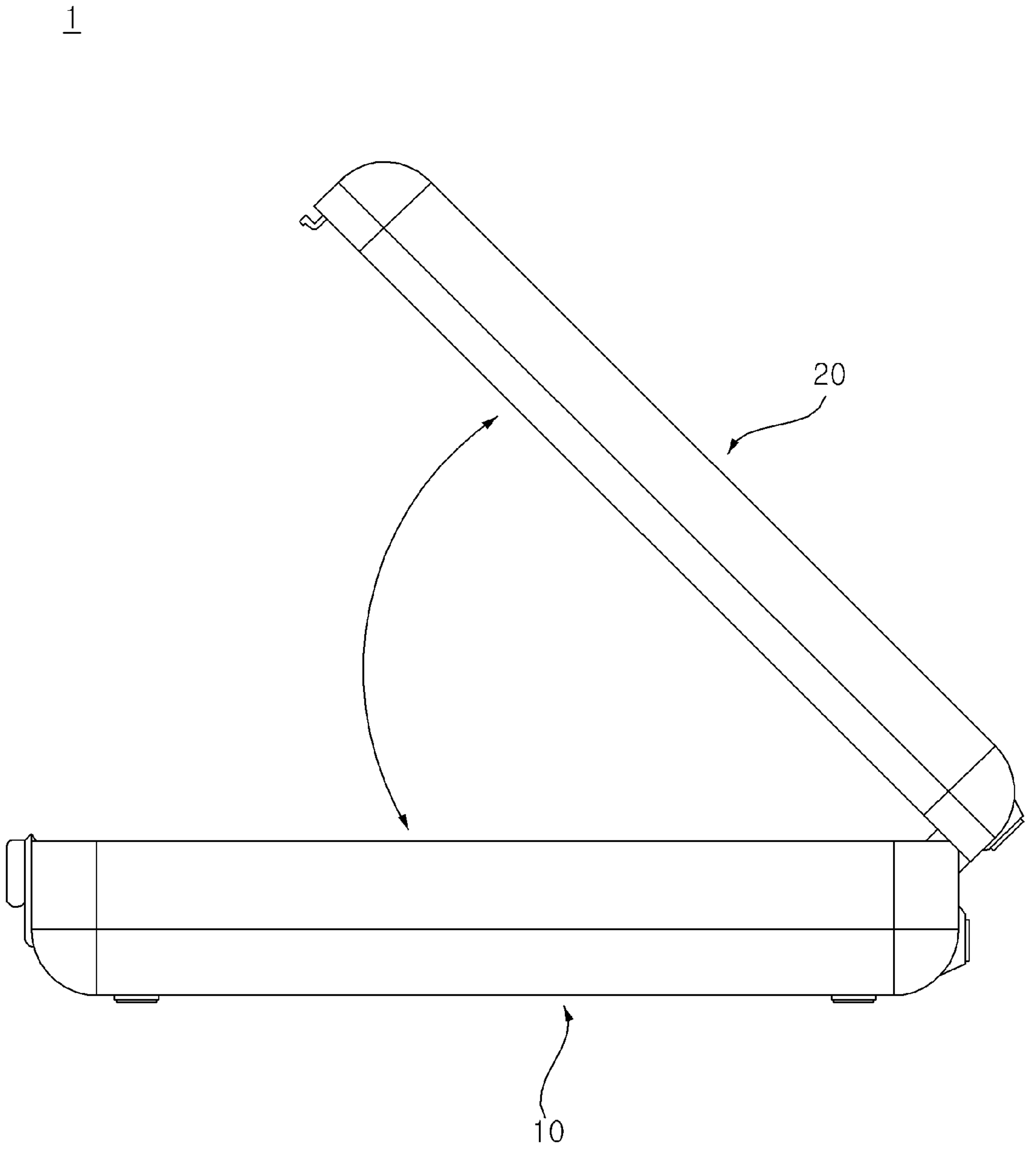
Figure 43:
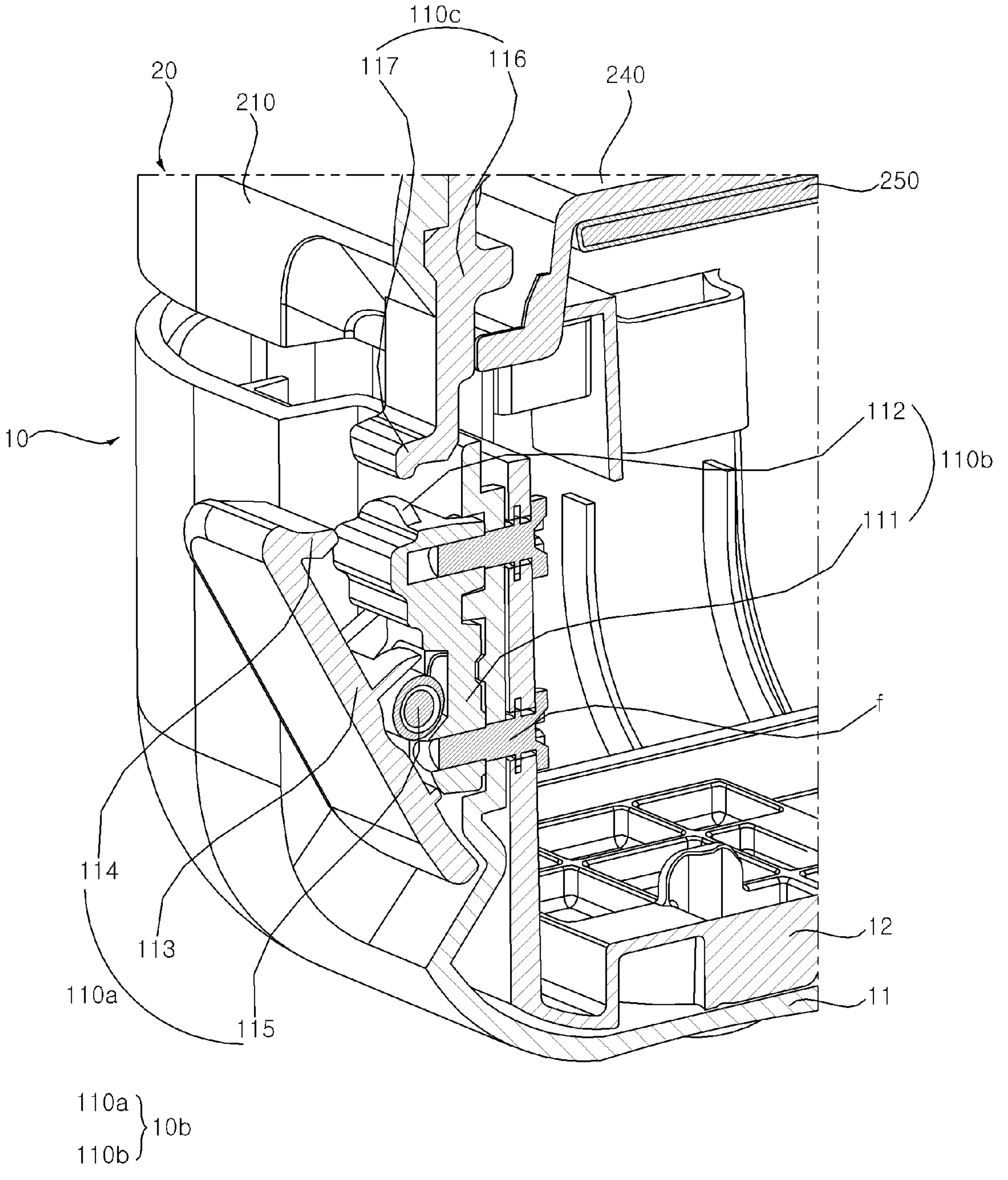
Figure 44:
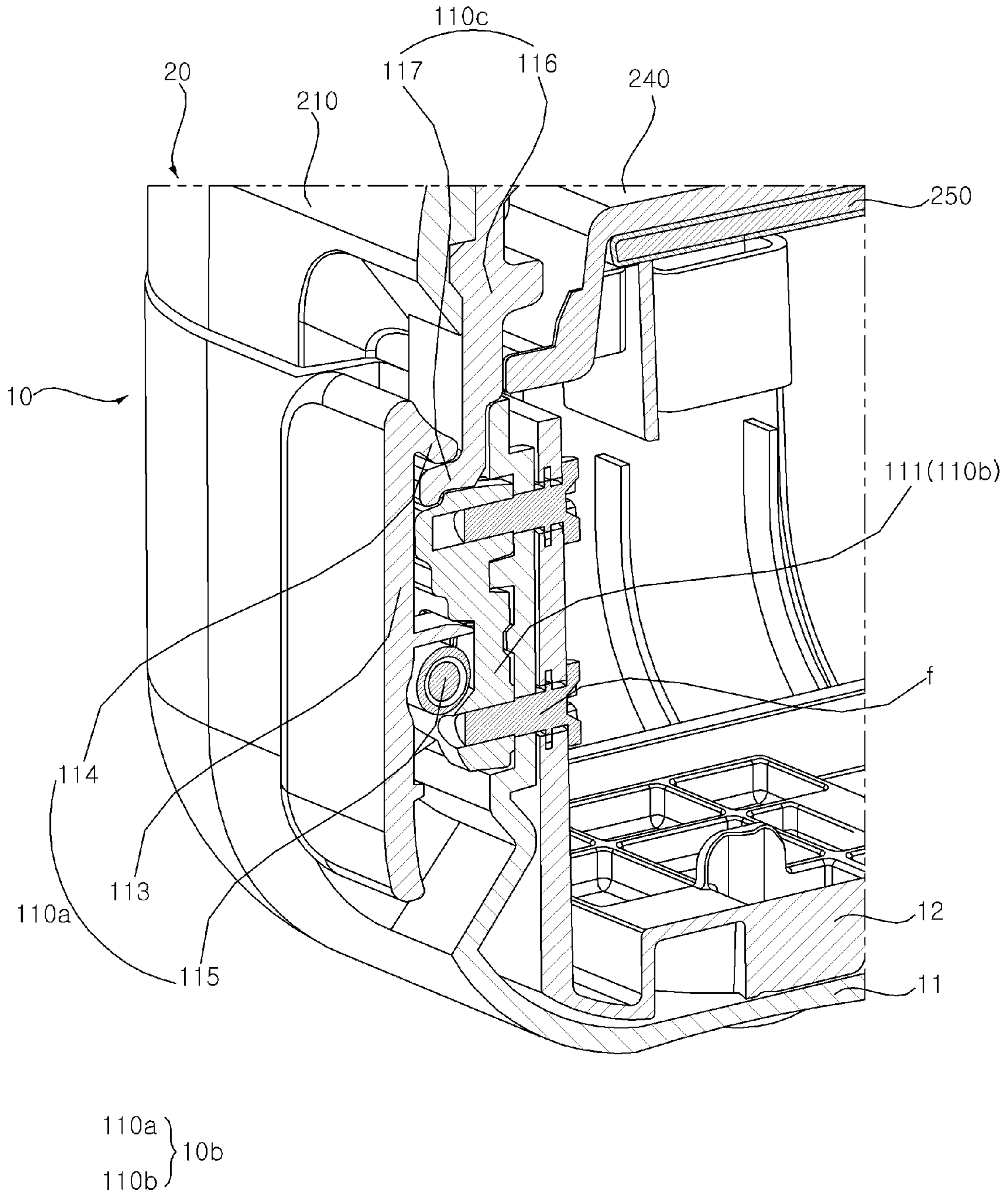

Referring to FIGS. 42 to 44, the locking unit 10*a*, 10*b* may include a lower body 110*b*, an upper body 110*c*, and a lock lever 110*a*. The lower body 110*b* may be coupled to an outer surface of the bottom 11 of the base 10. The lower body 110*b* may be coupled or fixed to the frame 12 by a fastening member f. The upper body 110*c* may be positioned between the outer cover 210 and the middle frame 240 of the cover 20, and may be coupled or fixed to the outer cover 210. The upper body 110*c* may extend long from the cover 20 toward the base 10.

The lower body 110*b* may include a fixing portion 111 that is in contact with the outer surface of the bottom 11 of the base 10 and is fixed to the frame 12, and a lower rib 112 that protrudes from a top surface of the fixing portion 111 and faces the upper body 110*c*.

The upper body 110*c* may include a fixing portion 118 that is fixed to the outer cover 210 of the cover 20, and an upper hook 117 that extends long from the fixing portion 118 to be bent toward the lock lever 110*a* and is engaged with the lower rib 112.

The lock lever 110*a* may include a lever body 113, a locking hook 114, and a pivot shaft 115. The lever body 113 may be elongated, and may be configured to seesaw, pivot, or tilt with respect to the lower body 110*b*. The pivot shaft 115 may connect the lever body 113 of the lock lever 110*a* to the lower body 110*b*. The lock lever 110*a* may perform a pivoting, tilting, or seesaw movement about the pivot shaft 115 with respect to the lower body 110*b*. The locking hook 114 may be formed at an upper end of the lever body 113, and may be bent from the lever body 113 toward the lower body 110*b* and/or the upper body 110*c*.

When the cover 20 is closed while covering the base 10, the upper hook 117 of the upper body 110*c* may be brought into contact with or be engaged with the lower rib 112 of the lower body 110*b*. As the lock lever 110*a* rotates about the pivot shaft 115, the locking hook 114 may be caught on the upper hook 117 of the upper body 110*c*. Accordingly, the cover 20 may be fixed to the base 10.

Figure 45:
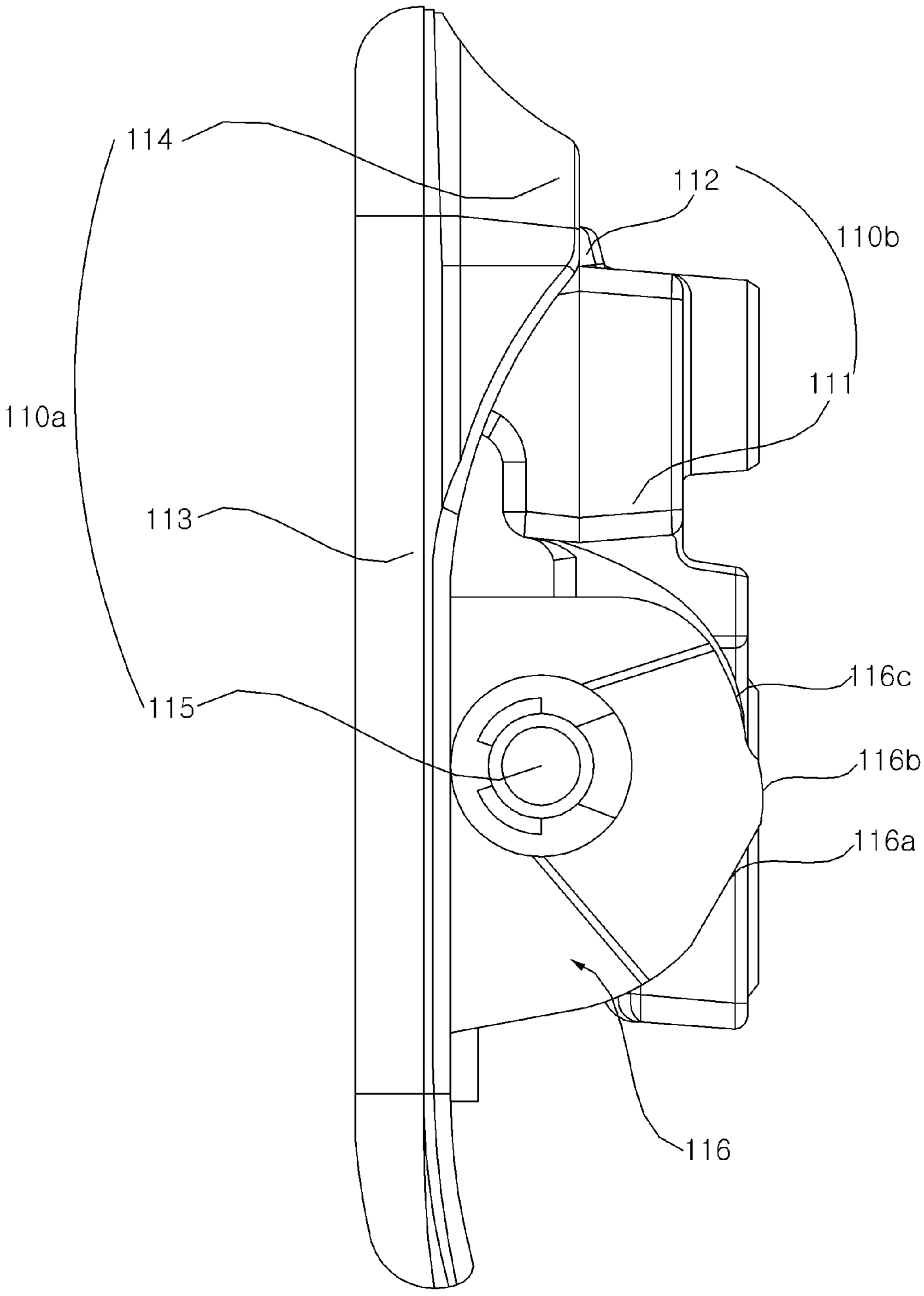
Figure 46:
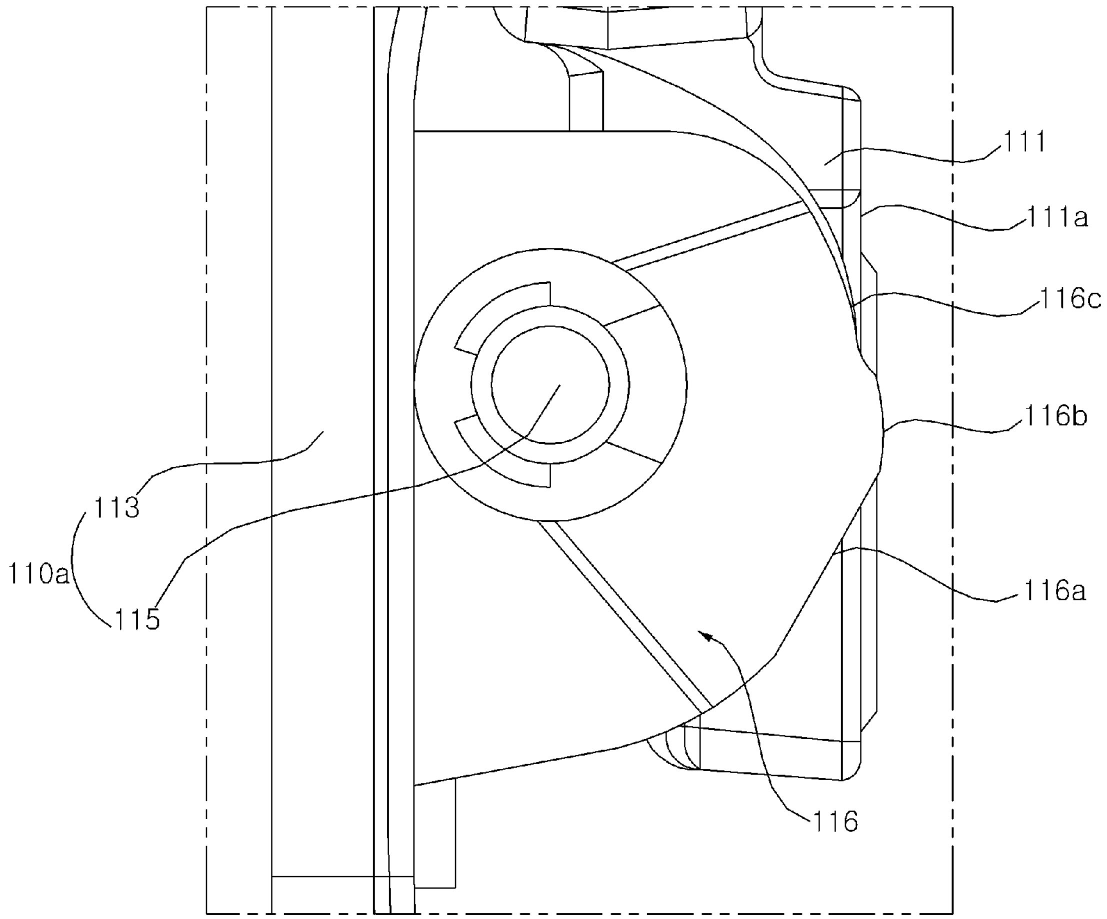

Referring to FIGS. 45 and 46, the lock lever 110*a* may include a cam 116. The cam 116 may be provided on the lever body 113 around the pivot shaft 115. The cam 116 may include a first part 116*a*, a second part 116*b*, and a third part 116*c*. The first part 116*a* may define a linear surface. The second part 116*b* may extend from the first part 116*a* and may define a curved surface. The third part 116*c* may extend from the second part 116*b* and may define a curved surface that forms an inflection point with the second part 116*b*. The second part 116*b* may protrude outward relative to the first part 116*a* and/or the third part 116*c*.

The fixing portion 111 of the lower body 110*b* may define a linear surface 111*a*. As the lever body 113 rotates, the cam 116 may protrude to an outside of the linear surface 111*a* of the lower body 110*b*. When the lever body 113 rotates counterclockwise with respect to the pivot shaft 115, the first part 116*a* of the cam 116 may be aligned with the linear surface 111*a* of the fixing portion 111 of the lower body 110*b*. When the lever body 113 rotates clockwise with respect to the pivot shaft 115, the second part 116*b* of the cam 116 may protrude outward relative to the linear surface 111*a* of the fixing portion 111 of the lower body 110*b*. The second part 116*b* of the cam 116 may be in close contact with an outer surface of the bottom 11 of the base 10 (see FIG. 44). Accordingly, in a state where the upper body 110*c* and the lower body 110*b* are engaged with each other, the lock lever 110*a* may be fixed without rotating, pivoting, or tilting with respect to the lower body 110*b*.

Figure 47:
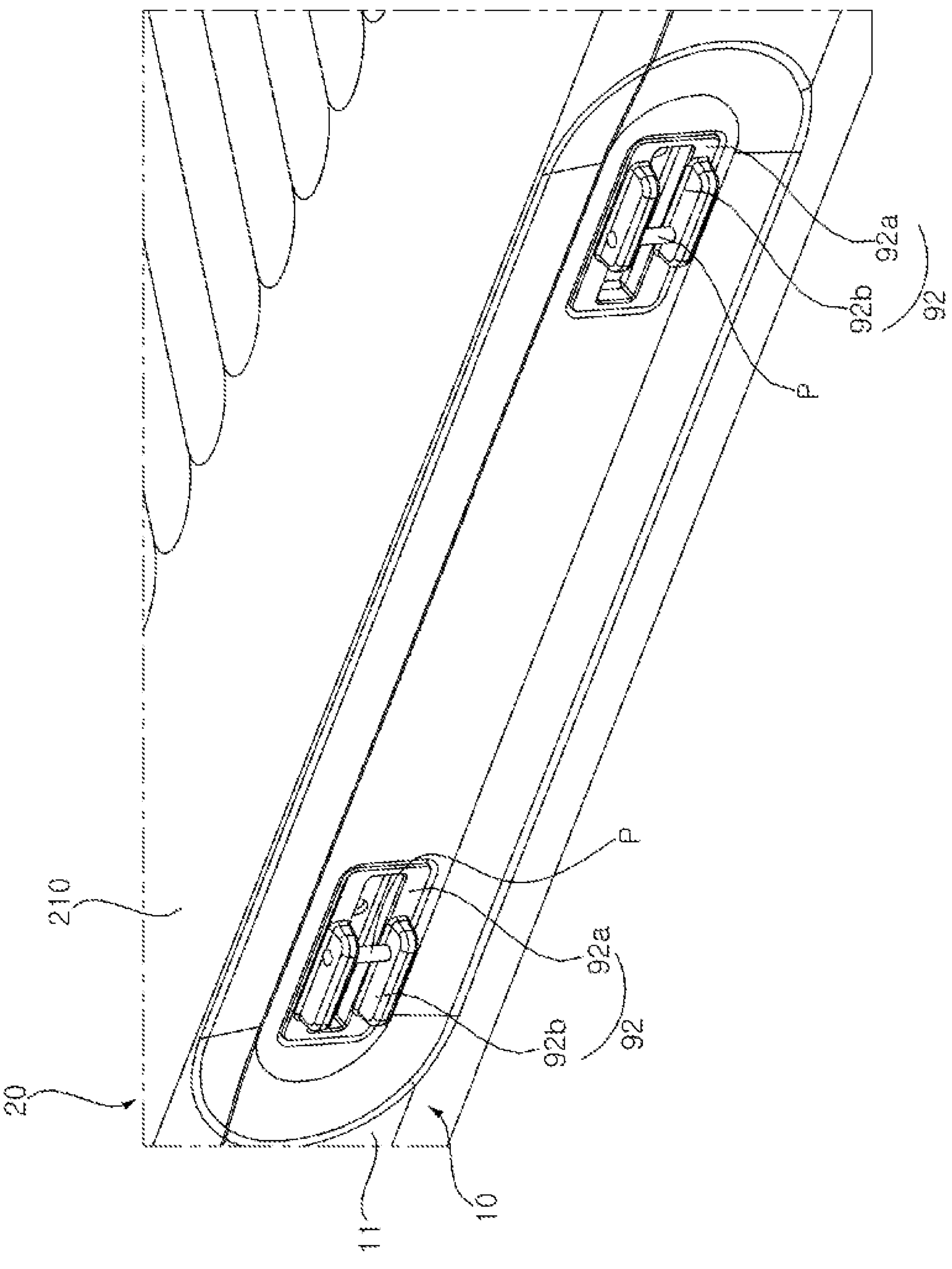
Figure 48:
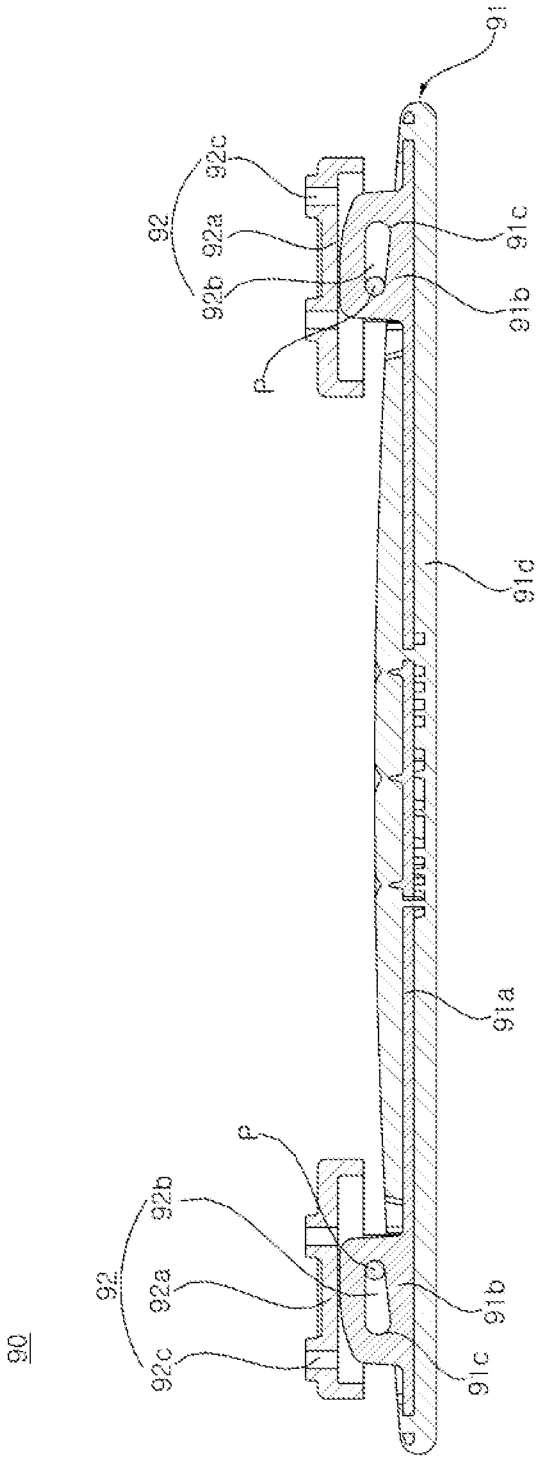
Figure 49:
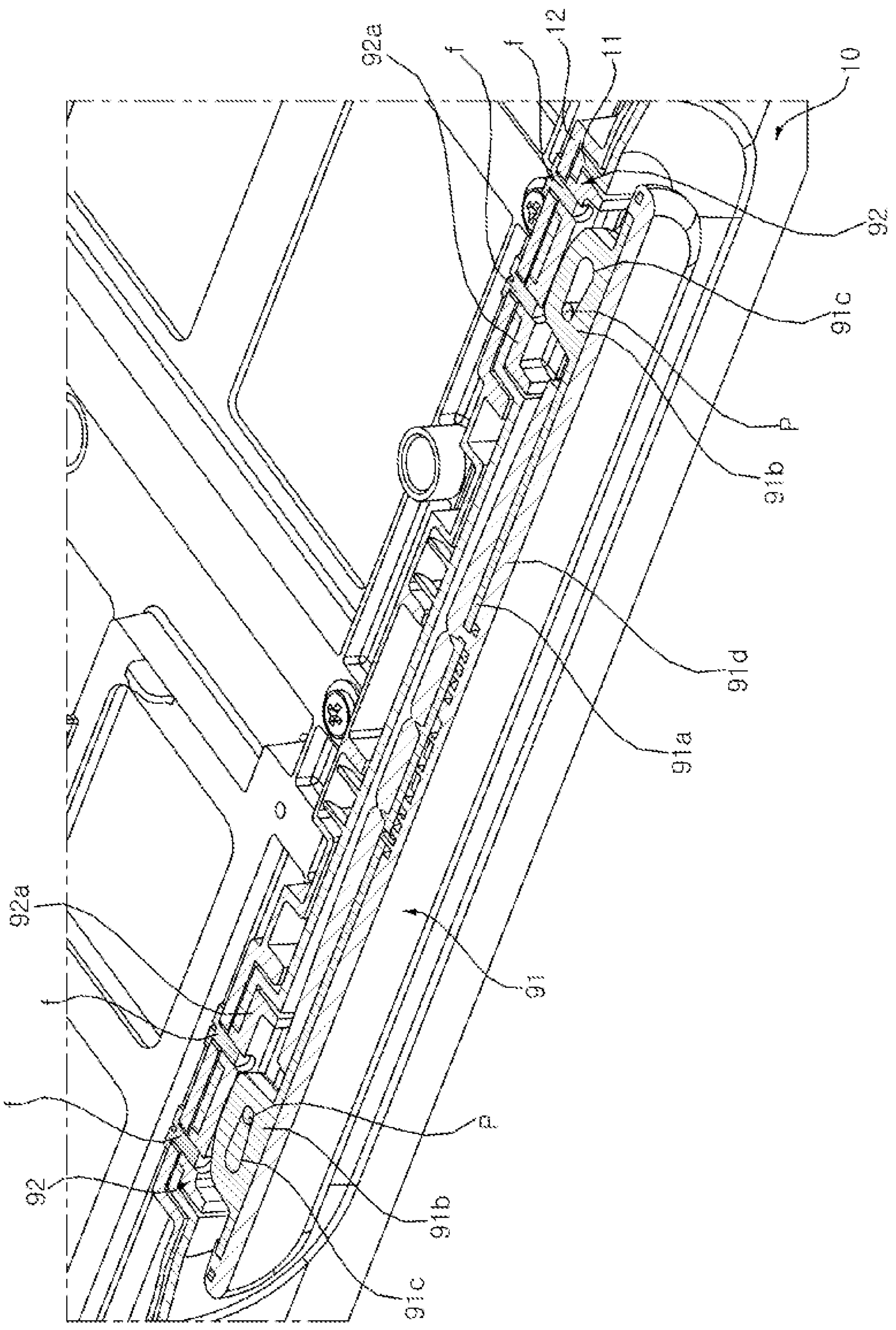

Referring to FIGS. 47 to 49, a handle unit 90 may be mounted to the base 10 or the cover 20. The handle unit 90 may be referred to as a handle assembly 90 or a handle set 90. The handle unit 90 may include a fixing segment 92 and a handle 91.

The fixing segment 92 may include a mount body 92*a*, a pin mount 92*b*, and a pin P. The mount body 92*a* may be positioned on an outer surface of the bottom 11 of the base 10, and may be fixed to the frame 12 by a fastening member f. A plurality of pin mounts 92*b* may protrude outward of the mount body 92*a* in parallel manner. The pin P may be positioned by passing through the pair of pin mounts 92*b*.

The handle 91 may include a core (91*a*, 91*b*, 91*c*) and a skin 91*d*. The core (91*a*, 91*b*, 91*c*) may include a strap 91*a*, a strap end 91*b*, and a pin hole 91*c*. The strap 91*a* may be elongated and may consist of a plurality of parts. The plurality of parts may be isolated from each other. A plurality of strap ends 91*b* may be provided, and the plurality of strap ends 91*b* may be formed at opposite ends of the strap 91*a*. The strap end 91*b* may protrude from the strap 91*a* toward the fixing segment 92. The pin hole 91*c* may be formed through the strap end 91*b*. The pin hole 91*c* may be elongated. The skin 91*d* may cover an outer surface of the core (91*a*, 91*b*, 91*c*). For example, the core (91*a*, 91*b*, 91*c*) and the skin 91*d* may be integrally formed by heterogeneous injection molding. For example, the core (91*a*, 91*b*, 91*c*) may have a higher tensile strength than the skin 91*d*. The handle 91 may be coupled to the fixing segment 92. The pin P of the fixing segment 92 may be inserted into the pin hole 91*c* of the handle 91.

Referring to FIGS. 1 to 49, there is provided a display device including: a display module including a display panel; a bottom case to which the display module is movably mounted; and a top case hinge-connected to the bottom case.

The display module may further include: a panel frame disposed at a rear of the display panel and to which the display panel is coupled; a control board mounted on a rear surface of the panel frame; a back cover that is disposed at a rear of the panel frame and covers the control board; and a first shield member disposed between the back cover and the control board, the first shield member overlapping at least a portion of the control board.

The control board may be a drive board of a light source that provides light to the display panel.

The bottom case may include: an outer shell that defines an accommodation space; a bottom frame that is disposed in the accommodation space of the outer shell and coupled to the outer shell; a top plate that covers the accommodation space and is disposed opposite the outer shell with respect to the bottom frame; a power supply unit that is disposed between the bottom frame and the top plate, the power supply unit being coupled to the bottom frame; a main board that is disposed between the bottom frame and the top plate, the main board being adjacent to the power supply unit and coupled to the bottom frame; and a second shield member that is disposed between the top plate and the main board, the second shield member overlapping at least a portion of the main board.

The second shield member may be formed of a graphite sheet that covers at least a portion of the main board, and may be inclined with respect to a plane of the outer shell.

The power supply unit may not overlap the control board and the first shield member of the display module.

The first shield member may not overlap the second shield member that covers the main board.

The first shield member may be formed of a graphite sheet.

The display device may further include an arm having a first side that is pivotally connected to the bottom case and a second side that is pivotally connected to the display module. The display module may be configured to be stored in the bottom case or stand upright from the bottom case when the arm performs a pivoting movement.

The bottom case may include: an outer shell that defines an accommodation space; a bottom frame that is disposed in the accommodation space and coupled to the outer shell; and a top plate that is disposed opposite the outer shell with respect to the bottom frame, the top plate covering the accommodation space of the outer shell. The display module may be configured to: be stored while facing the top plate between the top plate and the top case in response to the bottom case being closed by the top case; and stand upright from the top plate while facing the top case in response to the bottom case being opened by the top case.

The bottom case may include: a lower body that is disposed at an outside of the outer shell and coupled to at least one of the outer shell or the bottom frame; an upper body that is coupled to the top case and faces the lower body; and a lock lever pivotally connected to the lower body, the lock lever being configured to be engaged with the upper body in response to the upper body contacting the lower body.

The lower body may include: a fixing portion that is in contact with an outer surface of the outer shell and fixed to the bottom frame; and a lower rib that protrudes from a top surface of the fixing portion of the lower body and faces the upper body. The upper body may include: a fixing portion fixed to the top case; and an upper hook that extends long from the fixing portion of the upper body, the upper hook being bent and configured to come into contact with the lower rib. The lock lever may include: a pivot shaft that is movably coupled to the fixing portion of the lower body; a lever body that is connected to the pivot shaft, the lever body being elongated to seesaw about the pivot shaft; and a locking hook that is provided at one end of the lever body, the locking hook being configured to be engaged with the upper hook of the upper body.

The lock lever may further include a cam that is provided on a periphery of the pivot shaft inside the lever body and configured to rotate with respect to the pivot shaft. The cam may include: a first part that defines a linear surface; a second part that extends from the first part and defines a curved surface; a third part that extends from the second part, the third part defining a curved surface that forms an inflection point with the curved surface of the second part.

The bottom case may include: a pair of fixing segments fixed to at least one of the outer shell or the bottom frame; and a handle that is elongated such that opposite sides thereof are coupled to the pair of fixing segments.

The handle may include: a core coupled to the pair of fixing segments; and a skin to cover the core. The core may have a higher tensile strength than the skin.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

The above detailed description is to be construed in all aspects as illustrative and not restrictive. The scope of the disclosure should be determined by reasonable interpretation of the appended claims, and all changes coming within the equivalency range of the disclosure are intended to be embraced in the scope of the disclosure.

What is claimed is:

1. A display device comprising:

a display module comprising a display panel;

a bottom case to which the display module is movably mounted; and a top case hinge-connected to the bottom case, wherein the bottom case comprises:

an outer shell providing an accommodation space;

a bottom frame in the accommodation space, the bottom frame coupled to the outer shell; and a top plate disposed opposite the outer shell with respect to the bottom frame, the top plate covering the accommodation space of the outer shell, and wherein the display module is configured to:

be stored while facing the top plate between the top plate and the top case in response to the bottom case being closed by the top case; and stand upright from the top plate while facing the top case in response to the bottom case being opened by the top case, wherein the display device further comprises:

a lower body disposed at an outside of the outer shell, the lower body being coupled to at least one of the outer shell or the bottom frame;

an upper body coupled to the top case, the upper body facing the lower body; and a lock lever pivotally connected to the lower body, the lock lever being configured to be engaged with the upper body in response to the upper body contacting the lower body, wherein the lower body comprises:

a fixing portion in contact with an outer surface of the outer shell, the fixing portion being fixed to the bottom frame; and a lower rib protruding from a top surface of the fixing portion of the lower body and facing the upper body, wherein the upper body comprises:

a fixing portion fixed to the top case; and an upper hook elongated from the fixing portion of the upper body and bent such that the upper hook is configured to come into contact with the lower rib, and wherein the lock lever comprises:

a pivot shaft movably coupled to the fixing portion of the lower body;

a lever body connected to the pivot shaft, the lever body being elongated to seesaw about the pivot shaft; and a locking hook provided at one end of the lever body, the locking hook being configured to be engaged with the upper hook of the upper body.

2. The display device of claim 1, wherein the display module further comprises:

a panel frame at a rear of the display panel, the display panel is coupled with the panel frame;

a control board mounted on a rear surface of the panel frame;

a back cover at a rear of the panel frame, and the back cover covering the control board; and a first shield member between the back cover and the control board, the first shield member overlapping at least a portion of the control board.

3. The display device of claim 2, wherein the control board is a drive board of a light source providing light to the display panel.

4. The display device of claim 2, wherein the bottom case comprises:

a power supply unit between the bottom frame and the top plate, the power supply unit coupled to the bottom frame;

a main board between the bottom frame and the top plate, the main board disposed adjacent to the power supply unit and coupled to the bottom frame; and a second shield member between the top plate and the main board, the second shield member overlapping at least a portion of the main board.

5. The display device of claim 4, wherein the second shield member includes a graphite sheet covering at least a portion of the main board, the second shield member being inclined with respect to a plane of the outer shell.

6. The display device of claim 4, wherein the power supply unit does not overlap the control board and the first shield member of the display module.

7. The display device of claim 4, wherein the first shield member does not overlap the second shield member that covers the main board.

8. The display device of claim 7, wherein the first shield member includes a graphite sheet.

9. The display device of claim 1, further comprising an arm having a first side that is pivotally connected to the bottom case and a second side that is pivotally connected to the display module, wherein the display module is configured to be stored in the bottom case or stand upright from the bottom case when the arm performs a pivoting movement.

10. The display device of claim 1, wherein the lock lever further comprises a cam that is provided on a periphery of the pivot shaft inside the lever body, the cam rotates with respect to the pivot shaft, wherein the cam comprises:

a first part including a linear surface;

a second part extending from the first part and including a curved surface;

a third part extending from the second part, the third part defining a curved surface that forms an inflection point with the curved surface of the second part.

11. The display device of claim 1, further comprising:

a pair of fixing segments fixed to at least one of the outer shell or the bottom frame; and a handle that is elongated such that opposite sides thereof are coupled to the pair of fixing segments.

12. The display device of claim 11, wherein the handle comprises:

a core coupled to the pair of fixing segments; and a skin to cover the core, and wherein the core has a higher tensile strength than the skin.

* * * * *